(12) United States Patent
Yamae et al.

(10) Patent No.: US 8,716,736 B2
(45) Date of Patent: May 6, 2014

(54) SURFACE LIGHT EMITTING DEVICE

(75) Inventors: Kazuyuki Yamae, Nara (JP); Hitoshi Kimura, Osaka (JP); Nobuhiro Ide, Osaka (JP); Hiroya Tsuji, Kyoto (JP); Shintarou Hayashi, Hyogo (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/522,445

(22) PCT Filed: Jan. 19, 2011

(86) PCT No.: PCT/JP2011/050805
§ 371 (c)(1),
(2), (4) Date: Jul. 16, 2012

(87) PCT Pub. No.: WO2011/090039
PCT Pub. Date: Jul. 28, 2011

(65) Prior Publication Data
US 2012/0292652 A1    Nov. 22, 2012

(30) Foreign Application Priority Data

Jan. 19, 2010 (JP) .................. 2010-009400
Mar. 30, 2010 (JP) .................. 2010-079172

(51) Int. Cl.
  *H01L 51/50* (2006.01)
(52) U.S. Cl.
  USPC .......... 257/98; 257/99; 257/E51.018; 257/40; 257/100; 257/E33.056
(58) Field of Classification Search
  USPC ........... 257/81, 82, 91, 98, 99, 100, 116, 117, 257/432–437, 749, E33.056–33.059, 257/E25.032, 40, 642–643, 759, 257/E51.001–E51.052, E25.008–E25.009
  See application file for complete search history.

(56) References Cited

U.S. PATENT DOCUMENTS

| | | | |
|---|---|---|---|
| 5,693,956 A | 12/1997 | Shi et al. | |
| 7,053,547 B2 | 5/2006 | Lu et al. | |
| 7,291,397 B2 | 11/2007 | Miyadera et al. | |
| 2004/0265554 A1 | 12/2004 | Miyadera et al. | |
| 2006/0186802 A1 | 8/2006 | Cok et al. | |
| 2009/0078629 A1 | 3/2009 | Stemmer et al. | |

(Continued)

FOREIGN PATENT DOCUMENTS

| | | |
|---|---|---|
| JP | 2002-373777 A | 12/2002 |
| JP | 2004-513484 A | 4/2004 |

(Continued)

*Primary Examiner* — Mamadou Diallo
(74) *Attorney, Agent, or Firm* — Greenblum & Bernstein, P.L.C.

(57) ABSTRACT

The surface light emitting device includes an organic EL element, a protection substrate, a protection part, and a light extraction structure part. The element has a first face and a second face opposite to the first face, and emits light from the first face. The substrate has transparency for light emitted from the element, and is placed facing the first face, and has a primary surface facing the first face of the element. The protection part is placed facing the second face of the element, and constitutes a housing in combination with the substrate and accommodates the element so as to protect the element from water. The structure part is interposed between the first face of the element and the substrate, and suppresses reflection of light emitted from the element on at least one of the first face of the element and the primary surface of the substrate.

23 Claims, 32 Drawing Sheets

(56) References Cited

U.S. PATENT DOCUMENTS

| | | |
|---|---|---|
| 2010/0143958 A1 | 6/2010 | Pugia |
| 2010/0258839 A1 | 10/2010 | Matsue |
| 2011/0018024 A1 | 1/2011 | Fukshima et al. |
| 2011/0018416 A1 | 1/2011 | Sassa |
| 2011/0019426 A1 | 1/2011 | Kuiseko et al. |
| 2011/0050082 A1 | 3/2011 | Inoue et al. |
| 2012/0104423 A1 | 5/2012 | Kurata et al. |
| 2012/0126688 A1 | 5/2012 | Richardson et al. |

FOREIGN PATENT DOCUMENTS

| | | |
|---|---|---|
| JP | 2004-322489 A | 11/2004 |
| JP | 2007-207471 A | 8/2007 |
| JP | 2008-210685 A | 9/2008 |
| JP | 2008-538155 A | 10/2008 |
| JP | 2008-542986 A | 11/2008 |
| WO | 2008/020514 | 2/2008 |
| WO | 2009/066561 | 5/2009 |
| WO | 2009/122909 | 10/2009 |
| WO | 2009/131019 | 10/2009 |

FIG. 2
(a)
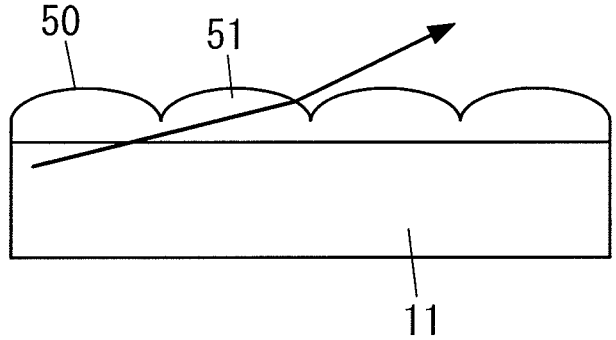
(b)
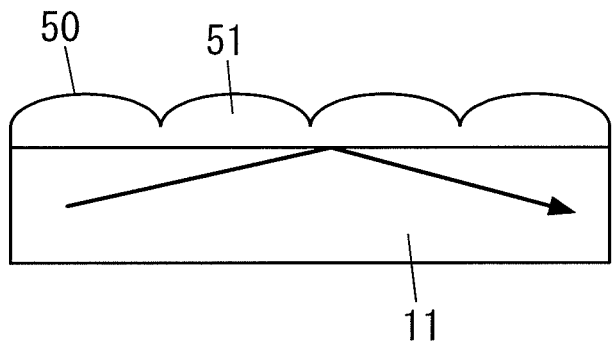

FIG. 4

FIG. 7
(a)
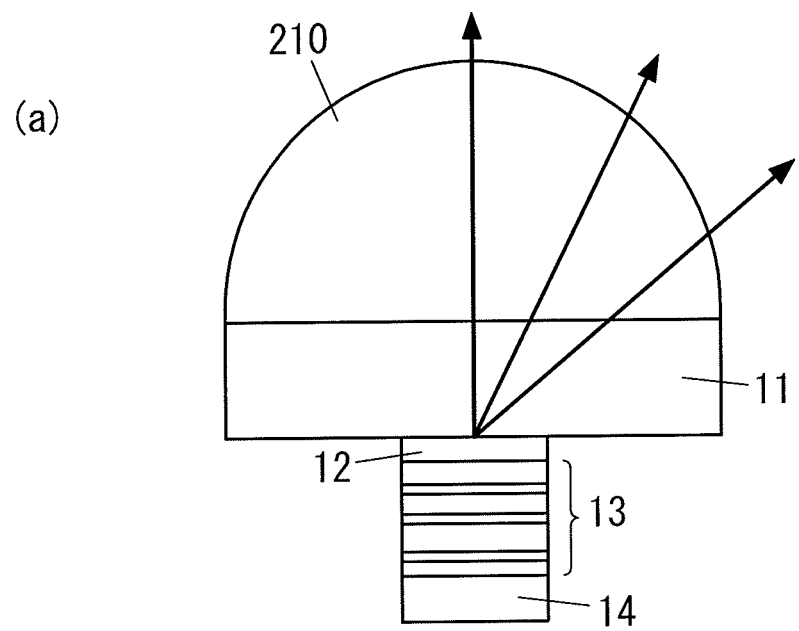
(b)
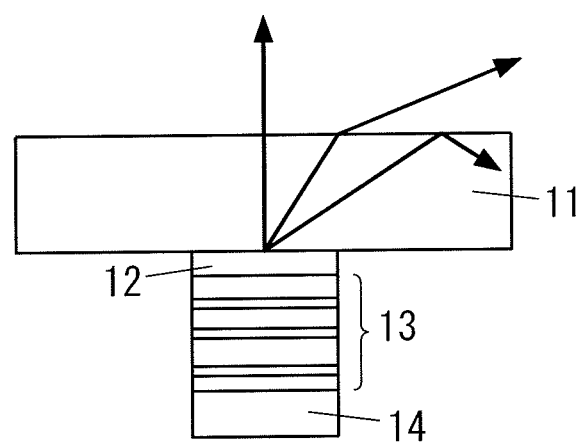

FIG. 8
(a)
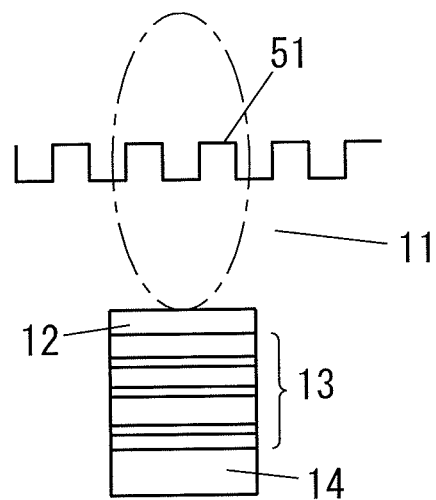
(b)
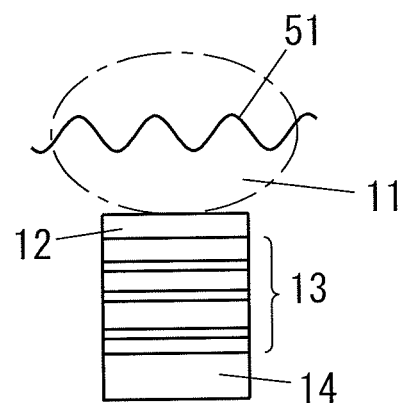

FIG. 9
(a)
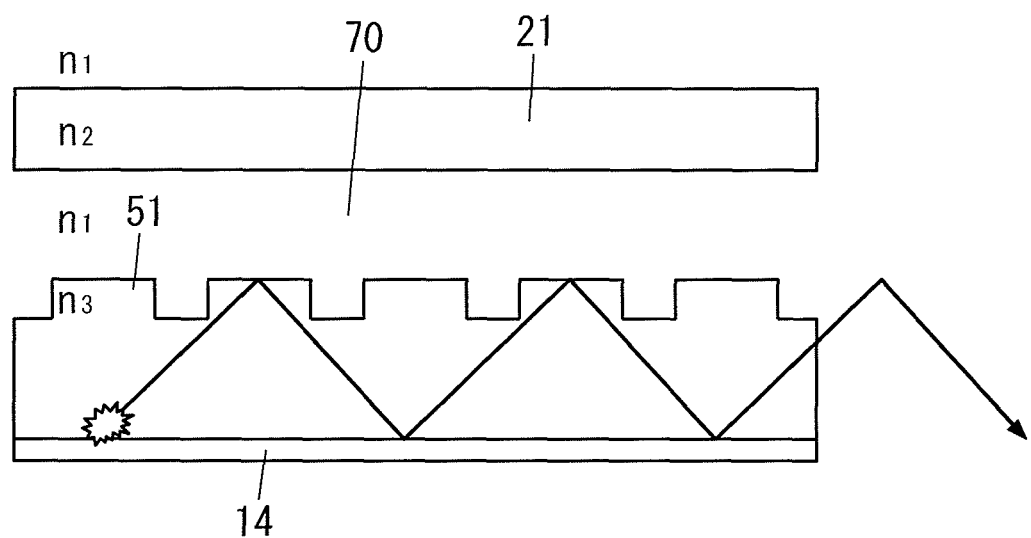
(b)
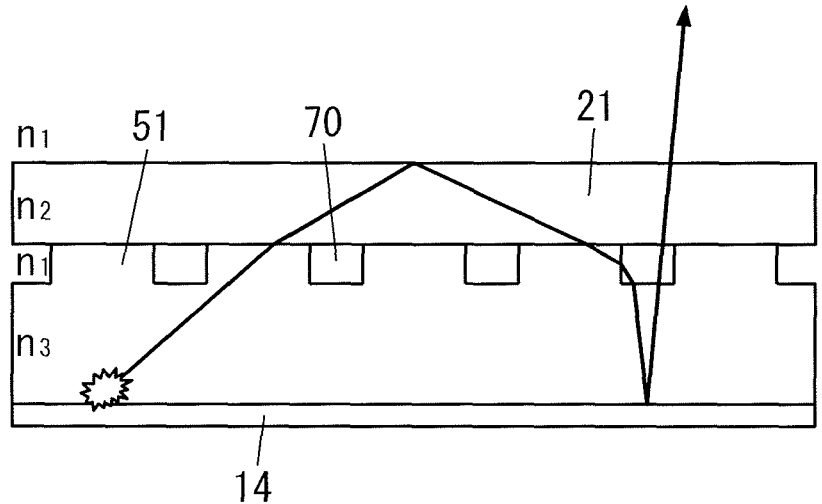

FIG. 10
(a)
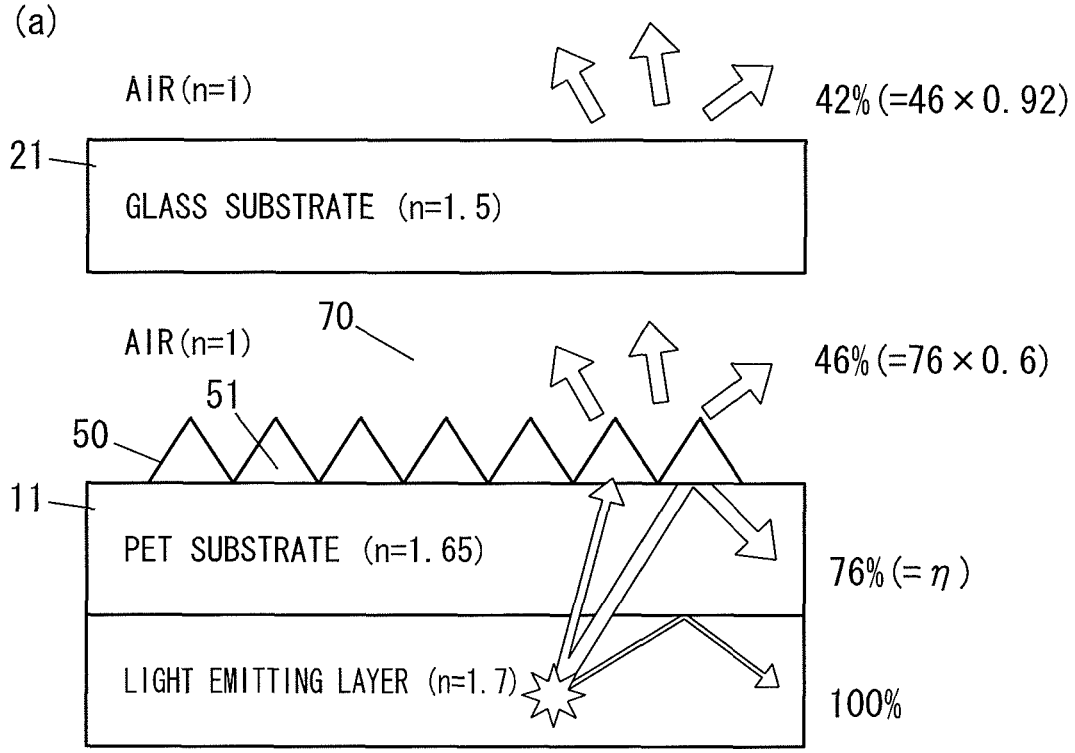
(b)
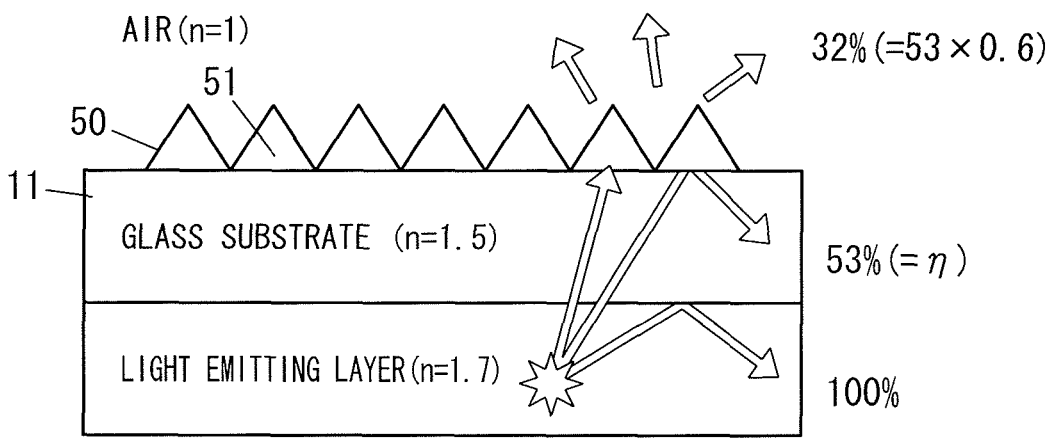

FIG. 17
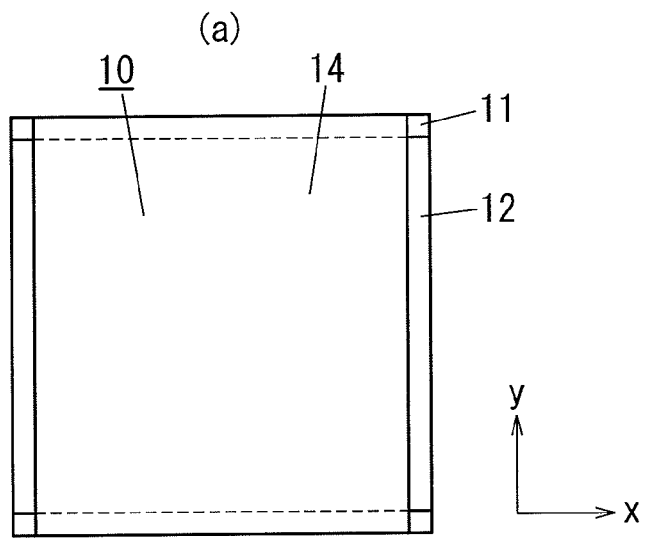
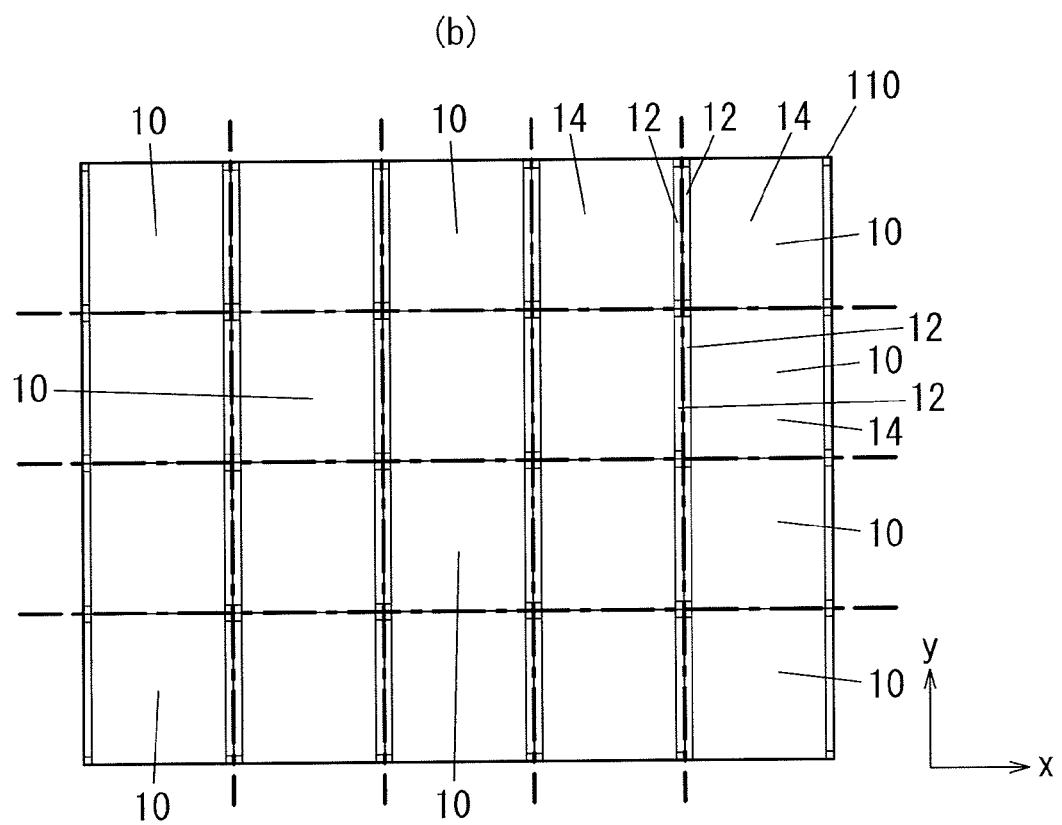

FIG. 24
(a) 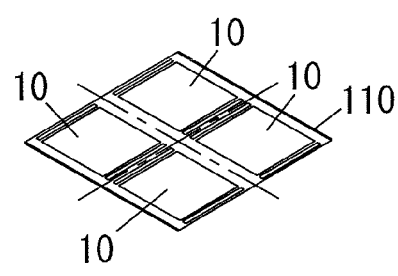
(b) 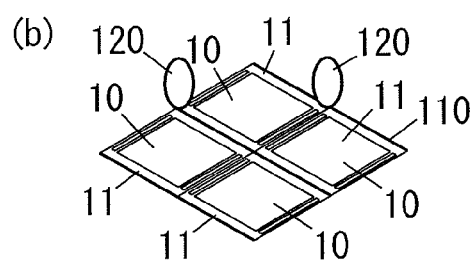
(c), (d) 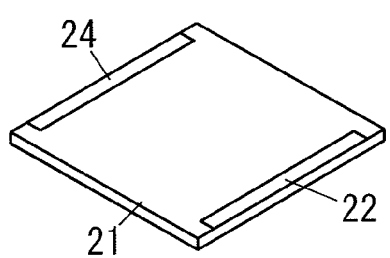
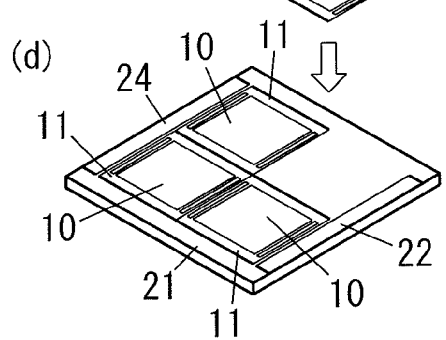
(e) 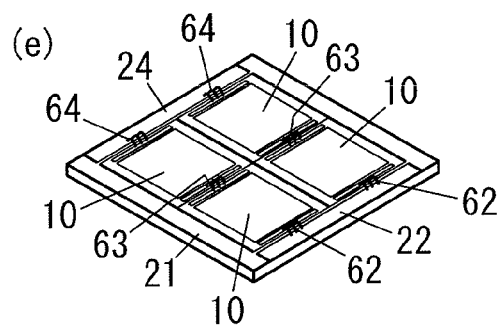
(f) 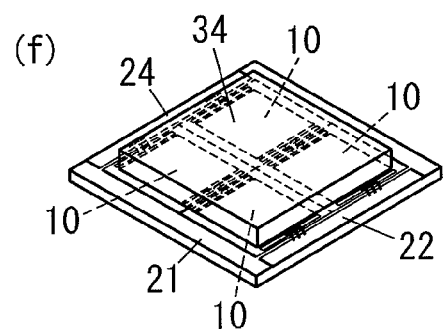
(g) 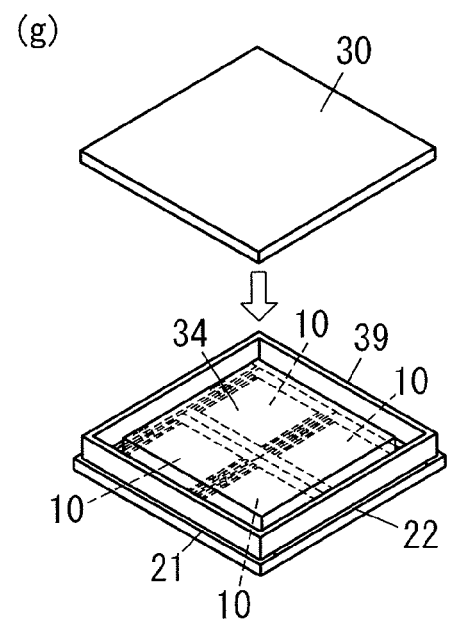

FIG. 26
(a1)
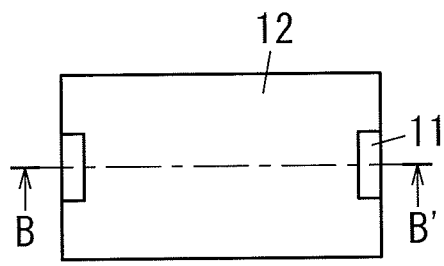
(a2)
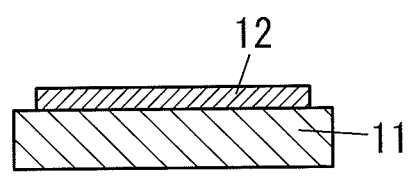
(b1)
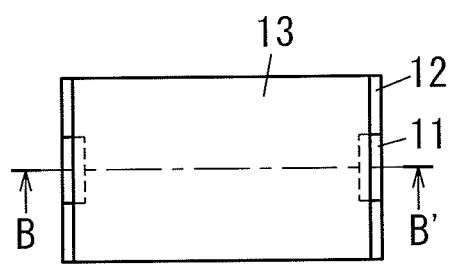
(b2)
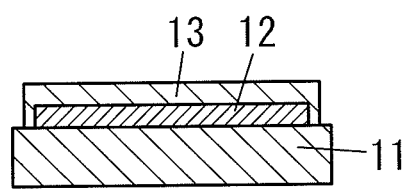
(c1)
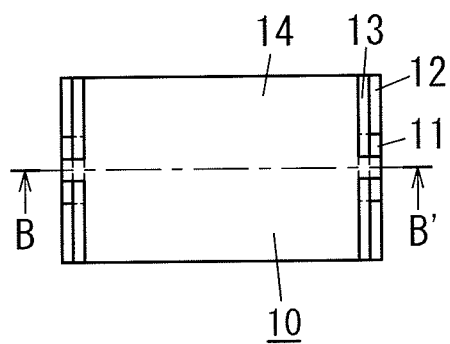
(c2)
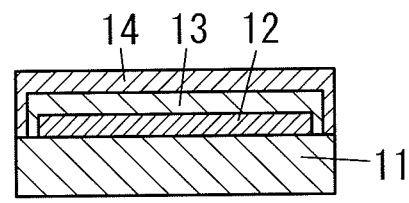

FIG. 28
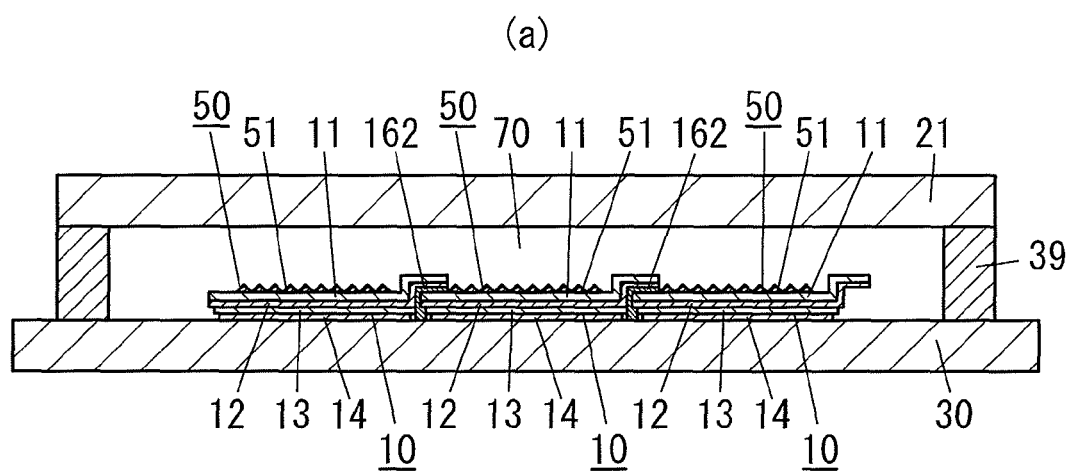
(a)
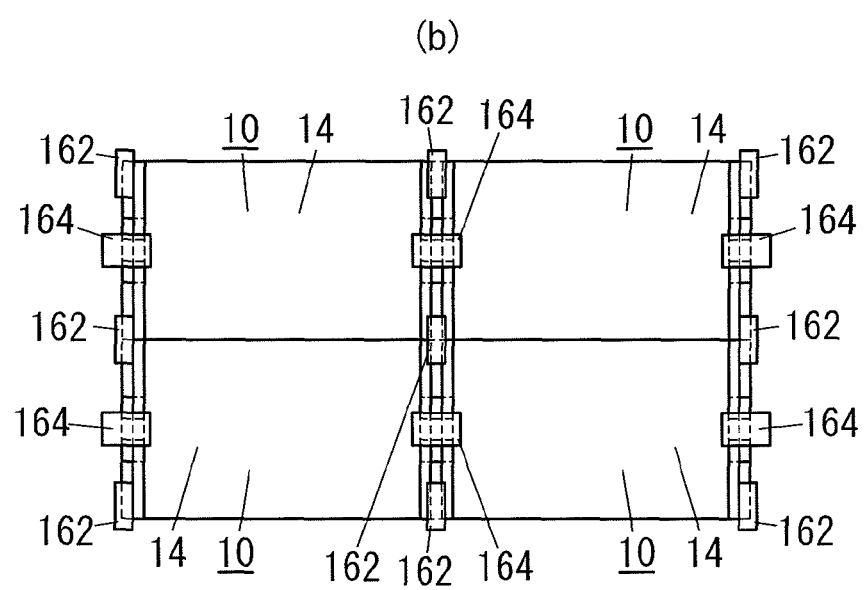
(b)

FIG. 29
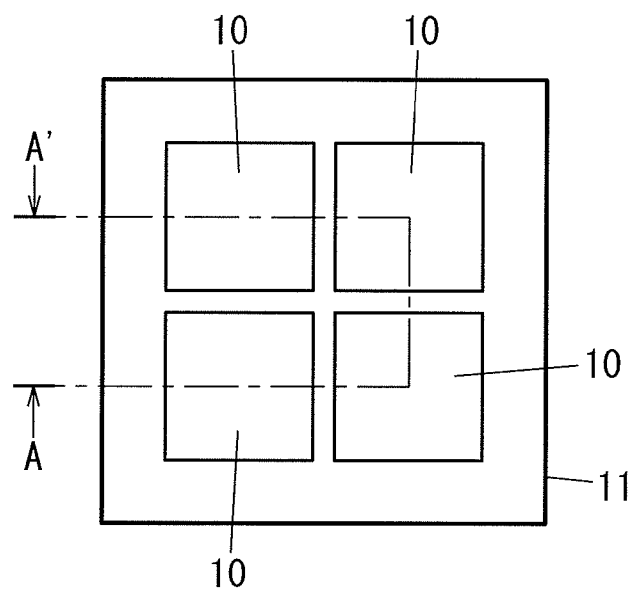
(a)
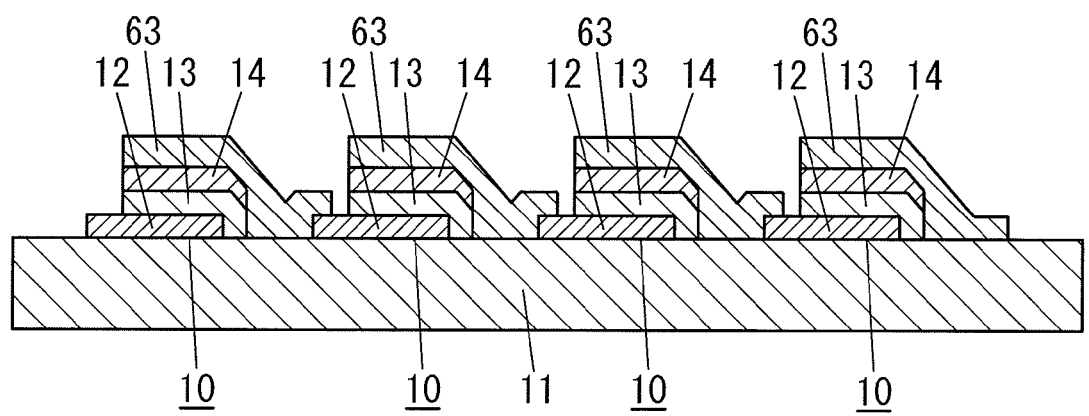
(b)

SURFACE LIGHT EMITTING DEVICE

TECHNICAL FIELD

The present invention relates to surface light emitting devices.

BACKGROUND ART

Conventionally, there is studied and developed, in various organizations, a surface light emitting device employing an organic electroluminescent element (hereinafter referred to as "organic EL element").

For example, an organic EL element has a laminated structure including a transparent electrode serving as an anode, a hole transport layer, a light emitting layer (an organic light emitting layer), an electron injection layer, and an electrode serving as a cathode, which are stacked in this order and provided on one side of a light transmitting substrate (transparent substrate). With regard to the organic EL element with such a laminated structure, a voltage applied between the anode and the cathode causes generation of light in the light emitting layer. Light generated at the light emitting layer is emitted outside via the transparent electrode and the light transmitting substrate.

The organic EL element is designed to give a self-emission light in various wavelengths, with a relatively high yield. Such organic EL elements are expected to be applied for production of displaying apparatuses (e.g., light emitters used for such as flat panel displays), and light sources (e.g., liquid-crystal displaying backlights and illuminating light sources). Some of organic EL elements have already been developed for practical uses.

Recently, in consideration of application and development of organic EL elements to such uses, an organic EL element having high efficiency, prolonged lifetime, and high brightness is expected.

It is considered that the efficiency of the organic EL element is mainly dominated by three of electrical-optical conversion efficiency, driving voltage, and light extraction efficiency.

With regard to the electrical-optical conversion efficiency, it was reported that the organic EL element with the light emitting layer made of phosphorescent light emitting material can have external quantum efficiency greater than 20%. The external quantum efficiency of 20% is considered to be corresponding to internal quantum efficiency of about 100%. It is considered that the organic EL element having the electrical-optical conversion efficiency reaching a limiting value has been developed. In view of the driving voltage, an organic EL element which shows relatively high brightness in receipt of voltage higher by 10 to 20% than voltage corresponding to an energy gap of the light emitting layer has been developed. Consequently, it is expected that improvement of these two factors (electrical-optical conversion) are not so effective for an increase in the efficiency of the organic EL element.

Generally, the light extraction efficiency of the organic EL element is about 20 to 30% (this value is slightly varied depending on lighting patterns, and/or a layer structure between the anode and the cathode). since material constituting a light emitting part and a surrounding part thereof has characteristics (such as a high refractive index and light absorption properties), total reflection at an interface between materials having different refractive indices and light absorption caused by materials are likely to inhibit effective transmission of light to an outside as a light emission observation side. As a result, it is considered that the light extraction efficiency shows such low a value. In brief, the light extraction efficiency of 20 to 30% means 70 to 80% of total amount of emitted light is dominated by light which does not effectively contribute to light emission. Consequently, it is considered that improvement of the light extraction efficiency causes a great increase in the efficiency of the organic EL element.

In consideration of the above background, with regard to the field of the organic EL element, there is studied and developed, in various organizations, to improve the light extraction efficiency of the organic EL element. Especially, there have been many efforts to increase light which is emitted from the light emitting layer and reaches the light transmitting substrate. With regard to an organic EL element, the light emitting layer has a refractive index of about 1.7, and ITO which is common material of the transparent electrode has a refractive index of about 1.8 to 2.0, and a glass substrate (e.g., a soda lime glass substrate and a non-alkali glass substrate) which is common material of the light transmitting substrate has a refractive index of about 1.5. Consequently, even when the transparent electrode has a refractive index of 1.7, a loss caused by total reflection at the interface between the transparent electrode and the light transmitting substrate reaches about 50% of totally reflected light. The value of about 50% is calculated by use of point source approximation in consideration that the emitted light is expressed as an integration of three dimensional radiation of light from organic molecules.

Consequently, in the organic EL element, with decreasing a loss caused by total reflection between the light emitting layer and the light transmitting substrate, it is possible to greatly improve the light extraction efficiency.

The most simple and effective approach for reducing the total reflection loss between the light emitting layer and the light transmitting substrate is to decrease a refractive index difference at an interface existing between the light emitting layer and the light transmitting substrate. In this approach, two efforts to decrease the refractive index of the light emitting layer and increase the refractive index of the light transmitting substrate are considered. With regard to the former effort, available material is limited, and some material may cause a great decrease in the light emission efficiency and lifetime. It is therefore now difficult to improve the light extraction efficiency in line with the former effort. Meanwhile, with regard to the latter effort, it is known that use of a high refractive index material glass substrate of a refractive index of 1.85 as the light transmitting substrate constituting the organic EL element may improve the light extraction efficiency (e.g., see document 1 (U.S. Pat. No. 7,053,547 B2)). Further, it is known that a plastic substrate which is provided with a gas barrier layer with gas barrier properties of blocking gas (e.g., oxygen and moisture) and has a refractive index higher than that of a general glass substrate is used as the light transmitting substrate (see document 2 (U.S. Pat. No. 5,693,956 B2) and document 3 (JP 2004-322489 A)). According to techniques disclosed in documents 2 and 3, it is possible to improve the light extraction efficiency in addition to waterproof properties. The light emitting device disclosed in document 2 has a laminated structure mounted on a barrier layer formed on a first surface of a plastic substrate. The laminated structure includes an anode, a light emitting layer, and a cathode. The laminated structure is covered with a protection part made of epoxy resin and a medium constituting a dielectric layer is interposed between the laminated structure and the protection part. The light emitting device is designed to emit light via a second surface of the plastic substrate.

Further, there has been proposed an organic EL element having an improved effect for suppressing element deterioration caused by gas (e.g., water vapor). In this organic EL element, a laminated structure including a transparent anode layer, a light emitting medium layer, and a cathode which are stacked on a plastic substrate in this order is hermetically sealed in a housing constituted by a glass substrate and a moisture resistance film (see document 4 (JP 2002-373777 A)). In the organic EL element disclosed in document 4, the plastic substrate is designed to have water content not greater than 0.2% by weight. Further, document 4 discloses that forming a gas barrier layer on a first surface (surface in contact with the transparent anode) of the plastic substrate or the first surface and a second surface of the plastic substrate can more improve the effect of suppressing element deterioration.

With regard to the organic EL element employing the high refractive index glass substrate as disclosed in document 1, since the high refractive index glass material is expensive, industrial availability thereof is low in the present circumstances. Additionally, the high refractive index glass substrate generally contains various impurities (e.g., heavy metal). Thus, many of the high refractive index glass substrates are fragile and have insufficient weatherproof properties.

According to the organic EL element employing the light transmitting substrate constituted by the plastic substrate provided with the barrier layer as disclosed in documents 2 and 3, it is possible to reduce the production cost relative to the instance employing the high refractive index glass material. However, with regard to the organic EL element disclosed in documents 2 and 3, the second surface of the plastic substrate used as a light extraction surface easily suffers from scratches. Further, organic material has a lowered weatherproof property and a lowered ultraviolet resistance relative to glass. Thus, when the organic EL element is used outside, deterioration of long-time reliability of plastic substrate and the light emitting layer is likely to occur. Moreover, the plastic substrate provided with the barrier layer is expensive relative to a general plastic substrate devoid of a barrier layer, and therefore use of the plastic substrate provided with the barrier layer has a disadvantage in cost.

With regard to the organic EL element disclosed in the aforementioned patent document 4, the number of the interfaces (refractive index interfaces) existing between the light emitting medium layer and the air (air in the light extraction side) is increased. Thus, the total reflection loss and the Fresnel loss are increased, and therefore the light extraction efficiency is decreased.

DISCLOSURE OF INVENTION

In view of the above insufficiency, the present invention has been aimed to propose a surface light emitting device capable of improving a weatherproof property and a waterproof property in addition to light extraction efficiency.

The first aspect of the surface light emitting device in accordance with the present invention includes an organic EL element having a first face and a second face opposite to the first face, the organic EL element being configured to emit light from the first face; a protection substrate having transparency for light emitted from the organic EL element, the protection substrate being placed facing the first face, and the protection substrate having a primary surface facing the first face of the organic EL element; a protection part placed facing the second face of the organic EL element, the protection part being configured to constitute a housing in combination with the protection substrate, and the housing being configured to accommodate the organic EL element so as to protect the organic EL element from water; and a light extraction structure part interposed between the first face of the organic EL element and the protection substrate, the light extraction structure part being configured to suppress reflection of light emitted from the organic EL element on at least one of the first face of the organic EL element and the primary surface of the protection substrate.

In the second aspect of the surface light emitting device in accordance with the present invention, in addition to the first aspect, the organic EL element comprises a light-emitting layer configured to emit light and a formation substrate having transparency for light emitted from the light-emitting layer. The light-emitting layer is formed over a first surface of the formation substrate. The first face of the organic EL element is defined by a second surface of the formation substrate opposite to the first surface. The formation substrate has a refractive index higher than that of the protection substrate.

In the third aspect of the surface light emitting device in accordance with the present invention, in addition to the second aspect, the protection substrate has a weatherproof property and a waterproof property higher than those of the formation substrate.

In the fourth aspect of the surface light emitting device in accordance with the present invention, in addition to the third aspect, the formation substrate is a plastic substrate and the protection substrate is a glass substrate.

In the fifth aspect of the surface light emitting device in accordance with the present invention, in addition to the second aspect, the light extraction structure part is a recessed and protruded structure part provided to the first face of the organic EL element. The protection substrate is placed to form a space between the recessed and protruded structure part and the protection substrate, the protection substrate having a refractive index higher than that of a medium filling the space.

In the sixth aspect of the surface light emitting device in accordance with the present invention, in addition to the fifth aspect, the recessed and protruded structure part has a refractive index equal to or higher than that of the formation substrate.

In the seventh aspect of the surface light emitting device in accordance with the present invention, in addition to the fifth or sixth aspect, the recessed and protruded structure part includes a periodic recessed and protruded structure. The recessed and protruded structure has a period in a range of one fourth to ten times of a wavelength of light emitted from the organic EL element.

In the eighth aspect of the surface light emitting device in accordance with the present invention, in addition to any one of the fifth to seventh aspects, the recessed and protruded structure part is designed to be in surface contact with the primary surface of the protection substrate.

In the ninth aspect of the surface light emitting device in accordance with the present invention, in addition to any one of the fifth to seventh aspects, the protection substrate is provided in its primary surface with a recessed part configured to accommodate the recessed and protruded structure part. The space is defined as a gap between an inner surface of the recessed part and a surface of the recessed and protruded structure part.

In the tenth aspect of the surface light emitting device in accordance with the present invention, in addition to the first aspect, the surface light emitting device further comprises a light transmitting part having transparency for light emitted from the organic EL element and a refractive index not greater than that of the protection substrate. The light extraction structure part is a recessed and protruded structure part provided to the first face of the organic EL element. The light transmitting part is interposed between the recessed and protruded structure part and the protection substrate.

In the eleventh aspect of the surface light emitting device in accordance with the present invention, in addition to the first aspect, the light extraction structure part includes a matrix placed in contact with the first face of the organic EL element, and light-diffusing members dispersed in the matrix. The matrix has a refractive index not less than that of a part of the organic EL element being in contact with the matrix. The light-diffusing members have a refractive index different from that of the matrix.

In the twelfth aspect of the surface light emitting device in accordance with the present invention, in addition to the eleventh aspect, the light-diffusing members are fine particles.

In the thirteenth aspect of the surface light emitting device in accordance with the present invention, in addition to the first aspect, the light extraction structure part includes a matrix placed in contact with the first face of the organic EL element, and holes formed inside the matrix. The matrix has a refractive index which is not less than that of a part of the organic EL element being in contact with the matrix and is different from that of medium filling the hole.

In the fourteenth aspect of the surface light emitting device in accordance with the present invention, in addition to the second aspect, the surface light emitting device further comprises a transparent part having transparency for light emitted from the organic EL element and a refractive index not less than that of the formation substrate. The light extraction structure part is a recessed and protruded structure part provided to the primary surface of the protection substrate. The transparent part is interposed between the recessed and protruded structure part and the formation substrate.

In the fifteenth aspect of the surface light emitting device in accordance with the present invention, in addition to the fourteenth aspect, the recessed and protruded structure part has a refractive index not greater than that of the protection substrate.

In the sixteenth aspect of the surface light emitting device in accordance with the present invention, in addition to the fourteenth or fifteenth aspect, the recessed and protruded structure part includes a periodic recessed and protruded structure. The recessed and protruded structure has a period in a range of one fourth to ten times of a wavelength of light emitted from the organic EL element.

In the seventeenth aspect of the surface light emitting device in accordance with the present invention, in addition to the first aspect, the surface light emitting device further comprises a heat dissipation member interposed between the second face of the organic EL element and the protection part and configured to transmit heat generated at the organic EL element to the protection part. The organic EL element is fixed to the protection part so as not to be in contact with the protection substrate.

In the eighteenth aspect of the surface light emitting device in accordance with the present invention, in addition to any one the first to seventeenth aspects, the protection substrate has a secondary surface opposite to the primary surface of the protection substrate. Provided to at least one of the primary surface and the secondary surface of the protection substrate is an antireflection coating.

In the nineteenth aspect of the surface light emitting device in accordance with the present invention, in addition to any one of the first to seventeenth aspects, the protection substrate has a secondary surface opposite to the primary surface of the protection substrate. Provided to at least one of the primary surface and the secondary surface of the protection substrate is a moth-eye structure.

In the twentieth aspect of the surface light emitting device in accordance with the present invention, in addition to any one of the first to nineteenth aspects, the surface light emitting device comprises a plurality of the organic EL elements. The plurality of the organic EL elements is arranged in a plane parallel to the primary surface of the protection substrate.

In the twenty-first aspect of the surface light emitting device in accordance with the present invention, in addition to any one of the first to twentieth aspects, the protection part has an inner face facing the second face of the organic EL element. Provided to the inner face of the protection part is a light reflection part configured to reflect light emitted from the organic EL element.

In the twenty-second aspect of the surface light emitting device in accordance with the present invention, in addition to any one of the first to twentieth aspects, the protection part has transparency for light emitted from the organic EL element. The protection part has an inner face facing the second face of the organic EL element and an outer face opposite to the inner face. The protection part is provided at the outer face with a light reflection part configured to reflect light emitted from the organic EL element.

In the twenty-third aspect of the surface light emitting device in accordance with the present invention, in addition to any one of the first to twenty-second aspects, the surface light emitting device further comprises a heat transfer part having thermal conductivity greater than that of the protection part. The protection part has an inner face facing the second face of the organic EL element and an outer face opposite to the inner face. The heat transfer part is provided to the outer face of the protection part.

BRIEF DESCRIPTION OF DRAWINGS

FIG. 2 is an explanatory view illustrating a primary part of the surface light emitting device of the first embodiment, FIG. 4 is an explanatory view illustrating the above light extraction structure part, FIG. 7 is an explanatory view illustrating a primary part of the surface light emitting device of the first embodiment, FIG. 8 is an explanatory view illustrating a primary part of the surface light emitting device of the first embodiment, FIG. 9 is an explanatory view illustrating a primary part of the surface light emitting device of the first embodiment, FIG. 10 is an explanatory view illustrating a primary part of the surface light emitting device of the first embodiment, FIG. 17 is an explanatory view illustrating an organic EL element of the surface light emitting device of the fourth embodiment, FIG. 24 is an explanatory view illustrating a process of fabricating another configuration of the surface light emitting device of the sixth embodiment, FIG. 26 is an explanatory view illustrating the organic EL element of the surface light emitting device of the seventh embodiment, FIG. 28 shows a schematic cross sectional view (a) illustrating the surface light emitting device of the eighth embodiment and a schematic cross sectional view (b) illustrating a primary part of the surface light emitting device of the eighth embodiment, FIG. 29 shows a planar layout chart (a) illustrating a primary part of the surface light emitting device of the ninth embodiment and a schematic cross sectional view (b) along the line A-A' of (a)

BEST MODE FOR CARRYING OUT THE INVENTION (First Embodiment)

Figure 1:
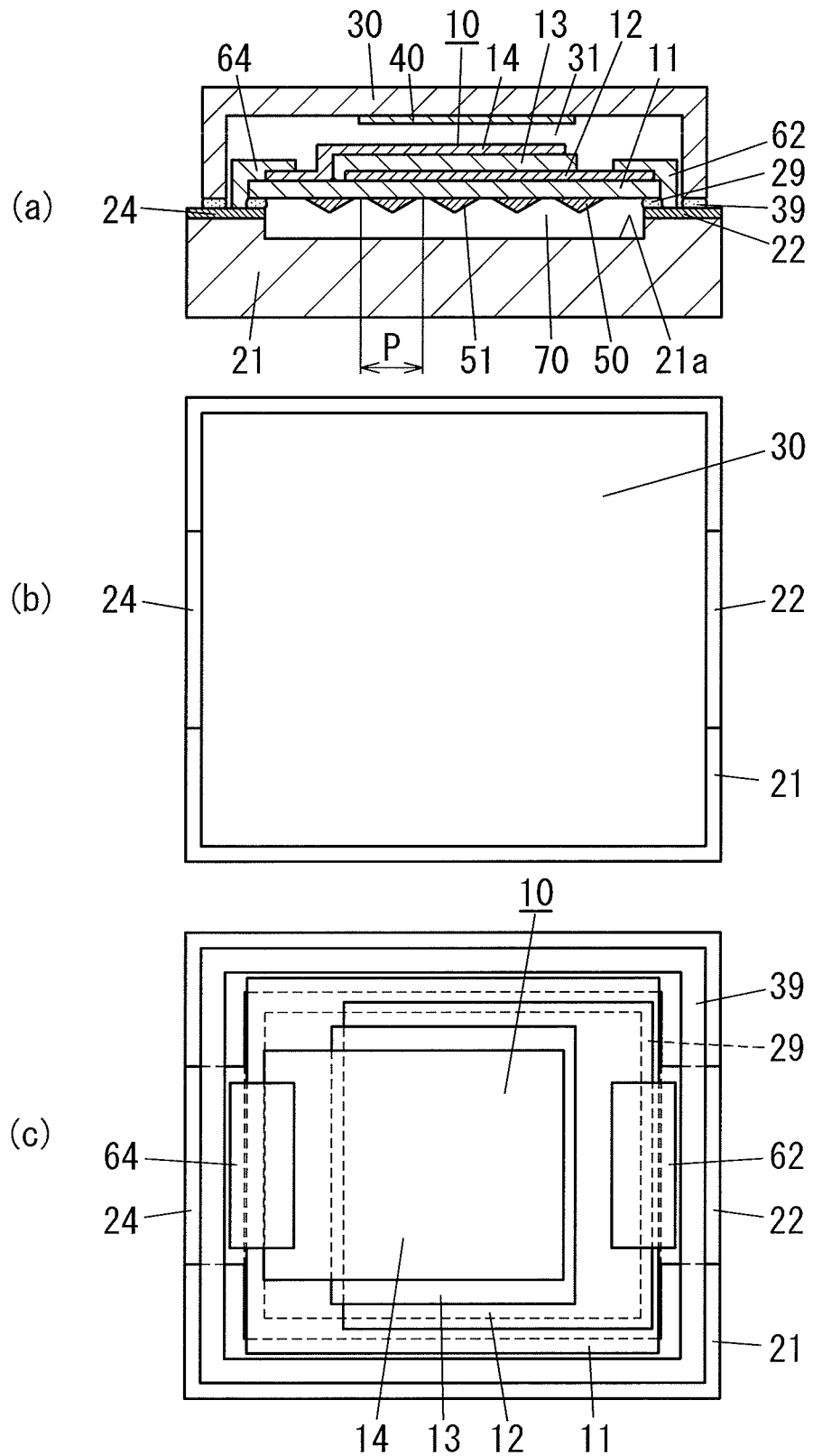
FIG. 1 shows a schematic cross sectional view (a) illustrating the surface light emitting device of the first embodiment, a schematic planar view (b) illustrating the surface light emitting device of the first embodiment, and a schematic planar view (c) illustrating a primary part of the surface light emitting device of the first embodiment.

The following explanation referring to FIG. 1 (a) to (c) is made to the surface light emitting device in accordance with the first embodiment.

The surface light emitting device of the present embodiment includes an organic EL element 10, a second light transmitting substrate 21, a protection part 30, and a light extraction structure part 50. The organic EL element 10 is defined as an organic EL element 10 which includes a light emitting layer formed over a first surface of a first light transmitting substrate 11 and is configured to emit light from a first face in a thickness direction. The second light transmitting substrate 21 is arranged over the first face of the organic EL element 10. The second light transmitting substrate 21 has a refractive index lower than that of the first light transmitting substrate 11. The second light transmitting substrate 21 has a waterproof property and a weatherproof property higher than those of the first light transmitting substrate 11. The protection part 30 is designed to cover a second face of the organic EL element 10 in the thickness direction, and is configured to protect the organic EL element from moisture in combination with the second light transmitting substrate 21. The light extraction structure part 50 is interposed between the first face of the organic EL element 10 and the second light transmitting substrate 21, and is configured to suppress reflection of light emitted from the light emitting layer on the first face.

The organic EL element 10 includes an organic EL layer interposed between an anode 12 and a cathode 14. The organic EL layer 13 includes a hole transport layer, the light emitting layer, an electron transport layer, and an electron injection layer which are arranged in this order from the anode 12. In the organic EL element 10, the anode 12 is stacked over the first surface of the first light transmitting substrate 11. The cathode 14 faces an opposite surface of the anode 12 from the first light transmitting substrate 11.

In the organic EL element 10 of the present embodiment, the anode 12 is constituted by a transparent electrode, and the cathode 14 is constituted by an electrode configured to reflect light emitted from the light emitting layer. The first face is defined by a second surface of the first light transmitting substrate 11.

The laminated structure of the organic EL layer 13 is not limited to the aforementioned instance, but may be a single layer structure of a light emitting layer, a laminated structure of a hole transport layer, a light emitting layer, and an electron transport layer, a laminated structure of a hole transport layer and a light emitting layer, and a laminated structure of a light emitting layer and an electron transport layer, for example. Further, a hole injection layer may be interposed between the anode 12 and the hole transport layer. The light emitting layer may be a single layer structure or a multilayer structure. For example, when a desired emission color is white, the light emitting layer may be doped with three dye dopants of red, green, and blue. Alternatively, the light emitting layer may be a laminated structure of a blue light emitting layer with hole transport properties, a green light emitting layer with electron transport properties, and a red light emitting layer with electron transport properties, or a laminated structure of a blue light emitting layer with electron transport properties, a green light emitting layer with electron transport properties, and a red light emitting layer with electron transport properties. Alternatively, a multiunit structure can be adopted. In this multiunit structure, the organic EL layer 13 which is interposed between the anode 12 and the cathode 14 and has a function of emitting light in response to receipt of a voltage is treated as a single light emitting unit. In the multiunit structure, the light emitting units are stacked on each other while intermediate layers interposed therebetween. The intermediate layer is transmissive and electrically conductive. Thereby, the light emitting units are connected in series. In other words, the multiunit structure includes a plurality of the light emitting units stacked in the thickness direction between the single anode 12 and the single cathode 14.

When the organic EL element 10 is configured to emit light from the second face in the thickness direction, the first light transmitting substrate 11 is provided on the second surface with a reflection film formed of such as an Al film, and the cathode 14 is constituted by a transparent electrode, and the light extraction structure part 50 is provided to a surface of the cathode 14.

The first light transmitting substrate 11 is formed into a rectangular shape. However, the first light transmitting substrate 11 is not necessarily formed into a rectangular shape, but may be formed in to a circular shape, a triangle shape, a pentagonal shape, or a hexagonal shape.

The anode 12 is designed to inject holes into the light emitting layer. Preferably, the anode 1 is made of an electrode material selected from a metal, an alloy, an electrically conductive compound, and a mixture thereof which have a large work function. Preferably, the electrode material is selected to have a work function in a range of 4 eV to 6 eV in order to limit a difference between an energy level of anode 1 and an HOMO (Highest Occupied Molecular Orbital) level within an appropriate range. For example, the electrode material of such the anode 12 may be an electrically conductive light transmissive material selected from ITO, tin oxide, zinc oxide, IZO, copper iodide or the like. The electrically conductive light transmissive material may be selected from an electrically conductive polymer (e.g., PEDOT and polyaniline), an electrically conductive light transmissive polymer prepared by doping a polymer with acceptors, and a carbon nanotube. For example, the anode 12 is formed as a thin film on the first surface of the first light transmitting substrate 11 by means of a sputtering method, a vacuum vapor deposition method, and an application.

The anode 12 is preferably formed to have a sheet resistance of several hundreds Ω/sq or less, more preferably 100 Ω/sq or less. The anode 12 can be controlled to have a suitable thickness depending on selected material for achieving its light transmission and its sheet resistance mentioned above, and is preferably formed to have a thickness of 500 nm or less, more preferably in a range of 10 nm to 200 nm.

The cathode 14 is designed to inject electrons into the light emitting layer. Preferably, the cathode 14 is made of an electrode material selected from a metal, an alloy, an electrically conductive compound, and a mixture thereof which have a small work function. Preferably, the electrode material is selected to have a work function in a range of 1.9 eV to 5 eV in order to limit a difference between an energy level of the cathode 14 and an LUMO (Lowest Unoccupied Molecular Orbital) level within an appropriate range. For example, the electrode material of such a cathode 14 may be selected from aluminum, silver, magnesium, and an alloy including at least one of these metals (e.g., magnesium-silver mixture, magnesium-indium mixture, and aluminum-lithium alloy). The cathode 14 may be a laminated film including an ultra-thin film made of aluminum oxide and a thin film made of aluminum. The ultra-thin film may be made of a metal, a metal oxide, and a mixture thereof. The ultra-thin film is defined as a thin film with a thickness of 1 nm or less which transmits electrons through a tunnel injection process. The cathode 14 may be formed of a transparent electrode such as ITO and IZO, for passing light therethrough.

The light emitting layer can be formed of any of well-known materials for fabrication of an electroluminescence element, such as anthracene, naphthalene, pyrene, tetracene, coronene, perylene, phthaloperylene, naphthaloperylene, diphenylbutadiene, tetraphenylbutadiene, coumalin, oxadiazole, bisbenzoxazoline, bisstyryl, cyclopentadiene, a quinoline-metal complex, a tris(8-hydroxyquinolinate)aluminum complex, a tris(4-methyl-8-quinolinate)aluminum complex, a tris(5-phenyl-8-quinolinate)aluminum complex, an aminoquinoline-metal complex, a benzoquinoline-metal complex, a tri-(p-terphenyl-4-yl)amine, 1-aryl-2,5-di(2-thienyl)pyrrole derivative, pyrane, quinacridone, rubrene, a distyrylbenzene derivative, a distyrylarylene derivative, a distyrylamine derivative, or various phosphor pigments as well as the above-listed materials and their derivatives. The light emitting layer is not required to be formed of the above substance. The light emitting layer is preferably formed of a mixture of luminescent materials selected among these substances. The light emitting layer may be formed of one of other luminescent materials causing photoemission from spin-multiplets, such as phosphorescent materials and compounds having phosphorescent moieties, instead of fluorescent compounds listed above. The light emitting layer made of the above material can be formed by a dry-type process (e.g., vapor deposition and transferring) or a wet-type process (e.g., spin-coating, spray-coating, diecoating and gravure printing).

The aforementioned hole injection layer may be formed of a hole injection organic material, a hole injection metal oxide, an acceptor-type organic (or inorganic) material, a p-doped layer, or the like. The hole injection organic material is selected to exhibit a hole-transporting performance and have a work function in a range of about 5.0 eV to 6.0 eV as well as a strong adhesion to the anode 12. For example, the hole injection organic material may be CuPc, a starburst amine or the like. The hole injection metal oxide may be an oxide of a metal which is selected from molybdenum (Mo), rhenium (Re), tungsten (W), vanadium (V), zinc (Zn), indium (In), tin (Sn), gallium (Ga), titanium (Ti) and aluminum (Al). The hole injection metal oxide is not required to be only one metal oxide, but may be a combination of oxides of plural metals including at least one of the metals listed above. For example, the hole injection metal oxide may be a combination of oxides of indium and tin, a combination of oxides of indium and zinc, a combination of oxides of aluminum and gallium, a combination of oxides of gallium and zinc, and a combination of oxides of titanium and niobium. The hole injection layer made of the above material can be formed by a dry-type process (e.g., vapor deposition and transferring) or a wet-type process (e.g., spin-coating, spray-coating, diecoating and gravure printing).

The hole transport layer may be formed of one selected among compounds exhibiting hole transporting performances. For example, the hole transport layer may be formed of an arylamine compound such as 4,4'-bis[N-(naphthyl)-N-phenyl-amino]biphenyl (alpha-NPD), N,N'-bis(3-methylphenyl)-(1,1'-biphenyl)-4,4'-diamine (TPD), 2-TNATA, 4,4',4"-tris(N-(3-methylphenyl)N-phenylamino)triphenylamine (MTDATA), 4,4'-N,N'-dicarbazolebiphenyl (CBP), spiro-NPD, spiro-TPD, spiro-TAD, and TNB. Instead, the hole transport layer may be formed of an amine compound containing a carbazole group, an amine compound containing fluorene derivative. Instead, conventional hole transport materials can be employed to form the hole transport layer.

The electron transport material layer may be formed of one selected among compounds exhibiting electron-transporting performances. Such an electron-transporting compound may be one selected among metal complexes (e.g., $Alq_3$) exhibiting electron-transporting performances, and heterocyclic compounds such as phenanthroline derivatives, pyridine derivatives, tetrazine derivatives, oxadiazole derivatives. Instead, another conventional electron-transporting material can be employed as the electron transport material.

The material of the electron injection layer may be one selected from metal halides such as metal fluorides (e.g., lithium fluoride and magnesium fluoride) and metal chlorides (e.g., sodium chloride and magnesium chloride). Instead, the material of the electron injection layer may be one selected from oxides, nitrides, carbides, and oxynitrides of metal such as aluminum (Al), cobalt (Co), zirconium (Zr), titanium (Ti), vanadium (V), niobium (NB), chromium (Cr), tantalum (Ta), tungsten (W), manganese (Mn), molybdenum (Mo), ruthenium (Ru), iron (Fe), nickel (Ni), copper (Cu), gallium (Ga), and zinc (Zn). For example, the material of the electron injection layer may be an insulator (e.g., aluminum oxide, magnesium oxide, iron oxide, aluminum nitride, silicon nitride, silicon carbide, silicon oxynitride, and boron nitride), a silicon compound (e.g., $SiO_2$ and SiO), and a carbon compound. Each of these substances can be deposited to form a thin film by use of a vacuum vapor deposition, a spattering, or the like.

The first light transmitting substrate 11 is made of poly (ethylene terephtharate) (PET) substrate which is one of plastic substrates which are cheaper than cheap glass substrates such as a non-alkali glass substrate and a soda lime glass substrate and have a refractive index greater than that of the glass substrate. The material of the plastic substrate is not limited to PET but may be poly(ethylene naphthalate) (PEN), poly(ether sulfones) (PES), and polycarbonate (PC), for example. For example, the material may be selected to achieve a desired application, a refractive index, and a heatproof temperature. TABLE 1 shown below indicates physical properties of typical plastic materials. PET is very expensive and highly safe plastic material. Although PEN has a refractive index higher than that of PET and a heat resistance better than that of PET, PEN is more expensive than PET.

TABLE 1

| plastic material | refractive index (550 nm) | heatproof temperature (continuous use) | other |
|---|---|---|---|
| poly(ethylene terephtharate) (PET) | 1.65 | 120° C. | wide prevalence cheap price |
| poly(ethylene naphthalate) (PEN) | 1.75 | 180° C. | high refractive index good heat resistance expensive price |
| poly(ether sulfones) (PES) | 1.65 | 200° C. | good heat resistance |
| polycarbonate (PC) | 1.58 | 130° C. | wide prevalence cheap price |

When the first light transmitting substrate 11 is made of a glass substrate, recessed and protruded portions existing in the first surface of the first light transmitting substrate 11 may cause a leak current of the organic EL element 10 (deterioration of the organic EL element 10). Thus, when the glass substrate is adopted as the first light transmitting substrate 11, it is necessary to prepare a glass substrate for forming elements which is polished with high accuracy to improve surface roughness of the first surface. This causes an increase in production cost. With regard to the surface roughness of the first surface of the first light transmitting substrate 11, the first light transmitting substrate 11 preferably has an arithmetic average roughness (Ra) specified by JIS B 0601-2001 (ISO 4287-1997) not greater than several nanometers.

In the present embodiment, the plastic substrate is used as the first light transmitting substrate 11. Even if the highly accurate polishing is not performed, it is possible to prepare, at lowered cost, the substrate which has an arithmetic average roughness (Ra) of the first surface not greater than several nanometers.

The second light transmitting substrate 21 is made of a non-alkali glass substrate which is one of glass substrates cheaper than a glass substrate having a relatively high refractive index. The second light transmitting substrate 21 is not limited to the non-alkali glass substrate but may be a soda lime glass substrate. A glass substrate used as the second light transmitting substrate is not used for forming the organic EL element 10. Consequently, it is possible to use a glass substrate with an arithmetic average roughness Ra not less than several hundreds nanometers. Thus, the surface light emitting device of the present embodiment can be fabricated at lowered cost relative to the surface light emitting device having the organic EL element formed by use of the glass substrate for forming elements.

In the organic EL element 10 of the present embodiment, the first light transmitting substrate 11 is bonded, at its entire perimeter, to the second light transmitting substrate 21. The organic EL element 10 is bonded to the second light transmitting substrate 21 by use of a bonding part 29 which is, for example, an adhesive film, thermoset resin, ultraviolet curing resin, and an adhesive agent (e.g., epoxy resin, acrylic resin, and silicone resin). The organic EL element 10 has a light emitting surface which is defined by a region in the second surface of the first light transmitting substrate 11 overlapping three of the anode 12, the organic EL layer 13, and the cathode layer 14.

The protection part 30 is made of a glass substrate (e.g., a cheap glass substrate, such as a soda lime glass substrate, and a non-alkali glass substrate). The protection part 30 has an opposite surface facing the second light transmitting substrate 21, and is provided in its opposite surface with a storage recess 31 configured to accommodate the organic EL element 10. The protection part 30 is bonded, at its entire perimeter, to the second light transmitting substrate 21. Thus, the organic EL element 10 is housed in an airtight space surrounded by the second light transmitting substrate 21 and the protection part 30. Besides, provided to a primary surface of the second light transmitting substrate 21 are external connection electrodes 22 and 24 for power supply. The external connection electrodes 22 and 24 are electrically connected to the anode 12 and the cathode 14 of the organic EL element 10, respectively. The perimeter of the protection part 30 includes regions bonded to the respective external connection electrodes 22 and 24. The anode 12 and the cathode 14 are electrically connected to the external connection electrodes 22 and 24 via connecting parts 62 and 64 constituted by electrically conductive paste (e.g., silver paste), respectively. The connecting parts 62 and 64 are not limited to electrically conductive paste but may be bonding wires and metal films, for example.

The protection part 30 is bonded to the second light transmitting substrate 21 by bonding part 39 may be constituted by low-melting-point glass, an adhesive film, thermoset resin, ultraviolet curing resin, and an adhesive agent (e.g., epoxy resin, acrylic resin, and silicone resin). The external connection electrodes 22 and 24 may be constituted by an Au film, an Al film, and an ITO film. The materials and the layer structure of the external connection electrodes 22 and 24 are not limited to a particular instance but may be appropriately selected in consideration of conditions such as adhesion to a base and contact resistance of an part electrically connected thereto. The layer structure of the external connection electrodes 22 and 24 is not limited to a single layer structure but may be a multilayer structure.

Attached to an inner bottom surface of the storage recess 31 of the protection part 30 is a water absorption member 40 configured to absorb moisture. For example, the water absorption member 40 is a calcium oxide-type desiccant agent (a getter material containing calcium oxide).

Alternatively, the protection part 30 may be made of epoxy resin and silicone resin and is designed to encapsulate the organic EL element 10, for example.

The surface light emitting device of the present embodiment includes the aforementioned light extraction structure part 50 constituted by a recessed and protruded structure part 51 provided to the first face of the organic EL element 10. The surface light emitting device of the present embodiment includes a space 70 existing between the recessed and protruded structure part 51 and the second light transmitting substrate 21. The surface light emitting device of the present embodiment can reduce a reflection loss of light which is emitted from the light emitting layer and reaches the second light transmitting substrate, thereby improving light extraction efficiency. Further, the surface light emitting device of the present embodiment includes a recessed part 21a. The recessed part 21a is formed in the side of the second light transmitting substrate 21 close to the organic EL element 10, and is configured to accommodate the recessed and protruded structure part 51. The aforementioned space 70 is defined by a gap between the inner face of the recessed part 21a and the surface of the recessed and protruded part 51. According to the surface light emitting device of the present embodiment, with forming the recessed part 21a in the second light transmitting substrate 21, it is possible to form the space 70 between the recessed and protruded structure part 51 and the second light transmitting substrate 21 and to protect the recessed and protruded structure part 51.

The light emitting layer of the organic EL element 10 and the first light transmitting substrate 11 have refractive indices greater than the refractive index of air as an external atmosphere through which light from the surface light emitting device passes. When the surface light emitting device has no light extraction structure part 50 and the space between the first light transmitting substrate 11 and the second light transmitting substrate 21 is filled with air, total reflection will occur on an interface between a first medium defined by the first light transmitting substrate 11 and a second medium defined by air, and therefore light striking the interface at an angle equal to or more than the critical angle is reflected. Subsequently, multipath reflection of light reflected on the interface between the first medium and the second medium will occur inside the organic EL layer and/or the first light transmitting substrate 11. Thus, the light cannot emerge outside but is attenuated. Consequently, the light extraction efficiency is reduced. With regard to light striking the interface between the first medium and the second medium at an angle less than the critical angle, Fresnel reflection is likely to occur and therefore the light extraction efficiency is further decreased.

In view of this insufficiency, the present embodiment has the aforementioned light extraction structure part 50 provided to the first face of the organic EL element 10 (the second surface of the first light transmitting substrate 11). Consequently, it is possible to improve the light extraction efficiency regarding the organic EL element 10.

The recessed and protruded structure part 51 constituting the light extraction structure part 50 has a two-dimensional periodic structure. When light emitted from the light emitting layer has a wavelength in the range of 300 to 800 nm, the two-dimensional periodic structure preferably has a period P (see FIG. 1 (a)) in a range of one fourth to ten times of $\lambda$. Besides, $\lambda$ is a wavelength of light in a medium (obtained by dividing a wavelength of light in vacuum by a refractive index of the medium).

For example, when the period P is one selected from the range of $5\lambda$ to $10\lambda$, a geometrical optics effect (enlargement of an area of the surface which light strikes at an angle less than the critical angle) causes an increase in the light extraction efficiency. When the period P is one selected from the range of $\lambda$ to $5\lambda$, light striking the surface at an angle not less than the critical angle can be extracted as diffraction light. Consequently, the light extraction efficiency is improved. When the period P is one selected from the range of $\lambda/4$ to $\lambda$, an effective refractive index at a portion around the recessed and protruded structure part 51 is decreased with an increase in distance between the portion and the first surface of the first light transmitting substrate 11. This is equivalent to interposing, between the first light transmitting substrate 11 and the space 70, a thin layer having a refractive index between the refractive index of the medium of the recessed and protruded structure part 51 to the refractive index of the medium of the space 70. Consequently, it is possible to suppress the Fresnel reflection. In brief, with selecting the period P from the range of $\lambda/4$ to $10\lambda$, the reflection (total reflection and/or Fresnel reflection) can be suppressed, and therefore the light extraction efficiency of the organic EL element 10 can be improved. Besides, the improvement of the light extraction efficiency caused by the geometrical optics effect can be obtained unless the period P is greater than $1000\lambda$. The recessed and protruded structure part 51 does not necessarily have a periodic structure such as the two-dimensional periodic structure. For example, the recessed and protruded structure part 51 may have a recessed and protruded structure in which sizes of recesses and/or protrusions are randomly determined, and an aperiodic recessed and protruded structure. Also in this instance, it is possible to improve the light extraction efficiency. When the recessed and protruded structure part 51 includes the recessed and protruded structures different from each other in size (e.g., the recessed and protruded structure part 51 includes the recessed and protruded structure with the period P of $1\lambda$ and the recessed and protruded structure with the period P equal to or more than $5\lambda$), the light extraction caused by the recessed and protruded structure having the highest occupancy in the recessed and protruded structure part 51 is dominant.

For example, the recessed and protruded structure part 51 of the light extraction structure part 50 is constituted by a prism sheet. For example, the prism sheet is a light diffusion film (manufactured by KIMOTO; product name: LIGHT-UP (registered trademark)). However, the recessed and protruded structure part 51 is not limited to the above instance. For example, the recessed and protruded structure part 51 may be formed in the second surface of the first light transmitting substrate 11 by means of imprint lithography (nano-imprint lithography). Alternatively, the recessed and protruded structure part 51 may be formed by means of injection molding of the first light transmitting substrate 11. Alternatively, the recessed and protruded structure part 51 may be directly provided to the first light transmitting substrate by use of an appropriate mold tool. The above prism sheet is generally made of resin having a refractive index in the range of 1.4 to 1.6 (i.e., commonly-used resin having a refractive index close to a refractive index of a glass substrate). The material of the prism sheet is not high refractive index resin having a refractive index higher than that of the commonly-used resin. In the present embodiment, the first light transmitting substrate 11 is constituted by a plastic substrate having a refractive index higher than that of a glass substrate. When the recessed and protruded structure part 51 has a refractive index lower than that of the first light transmitting substrate 11, as explained by a light ray illustrated as an arrow in FIG. 2 (b), total reflection is likely to occur on an interface (refractive index interface) between the first light transmitting substrate 11 and the recessed and protruded structure part 51, and this causes a loss in the light extraction. In view of the above insufficiency, in the surface light emitting device of the present embodiment, the first light transmitting substrate 11 is constituted by a plastic substrate having a refractive index higher than that of a glass substrate, and the recessed and protruded structure part 51 has a refractive index equal to or higher than that of the first light transmitting substrate 11 (the recessed and protruded structure part 51 has a refractive index not lower than that of the first light transmitting substrate 11). As explained by a light ray illustrated as an arrow in FIG. 2 (a), it is possible to suppress total reflection on the interface between the first light transmitting substrate 11 and the recessed and protruded structure part 51, and therefore the light extraction efficiency can be improved. Below TABLE 2 shows the light extraction efficiency calculated based on ray-trace simulation of a ray from the light emitting layer with regard to each of four examples of respective different combinations of refractive indices of the first light transmitting substrate 11 and the recessed and protruded structure part 51.

TABLE 2

| refractive index of first light transmitting substrate | refractive index of recessed and protruded structure part | light extraction efficiency (relative value) |
| --- | --- | --- |
| 1.5 | 1.5 | 1.0 |
| 1.5 | 1.75 | 1.0 |
| 1.75 | 1.5 | 1.0 |
| 1.75 | 1.6 | 1.2 |
| 1.75 | 1.75 | 1.6 |
| 1.75 | 2.0 | 1.6 |

TABLE 2 shows a variation of the light extraction efficiency when the refractive index of the recessed and protruded structure part 51 is varied from 1.5 to 2.0 while the first light transmitting substrate 11 has the same refractive index of 1.75. As apparent from TABLE 2, the light extraction efficiency is inclined to be saturated when the refractive index of the recessed and protruded structure part 51 is equal to or more than 1.75. In consideration of this, in the surface light emitting device of the present embodiment, the recessed and protruded structure part 51 has the refractive index equal to or more than that of the first light transmitting substrate 11. Accordingly, it is possible to suppress a loss due to total reflection on the interface between the first light transmitting substrate 11 and the recessed and protruded structure part 51, and therefore the light extraction efficiency can be improved.

For example, when the first light transmitting substrate 11 has the refractive index of 1.75, the recessed and protruded structure part 51 having the refractive index equal to or more than that of the first light transmitting substrate 11 can be formed by use of imprint lithography.

Figure 3:
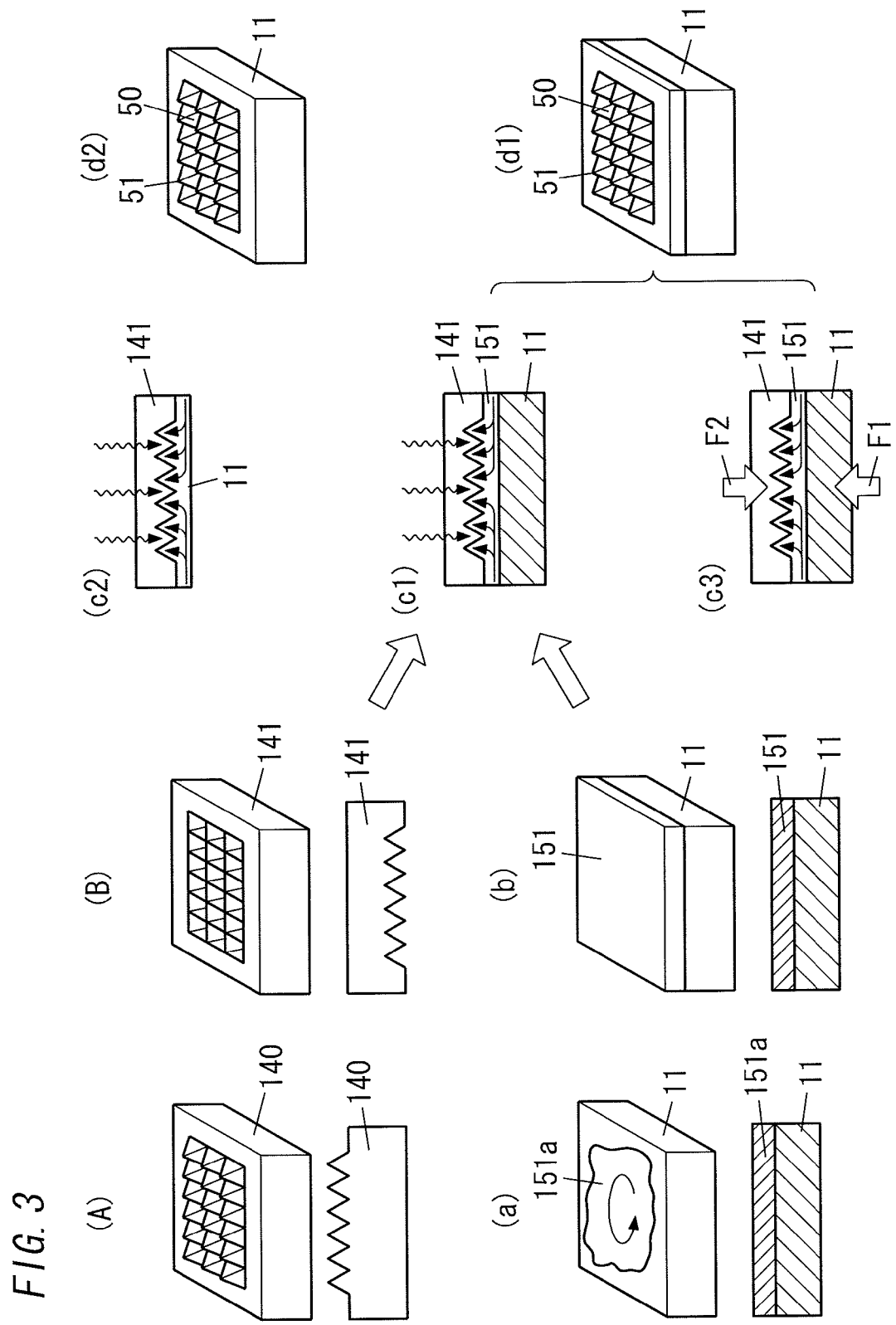
FIG. 3 is an explanatory view illustrating a process of forming the light extraction structure part of the surface light emitting device of the first embodiment.

The following brief explanation is made to a process of forming the recessed and protruded structure part 51 by use of imprint lithography with reference to FIG. 3.

First, a transfer layer 151 (see FIG. 3 (b)) is formed on the second surface of the first light transmitting substrate 11 constituted by a plastic substrate (such as a PET substrate and a PEN substrate) by use of spin-coating. The transfer layer 151 is used as a base for the recessed and protruded structure part 51 and is made of a transparent material 151a having a relatively high refractive index (e.g., thermostat resin containing nano-particles of TiO$_2$). In more detail, the transparent material 151a (see FIG. 3 (a)) is applied on the second surface of the first light transmitting substrate 11 by means of spin-coating (an arrow in FIG. 3 (a) indicates a rotation direction of the first light transmitting substrate 11). Subsequently, the transfer layer 151 is formed by pre-baking the applied transparent material 151a. Next, a mold 141 (see FIGS. 3 (B) and (c1)) with a recessed and protruded pattern corresponding to the shape of the recessed and protruded structure part 51 is pressed on the transfer layer 151 so as to modify the transfer layer 151. Thereafter, the modified transfer layer 151 is cured to form the recessed and protruded structure part 51 (see FIG. 3 (d1)), and then the mold 141 is separated from the recessed and protruded structure part 51 (see FIG. 3 (d1)). FIG. 3 (c1) illustrates an arrowed wavy line indicative of a direction of heat transfer as a whole. FIG. 3 (c1) illustrates an arrow inside the transfer layer 151, and the arrow indicates a schematic flow direction of the material forming the transfer layer 151. The mold 141 may be an Ni mold or an Si mold patterned to have fine protrusions of height of 1 μm arranged in a two-dimensional array manner at a period of 2 μm. For example, the fine protrusion is shaped into a spindle shape (e.g., a circular cone shape and a square pyramid shape), a hemispherical shape, or a circular cylindrical shape.

The nano-imprint lithography is not limited to thermal imprint lithography (thermal nano-imprint lithography) in which thermostat resin is adopted as the transparent material 151a of the transfer layer 151 as mentioned in the above. The nano-imprint lithography may be optical imprint lithography (optical nano-imprint lithography) in which photo-curing resin is adopted as the material of the transfer layer 151. In this instance, the transfer layer 151 made of photo-curing resin with low viscosity is modified by use of the mold 141 and then is cured by irradiating the transfer layer 151 with ultraviolet light. Thereafter, the mold 141 is separated from the cured transfer layer 151. According to imprint lithography, once the metal mold 140 (see FIG. 3 (A)) for the mold 141 is made, it is possible to form the recessed and protruded structure part 51 in a highly reproducible fashion. Consequently, production cost can be reduced. The metal mold 140 is uses as a master mold, and the mold 141 is used as a reverse mold. FIG. 3 (c3) shows an upward arrow F1 indicative of an irradiation direction of ultraviolet light via the first light transmitting substrate 11. FIG. 3 (c3) shows an arrow inside the transfer layer 151 and the arrow indicates a schematic flow direction of the material forming the transfer layer 151. When the first light transmitting substrate 11 is made of a substrate incapable of transmitting ultraviolet light (e.g., a PEN substrate), a resin mold made of transparent resin (e.g., PDMS (polydimethylsiloxane)) having transparency for ultraviolet light is used as the mold 141. In this instance, the transfer layer 151 is irradiated with ultraviolet light via the mold 141. FIG. 3 (c3) shows a downward arrow F2 indicative of an irradiation direction of ultraviolet light via the mold 141.

In the process of thermal imprint lithography, as shown in FIG. 3 (c2), the mold 141 is directly pressed against the second surface of the first light transmitting substrate 11. Subsequently, the first light transmitting substrate 11 is heated via the mold 141 so as to modify the first light transmitting substrate 11 to form the recessed and protruded structure part 51 (see FIG. 3 (d2)) and then the mold 141 is separated from the recessed and protruded structure part 51 (see FIG. 3 (d2)). FIG. 3 (c2) illustrates an arrowed wavy line indicative of a direction of heat transfer as a whole. FIG. 3 (c2) illustrates an arrow inside the first light transmitting substrate 11, and the arrow indicates a schematic flow direction of the material forming the first light transmitting substrate 11.

In the present embodiment, the second light transmitting substrate 21 is provided with the recessed part 21a, and the space 70 is formed between the surface of the recessed and protruded structure part 51 and the second light transmitting substrate 21. In contrast, even when the second light transmitting substrate 21 is not provided with the recessed part 21a, with appropriately selecting a thickness of the bonding part 29 bonding the organic EL element 10 and the second light transmitting substrate 20, it is possible to form the space 70 between the surface of the recessed and protruded structure part 51 and the second light transmitting substrate 21. However, in this instance, the recessed and protruded structure part 51 is preferably coated with hard coating in order to protect the surface of the recessed and protruded structure part 51 from scratches. Alternatively, the recessed and protruded structure part 51 may be made of a prism sheet with sufficient hardness. Alternatively, the recessed and protruded structure part 51 may be made of a transparent material which has sufficient hardness when cured. For example, as a hard coating material for hard coating, a high-refractive-index-type hard coating material (refractive index in the range of about 1.63 to 1.74) may be adopted. For example, the high-refractive-index-type hard coating material is one selected from TYZ series manufactured by TOY(O)INK (searched on Dec. 22, 2009, the Internet URL: http://www.toyoink.co.jp/products/lioduras/index.html). Besides, the TYZ series is ultraviolet curing type hard coating material obtained by mixing epoxy resin with zirconium oxide as fillers. Even if the second light transmitting substrate 21 is in contact with the recessed and protruded structure part 51, it is possible to improve the light extraction efficiency unless no space 70 exists between the second light transmitting substrate 21 and the recessed and protruded structure part 51.

In the surface light emitting device of the present embodiment, a part of the recessed and protruded structure part 51 is in surface contact with the second light transmitting substrate 21. Consequently, it is possible to reduce a loss due to total reflection and then the light extraction efficiency can be improved. The following explanation is made to analyzing results of respective six examples of the shape of the recessed and protruded structure part 51 as shown in FIG. 4.

Figure 4:
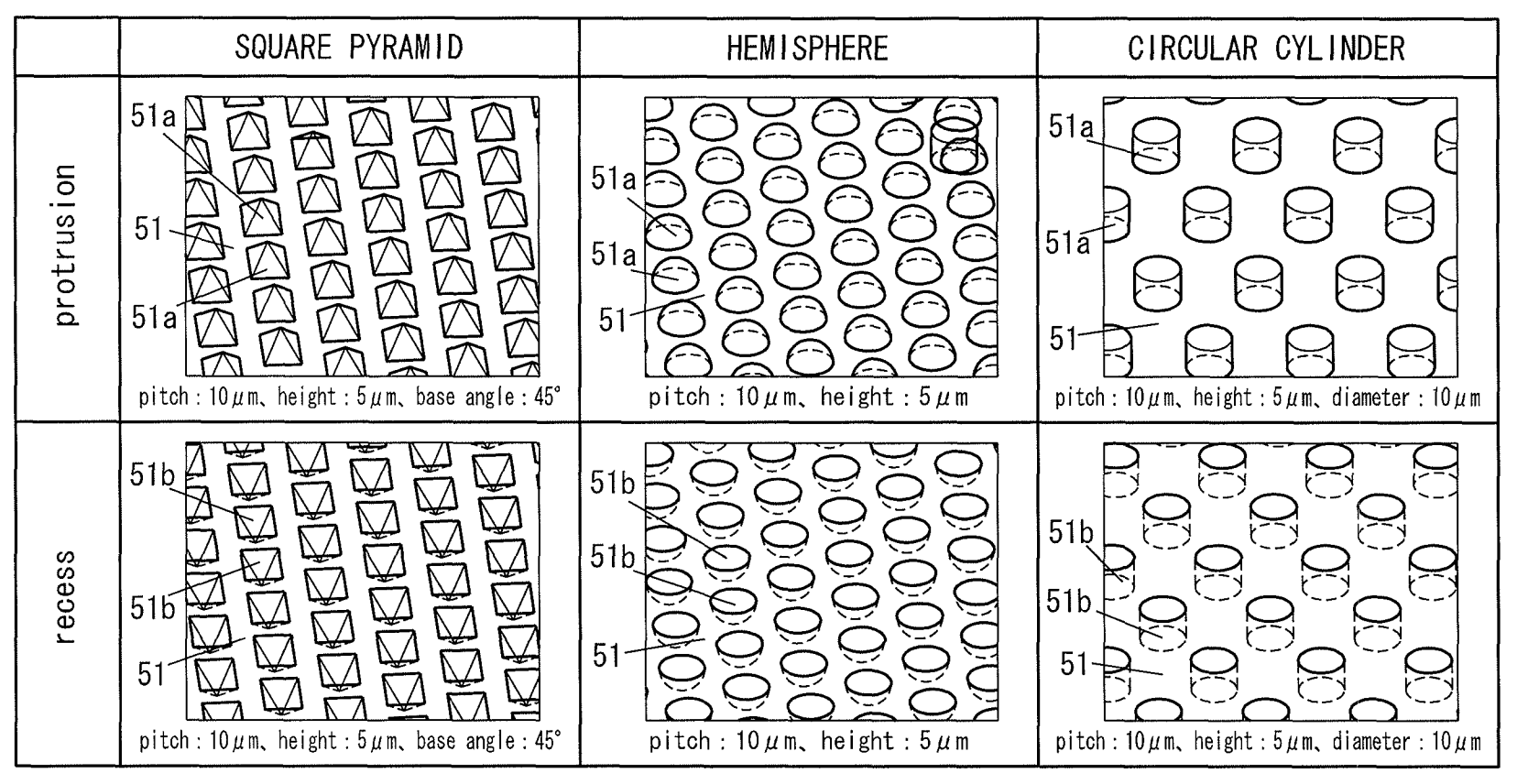

FIG. 4 shows, in the upper side, examples of the recessed and protruded structure part 51 including a plurality of protruded parts 51a. The shapes of the protruded part 51a are a square pyramid shape, a hemispherical shape, and a circular cylindrical shape, in this order from left side of FIG. 4. FIG. 4 shows, in the lower side, examples of the recessed and protruded structure part 51 including a plurality of recessed parts 51b. The shapes of the recessed part 51a are a square pyramid shape, a hemispherical shape, and a circular cylindrical shape, in this order from left side of FIG. 4. With regard to the recessed and protruded structure part 51 including a plurality of protruded parts 51a shaped into a square pyramid shape and the recessed and protruded structure part 51 including a plurality of protruded parts 51a shaped into a hemispherical shape, each recessed and protruded structure part 51 is in point contact with the second light transmitting substrate 21. However, with regard to the rest of the recessed and protruded structure parts 51, each recessed and protruded structure part 51 is in surface contact with the second light transmitting substrate 21.

With regard to the structure in which the recessed and protruded structure part 51 is arranged close to the second light transmitting substrate 21 so as to be in partial contact with the second light transmitting substrate 21, the light extraction efficiency is calculated based o the ray-trace simulation. In this ray-trace simulation, the recessed and protruded structure part 51 has a refractive index of 1.7, and the second light transmitting substrate 21 has a refractive index of 1.5, and the medium of the space and air have a refractive index of 1. Below TABLE 3 shows the results. TABLE 3 shows each ratio of the light extraction efficiency of the structure in which the recessed and protruded structure part 51 is in partial contact with the second light transmitting substrate 21 at the following area proportion of 50% to the light extraction efficiency of the structure in which the recessed and protruded structure part 51 is not in contact with the second light transmitting substrate 21. Besides, with regard to the structure in which the recessed and protruded structure part 51 is not in contact with the second light transmitting substrate 21, the distance between the recessed and protruded structure part 51 and the second light transmitting substrate 21 causes no effect on the light extraction efficiency.

TABLE 3

| | square pyramid shape | hemispherical shape | circular cylindrical shape |
|---|---|---|---|
| protruded part | 1.00 | 1.00 | 1.23 |
| recessed part | 1.16 | 1.16 | 1.31 |

TABLE 3 shows that, with regard to the surface light emitting device of the present embodiment, the structure in which the to the recessed and protruded structure part 51 is in partial contact with the second light transmitting substrate 21 has the improved light extraction efficiency relative to the structure in which the to the recessed and protruded structure part 51 is not in contact with the second light transmitting substrate 21 and the structure in which the to the recessed and protruded structure part 51 is in point contact with the second light transmitting substrate 21. Besides, the shape of the recessed and protruded structure part 51 which is in surface contact with the second light transmitting substrate 21 is not limited to the above four examples. For example, the recessed and protruded structure part 51 may include the protruded parts 51a formed into a hexagonal pillar shape, or the recessed parts 51b formed into a hexagonal pillar shape. Alternatively, the recessed and protruded structure part 51 may be formed into a diffraction grating shape.

With regard to the structure where the recessed and protruded structure part 51 is in partial contact with the second light transmitting substrate 21, in order to evaluate the effect on the light extraction efficiency caused by the area of region in which the recessed and protruded structure part 51 is in surface contact with the second light transmitting substrate 21, the present inventors studied a relation between the light extraction efficiency and the area proportion which is newly defined parameter. The area proportion Ao (%) is calculated by the following formula (1). In this calculation, a unit structure is defined by the single protruded part 51a or the single recessed part 51b.

[FORMULA 1]

$$Ao = \frac{Dm}{Dc} \times 100 \quad (1)$$

Figure 5:
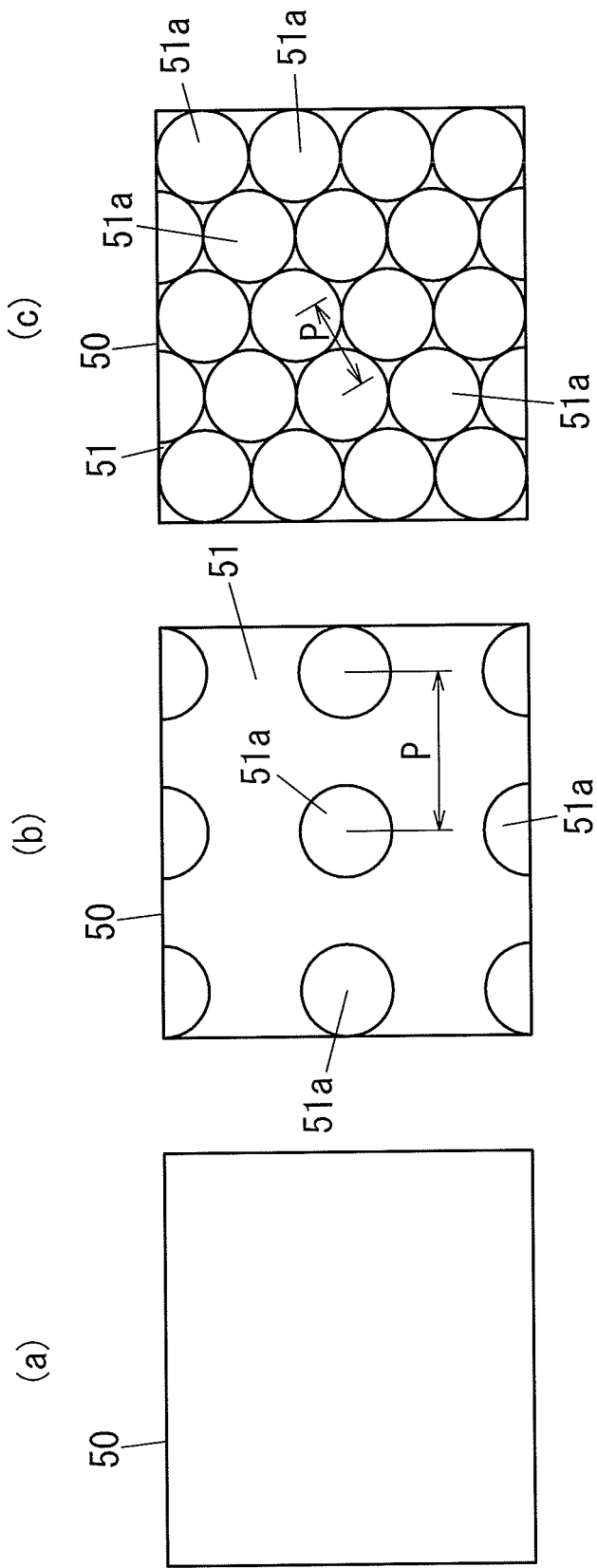
FIG. 5 is an explanatory view illustrating the above light extraction structure part.

Dm is the maximum distance between two points on the perimeter of the unit structure across the line passing through the center of the unit structure in a horizontal plane. Dc is a distance between the centers of the adjacent unit structures. The center-to-center distance Dc of the unit structures is the denominator of the formula (1) for calculating the area proportion. The center-to-center distance Dc denotes a pitch P (see FIG. 5 (b), (c)) between the adjacent unit structures. When there are no unit structures, Dc is regarded as an infinite value. The maximum distance Dm is the numerator of the formula (1) for calculating the area proportion. When the unit structure is formed into a cylindrical shape, the maximum distance Dm denotes a diameter of the unit structure. When the unit structure is formed into a square pyramid shape, the maximum distance Dm denotes a length of a diagonal line of a bottom surface of the unit structure. For example, it is assumed that the unit structure is the protruded part 51a formed into a circular cylindrical shape. In this instance, as shown in FIG. 5 (c), when the multiple protruded parts 51a are arranged such that the adjacent protruded parts 51a are in contact with each other, the area proportion is 100%. As shown in FIG. 5 (b), when the pitch P between the adjacent protruded parts 51a is twice as long as the diameter of the unit structure, the area proportion is 50%. As shown in FIG. 5 (a), when there are no protruded parts 51a, the area proportion is 0%.

Figure 6:
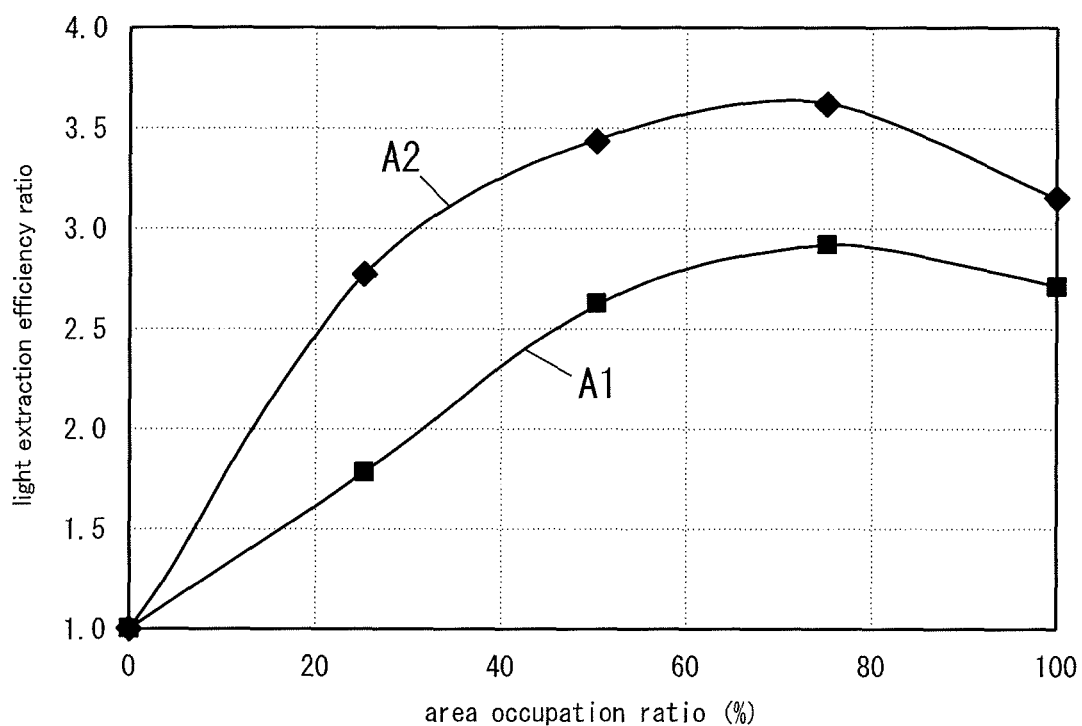
FIG. 6 is an explanatory view illustrating the above light extraction structure part.

As apparent from TABLE 3 obtained by analyzing the aforementioned six shapes of the recessed and protruded structure parts 51, the recessed and protruded structure part 51 including the protruded parts 51a each in the form of a circular cylinder shows the highest ratio. FIG. 6 shows a relation between the area proportion and the ratio of the light extraction efficiency with regard to an instance where the recessed and protruded structure part 51 including the protruded parts 51a formed into a circular cylindrical shape is adopted. In FIG. 6, A1 denotes the ratio in an instance where the recessed and protruded structure part 51 is not in contact with the second light transmitting substrate 21. In FIG. 6, A2 denotes the ratio in an instance where the recessed and protruded structure part 51 is not in contact with the second light transmitting substrate 21.

FIG. 6 shows the ratio is not necessarily increased with an increase in the contact area of the recessed and protruded structure part 51 and the second light transmitting substrate 21. FIG. 6 suggests the existence of the optimal area proportion. In brief, as apparent from FIG. 6, when the recessed and protruded structure part 51 including the protruded parts 51a formed into a circular cylindrical shape, the area proportion is preferably about 75% rather than 100%.

In consideration of the light distribution pattern obtained by interference of light inside the thin film constituted by the organic EL element 13 and the anode 12 as well as the ray-trace simulation, it is possible to determine the shape (recessed and protruded pattern) of the recessed and protruded structure part 51 capable of highly improving the ratio of the light extraction efficiency. The aforementioned light distribution pattern is approximately identical to incident light distribution characteristics of the first light transmitting substrate 11. As shown in FIG. 7 (a), this incident light distribution characteristics can be obtained by measuring the angular dependency (light distribution pattern) of the intensity of radiated light with regard to a structure in which a hemispherical lens 210 with a diameter enough greater than the dimension of the light emitting surface is arranged in the opposite side of the first light transmitting substrate 11 from the anode 12. When a PEN substrate with a refractive index of 1.77 is adopted as the first light transmitting substrate 11, a high refractive index glass lens with a refractive index of 1.77 is used as the hemispherical lens 210, and matching oil with a refractive index of 1.77 is interposed between the first light transmitting substrate 11 and the hemispherical lens 210. When there is no aforementioned hemispherical lens 210, light striking the first light transmitting substrate 11 may be deflected on the interface between the first light transmitting substrate 11 and air, and then the direction of the light is varied. Further, total reflection may increase an amount of light which does not reach air. Consequently, it is impossible to measure the incident light distribution characteristics. In contrast, with employing the structure illustrated in FIG. 7 (a), even when the incident light distribution characteristics are varied with a variation of the layer construction of the organic EL layer 13, it is possible to measure the incident light distribution characteristics with high accuracy. Consequently, it is possible to determine the optimal shape of the recessed and protruded structure part 51 with regard to each of the structure with relatively high directional characteristics as illustrated by the light distribution pattern shown by the dashed-dotted line in FIG. 8 (a) and the structure with relatively low directional characteristics as illustrated by the light distribution pattern shown by the dashed-dotted line in FIG. 8 (b).

For the purpose of ascertaining the reason why the surface contact of the recessed and protruded structure part 51 and the second light transmitting substrate 21 causes an increase in the light extraction efficiency, the present inventors considered a model illustrated in FIG. 9 (b). In the model shown in FIG. 9 (b), a total thickness of the anode 12 and the organic EL layer 13 is negligible relative to a thickness of the first light transmitting substrate 11. Consequently, with regard to the thickness direction, a light emitting position is regarded as the same position as the opposite surface of the anode 14 acting as the reflection electrode from the second light transmitting substrate 21. Thus, an arrowed solid line indicates an instance of a light path from the light emitting position. In the model illustrated in FIG. 9 (b), the recessed and protruded structure part 51, the first light transmitting substrate 11, the anode 12, and the organic EL element 13 have the common refractive index of $n_3$. Thus, the interfaces among these are not shown in FIG. 9 (b). Further, in the model of FIG. 9 (b), the medium (air) of the space 70 has a refractive index of $n_1$, and the second light transmitting substrate 21 has a refractive index of $n_2$, and external air contacting the second light transmitting substrate 21 at the light extraction side thereof has a refractive index of $n_1$ ($n_1 < n_2 < n_3$). FIG. 9 (a) illustrates a mode in which the recessed and protruded structure part 51 is not in contact with the second light transmitting substrate 21. FIG. 9 (a) shows an arrowed solid line indicative of an instance of a light path from the light emitting position. In the model shown in FIG. 9 (a), a mode (waveguide mode) in which total reflection on the interface of the recessed and protruded structure part 51 and the space 70 and reflection on the cathode 15 are repeated is likely to occur. Thus, a light ray which is finally absorbed in the cathode 14 would exist. The present inventors confirmed, from the results of the ray-trace simulation, that a component absorbed in the cathode 14 due to such mode exists in light rays emitted from the light emitting position. Moreover, the present inventors confirmed that the component would increase when there is no recessed and protruded structure part 51 and the interface between the space 70 and the first light transmitting substrate 11 is flat. In the model of FIG. 9 (b), the critical angle of the interface between the recessed and protruded structure part 51 and the second light transmitting substrate 21 is increased in conformity with Snell's law. According to the model of FIG. 9 (b), a part of light rays which will be trapped in the aforementioned mode in the model of FIG. 9 (a) is not totally reflected on the interface between the recessed and protruded structure part 51 and the second light transmitting substrate 21 and then passes through the second light transmitting substrate 21. In consideration of Snell's law, a part of light rays passing through the second light transmitting substrate 21 is totally reflected on the interface between the second light transmitting substrate 21 and the external air. However, in the model of FIG. 9 (*b*), reflection of light rays between the cathode 14 and the surface of the recessed and protruded structure part 51 is not repeated. According to the model of FIG. 9 (*b*), when a light ray is totally reflected on the interface between the second light transmitting substrate 21 and the air outside the second light transmitting substrate 21 and subsequently is reflected on the cathode 14, this light ray strikes the interface between the recessed and protruded structure part 51 and the medium of the space 70 at an angle smaller than the critical angle. Consequently, the light can pass through the second light transmitting substrate 21 and then emerge into the air. Consequently, according to the model illustrated in FIG. 9 (*b*), it is considered that the light extraction efficiency can be improved. According to the model shown in FIG. 9 (*b*), with regard to rays other than rays trapped in the mode explained by the model of FIG. 9 (*a*), the number of times of reflection on the cathode 14 is decreased, and then an absorption loss can be decreased. Thus, the light extraction efficiency can be improved.

With regard to the light extraction structure part 50, it is important that the space 70 exists between the surface of the recessed and protruded structure part 51 and the second light transmitting substrate 21. When the surface of the recessed and protruded structure part 51 is the interface between the recessed and protruded structure part 51 and the second light transmitting substrate 21, the refractive index interface between the second light transmitting substrate 21 and the external air exists. Consequently, total reflection is likely to occur again at the refractive index interface. In contrast, according to the surface light emitting device of the present embodiment, light from the organic EL element 10 emerge into the space 70 one time. Consequently, it is possible to prevent a loss caused by total reflection which would otherwise occur on the interface between the air of the space 70 and the second light transmitting substrate 21 and the interface between the second light transmitting substrate 21 and the external air.

With regard to the structure where the first light transmitting substrate 11 is constituted by a PET substrate with a refractive index of 1.65 and the second light transmitting substrate 21 is constituted by a glass substrate with a refractive index of 1.5, FIG. 10 (*a*) shows, in the right side, the calculated light extraction efficiency for each medium. FIG. 10 (*b*) illustrates a reference example where the first light transmitting substrate 11 is constituted by a glass substrate with a refractive index of 1.5. The reference example does not include the second light transmitting substrate 21. FIG. 10 (*b*) shows, in the right side, the light extraction efficiency for each medium calculated based on point source approximation in which the light emitting region of the light emitting layer is considered as a sufficiently small point source.

The calculation of the light extraction efficiency was made with regard to a simple model. In the simple model, as shown in FIGS. 10 (*a*) and (*b*), the light emitting layer is in contact with the first light transmitting substrate 11. Further, in this calculation, it is assumed that the refractive index of the light emitting layer is 1.7 and intermediates (e.g., the hole transport layer and the anode 12) between the light emitting layer and the first light transmitting substrate 11 have the same refractive index as that of the light emitting layer. With regard to FIGS. 10 (*a*) and (*b*), "n" denotes a refractive index. In the aforementioned point source approximation, an intensity of transmitted light in a direction of a normal line of the boundary surface between the light emitting layer made of the medium with the relatively high refractive index ($n_2$) and the first light transmitting substrate 11 made of the medium with the relatively low refractive index ($n_1$) is represented as $I_0$. An intensity per unit solid angle of transmitted light along a direction at θ degree relative to the normal line is represented as $2\pi I_0 \sin\theta$. A probability η that light is transmitted from the light emitting layer to the first light transmitting substrate 11 is considered as the light extraction efficiency. The probability η is calculated by use of the following formula (2). In the formula (2), $\eta_c$ denotes the critical angle and is given by $\theta_c = \sin^{-1}(n_1/n_2)$. With regard to each of the models of FIG. 10 (*a*) and FIG. 10 (*b*), the light extraction efficiency was calculated under the supposition where a probability that light emerges from the recessed and protruded structure part 51 into the air is 60%. Further, as to the model of FIG. 10 (*a*), the light extraction efficiency was calculated under the condition where Fresnel loss of light emerging from the second light transmitting substrate 21 into the air is 8%.

[FORMULA 2]

$$\eta = \frac{2\pi I_0 \int_0^{\theta_c} \sin\theta d\theta}{2\pi I_0 \int_0^{\pi/2} \sin\theta d\theta} \times 100 = \left\{1 - \sqrt{1 - \left(\frac{n_1}{n_2}\right)^2}\right\} \times 100 \qquad (2)$$

FIG. 10 (*a*) and FIG. 10 (*b*) show the instance of FIG. 10 (*a*) has the light extraction efficiency which is 1.3 times higher than that of the reference example of FIG. 10 (*b*) and therefore the light extraction efficiency is improved.

Notably, when the space 70 does not exist between the recessed and protruded structure part 51 constituting the light extraction structure part 50 and the second light transmitting substrate 21, total reflection on the interface between the second light transmitting substrate 21 and air is likely to occur.

Consequently, it is preferable that the space 70 exists between the recessed and protruded structure part 51 constituting the light extraction structure part 50 and the second light transmitting substrate 21. In view of mechanical strength of the surface light emitting device and ease of a process of fabricating the surface light emitting device, it may be preferable that the space 70 is filled with transparent material. For example, formed between the recessed and protruded structure part 51 and the second light transmitting substrate 21 is a light transmitting part made of transparent material with a refractive index not greater than the refractive index of the second light transmitting substrate 21. According to this instance, it is possible to reduce a loss caused by total reflection, and then improve the light extraction efficiency. For example, as the transparent material of the light transmitting part, a material having a refractive index which is very nearly 1 (i.e., this material is selected from low refractive index materials having a refractive index which is enough small as considered to be identical to the refractive index of air) is preferable, and for example, such a material is silica aerogel (n=1.05). In other words, the surface light emitting device of the present embodiment may include the light transmitting part designed to have transparency for light emitted from the organic EL element 10 and a refractive index not greater than that of the second light transmitting substrate 21. In this instance, the light extraction structure part 50 is the recessed and protruded structure part 51 provided to the first face of the organic EL element 10, and the light transmitting part is interposed between the recessed and protruded structure part 51 and the second light transmitting substrate 21.

As described in the above, the surface light emitting device of the present embodiment includes the organic EL element 10, the second light transmitting substrate (protection substrate) 21, the protection part 30, and the light extraction structure part 50. The organic EL element 10 has the first face (one face in its thickness direction; the lower surface in FIG. 1 (a)) and the second face (the other face in its thickness direction; the upper surface in FIG. 1 (a)) opposite to the first face. The organic EL element 10 is configured to emit light from the first face. The second light transmitting substrate 21 has transparency for light emitted from the organic EL element 10. The second light transmitting substrate 21 is placed facing the first face of the organic EL element 10. The second light transmitting substrate 21 has the primary surface (upper surface in FIG. 1(a)) facing the first face of the organic EL element 10. The protection part 30 is placed facing the second face of the organic EL element 10. The protection part 30 is configured to constitute a housing in combination with the second light transmitting substrate 21, and the housing is configured to accommodate the organic EL element 10 so as to protect the organic EL element 10 from moisture. The light extraction structure part 50 is interposed between the first face of the organic EL element 10 and the second light transmitting substrate 21. The light extraction structure part 50 is configured to suppress reflection (total reflection) of light emitted from the organic EL element 10 on the first face of the organic EL element 10.

Further, in the surface light emitting device of the present embodiment, the organic EL element 10 includes the organic EL layer 13 containing the light-emitting layer configured to emit light, and the first light transmitting substrate (formation substrate) 11 having transparency for light emitted from the light-emitting layer. The light-emitting layer is formed over the first surface (upper surface in FIG. 1 (a)) of the first light transmitting substrate 11. The first face of the organic EL element 10 is defined by the second surface (lower surface in FIG. 1 (a)) of the first light transmitting substrate 11 opposite to the first surface thereof. The first light transmitting substrate 11 has the refractive index higher than that of the second light transmitting substrate 21.

Further, in the surface light emitting device of the present embodiment, the second light transmitting substrate 21 has a weatherproof property and a waterproof property higher than those of the first light transmitting substrate 11.

For example, the first light transmitting substrate 11 is a plastic substrate (e.g., PET, PEN, PES, and PC) and the second light transmitting substrate 21 is a glass substrate (e.g., a non-alkali glass substrate and a soda lime glass substrate).

Further, in the surface light emitting device of the present embodiment, the light extraction structure part 50 is the recessed and protruded structure part 51 provided to the first face of the organic EL element 10. The second light transmitting substrate 21 is placed to form the space 70 between the recessed and protruded structure part 51 and the second light transmitting substrate 21. The second light transmitting substrate 21 has the refractive index higher than that of the medium filling the space 70.

Further, in the surface light emitting device of the present embodiment, the recessed and protruded structure part 51 has the refractive index equal to or higher than that of the first light transmitting substrate 11.

Further, in the surface light emitting device of the present embodiment, the recessed and protruded structure part 51 includes the periodic recessed and protruded structure. The recessed and protruded structure has the period P in the range of one fourth to ten times of the wavelength of light emitted from the organic EL element 10.

Further, in the surface light emitting device of the present embodiment, the recessed and protruded structure part 51 is designed to be in surface contact with the primary surface of the second light transmitting substrate 21.

Further, in the surface light emitting device of the present embodiment, the second light transmitting substrate 21 is provided in its primary surface with the recessed part 21a configured to accommodate the recessed and protruded structure part 51. The space 70 is defined as the gap between the inner surface of the recessed part 21a and the surface of the recessed and protruded structure part 51.

As explained in the above, the surface light emitting device of the present embodiment includes the second light transmitting substrate 21 in addition to the first light transmitting substrate 11 of the organic EL element 10. Accordingly, it is possible to enhance the waterproof property and the weatherproof property without employing a high refractive index glass substrate or a plastic substrate provided with a barrier layer as the first light transmitting substrate 11. Further, according to the surface light emitting device of the present embodiment, the first light transmitting substrate 11 can be formed of a substrate having a refractive index higher than that of a common glass substrate (e.g., a soda lime glass substrate and a non-alkali glass substrate). Thus, it is possible to reduce a loss due to total reflection on the interface between the light emitting layer and the first light transmitting substrate 11. Moreover, the surface light emitting device of the present embodiment includes the light extraction structure part 50 which is interposed between the first face of the organic EL element 10 and the second light transmitting substrate 21 and is configured to suppress total reflection of light emitted from the light emitting layer on the first face of the organic EL element 10. Consequently, the light extraction efficiency can be improved. The surface light emitting device of the present embodiment therefore can have the improved light extraction efficiency as well as the enhanced weatherproof property and the enhanced waterproof property.

Further, in the surface light emitting device of the present embodiment, a plastic substrate provided with no barrier layer is adopted as the first light transmitting substrate 11, and a glass substrate (e.g., a soda lime glass substrate and a non-alkali glass substrate) is adopted as the second light transmitting substrate 21. Consequently, it is possible to fabricate the surface light emitting device at lowered cost, and it is possible to suppress deterioration of long-time reliability of the organic EL element 10 due to outside ultraviolet rays.

Figure 11:
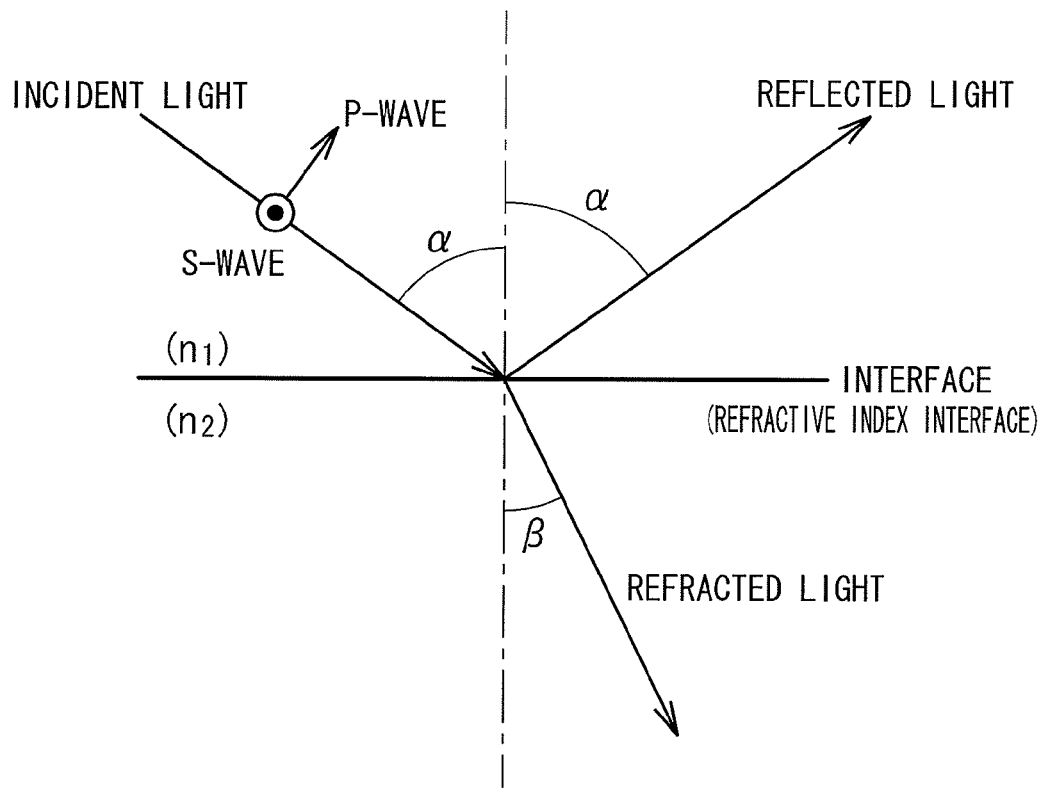
FIG. 11 is an explanatory view illustrating a primary part of the surface light emitting device of the first embodiment.

When light passes through the second light transmitting substrate 21, a loss due to Fresnel reflection is likely to occur. As shown in FIG. 11, a plane of incidence is defined as a plane containing the direction of incident light and a normal line of the boundary surface (interface between the medium with an absolute refractive index of $n_1$ and the medium with an absolute refractive index of $n_2$). The incident light is considered as a P wave in the plane of incidence and an S wave perpendicular to the plane of incidence. The reflectance (reflection ratio) $t_p$ and the transmission ratio $t_p$ of the P wave and the reflectance $r_s$ and the transmission ratio $t_s$ of the S wave are calculated by use of the following formulae (3) to (6) based on Fresnel formula, respectively. In the following formulae (3) to (6), "$\alpha$" denotes an angle between the normal line and the direction of the incident light, and "$\beta$" denotes a refraction angle defined as an angle between the normal line and refracted light (transmitted light).

[FORMULA 3]

$$r_p = \left|\frac{n_1\cos\beta - n_2\cos\alpha}{n_1\cos\beta + n_2\cos\alpha}\right| = \left|\frac{\tan(\alpha - \beta)}{\tan(\alpha + \beta)}\right| \quad (3)$$

$$t_p = \sqrt{\frac{n_2\cos\beta}{n_1\cos\alpha}} \cdot \frac{2n_1\cos\alpha}{n_2\cos\alpha + n_1\cos\beta} = \sqrt{\frac{n_2\cos\beta}{n_1\cos\alpha}} \cdot \frac{2\cos\alpha\sin\beta}{\sin(\alpha+\beta)\cos(\alpha-\beta)} \quad (4)$$

$$r_s = \left|\frac{n_1\cos\alpha - n_2\cos\beta}{n_1\cos\alpha + n_2\cos\beta}\right| = \left|\frac{\sin(\alpha - \beta)}{\sin(\alpha + \beta)}\right| \quad (5)$$

$$t_s = \sqrt{\frac{n_2\cos\beta}{n_1\cos\alpha}} \cdot \frac{2n_1\cos\alpha}{n_1\cos\alpha + n_2\cos\beta} = \sqrt{\frac{n_2\cos\beta}{n_1\cos\alpha}} \cdot \frac{2\cos\alpha\sin\beta}{\sin(\alpha+\beta)} \quad (6)$$

In consideration of light transmitted from the air in the space 70 to the second light transmitting substrate 21, it is supposed that light emitted from the organic EL layer 13 is distributed in conformity with the Lambertian light distribution properties (i.e., the light distribution properties obtained based on the radiation angle dependence of intensity of radiated light approximated by the Lambertian distribution). Further, $n_1=1.51$, and $n_2=1$. In this instance, total reflectance of the P-polarized light (P-wave) and the S-polarized light (S-wave) are about 3% and 10%, respectively. Further, in consideration of light transmitted from the second light transmitting substrate 21 to the external air, similarly, total reflectance of the P-polarized light (P-wave) and the S-polarized light (S-wave) are about 3% and 10%, respectively. When the P-polarized light component and the S-polarized light component are identical, in total 13% (=(3+10)/2+(3+10)/2) of light is reflected. With regard to the measurement of light emitting property of the organic EL element 10, the efficiency of an instance where light is transmitted through the second light transmitting substrate 21 made of the glass substrate is lower by about 8 to 15% than the efficiency of an instance where light is not transmitted through the second light transmitting substrate 21 made of the glass substrate. However, an efficiency loss depends on the light distribution pattern. For example, with regard to light (e.g., laser) with strong directivity in the vertical incident direction, the efficiency loss is decreased. With regard to the evaluation of the light emitting property, a constant current power source supplied a constant current of 2 mA/cm² to the organic EL element 10. The intensity of the radiated light was measured with regard to the radiation angle in the range of −85° to 85° by a step of 5° by use of a spectroscope (the multichannel analyzer, trade name of "PMA-11", manufactured by HAMAMATSU photonics corporation). In view of the projection area, the value proportional to each of total luminous flux (or external quantum efficiency) and front brightness was calculated.

With regard to the incident light perpendicular to the interface (i.e., the incident angle $\alpha=0$), the reflectance of the S-polarized light is equal to that of the P-polarized light. The reflectance (reflection ratio) "r" is calculated by use of the following formula (7).

[FORMULA 4]

$$r = \left(\frac{n_1 - n_2}{n_1 + n_2}\right)^2 \quad (7)$$

When light is transmitted from the air in the space 70 to the second light transmitting substrate 21, the reflectance "r" is approximately 4%. When light is transmitted from the second light transmitting substrate 21 to the external air, the reflectance "r" is also approximately 4%. Consequently, in total, 8% of light is reflected. According to the actual measurement of the light emitting property of the organic EL element 10, the front brightness of the instance where light is transmitted through the second light transmitting substrate 21 made of the glass substrate is lower by about 8% than the front brightness of the instance where light is not transmitted through the second light transmitting substrate 21 made of the glass substrate.

Thus, in the surface light emitting device of the present embodiment, it is preferable to reduce Fresnel loss of light transmitting through the second light transmitting substrate 21. For example, it is considered that providing an anti-reflection coat (referred to as "AR film") to at least one of opposite surfaces of the second light transmitting substrate 21 in the thickness direction is means for suppressing the Fresnel loss. The AR film is constituted by a single layer dielectric film or a multilayer dielectric film. In brief, with regard to the surface light emitting device of the present embodiment, it is considered to provide the AR film to at least one of the inner bottom surface of the recessed part 21a in the side of the second light transmitting substrate 21 close to the organic EL element 10 and the opposite surface of the second light transmitting substrate 21 from the organic EL element 10. In other words, in the surface light emitting device of the present embodiment, the anti-reflection coating may be provided to at least one of the primary surface (upper surface in FIG. 1 (a)) of the second light transmitting substrate 21 and the second surface (lower surface in FIG. 1 (a)) of the second light transmitting substrate 21 opposite to the first surface thereof. For example, the AR film is a magnesium fluoride film (MgF$_2$ film) with a refractive index "n" of 1.38. When a designated center wavelength $\lambda_o$ is 550 nm, it is sufficient that the AR film is designed to have a thickness of $\lambda_0/4=550/(4*1.38)=99.6$ nm. Alternatively, the AR film is an aluminum oxide film (Al$_2$O$_3$ film) with a refractive index "n" of 1.58. When a designated center wavelength $\lambda_0$ is 550 nm, it is sufficient that the AR film is designed to have a thickness of $\lambda_0/4=550/(4*1.58)=87.0$ nm. Alternatively, the AR film may be a laminated film (two layer AR film) of a magnesium fluoride film of a thickness of 99.6 nm and an aluminum oxide film of a thickness of 87.0 nm. Besides, the material of the dielectric film may be selected from materials other than magnesium fluoride and aluminum oxide.

In the surface light emitting device of the present embodiment, the AR film is provided to at least one of the opposite surfaces of the second light transmitting substrate 21 in the thickness direction thereof, and is preferably provided to the opposite surfaces of the second light transmitting substrate 21. Thus, it is possible to reduce the Fresnel loss, and the light extraction efficiency can be improved. When the AR film constituted by the magnesium fluoride film is provided to the opposite surface of the second light transmitting substrate 21 in its thickness direction, the front brightness is increased by 8% and the external quantum efficiency is increased by 6%.

For example, it is considered that providing a moth-eye structure 80 to at least one of the opposite surfaces of the second light transmitting substrate 21 in the thickness direction thereof is other means for suppressing the Fresnel loss. In other words, in the surface light emitting device of the present embodiment, the moth-eye structure may be provided to at least one of the primary surface (upper surface in FIG. 1 (a)) of the second light transmitting substrate 21 and the second surface (lower surface in FIG. 1 (a)) of the second light transmitting substrate 21 opposite to the first surface thereof.

Figure 12:
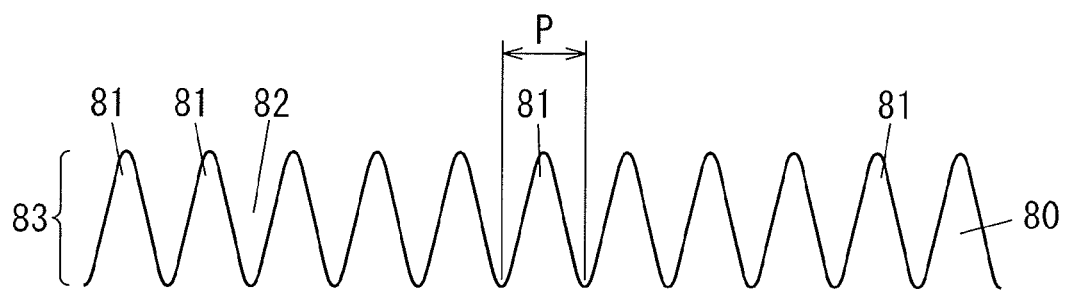
FIG. 12 is a schematic cross sectional view illustrating a moth-eye structure.

For example, the AR film is a magnesium fluoride film (MgF$_2$ film) with a refractive index "n" of 1.38. When a designated center wavelength $\lambda_0$ is 550 nm, it is sufficient that the AR film is designed to have a thickness of $\lambda_0/4=550/(4*1.38)=99.6$ nm. Alternatively, the AR film is an aluminum oxide film (Al$_2$O$_3$ film) with a refractive index "n" of 1.58. When a designated center wavelength $\lambda_0$ is 550 nm, it is sufficient that the AR film is designed to have a thickness of $\lambda_0/4=550/(4*1.58)=87.0$ nm. Alternatively, the AR film may be a laminated film (two layer AR film) of a magnesium fluoride film of a thickness of 99.6 nm and an aluminum oxide film of a thickness of 87.0 nm. Besides, the material of the dielectric film may be selected from materials other than magnesium fluoride and aluminum oxide. The moth-eye structure 80 includes a two-dimensional periodic structure including taper shaped fine protrusions 81 are arranged in a two-dimensional array manner. The multiple fine protrusions 81 and the media (air in the instance shown in FIG. 12) 82 existing between the adjacent fine protrusions 81 constitute an antireflection part 83. When the moth-eye structure 80 is formed by modification of the second light transmitting substrate 21 by means of the nano-imprint lithography, the fine protrusion 81 has the same refractive index as that of the second light transmitting substrate 21. In this instance, an effective refractive index of the antireflection part 83 is continuously varied from the refractive index (=1) of the medium 82 to the refractive index (=1.51) of the second light transmitting substrate 21 in the thickness direction of the antireflection part 83. Consequently, a pseudo state that the refractive index interface causing the Fresnel loss disappears is obtained. Consequently, the moth-eye structure 80 can reduce dependence on a wavelength and an incident angle and lowers the reflectance.

With regard to the moth-eye structure 80, the height of the fine protrusion 81 is 200 nm and the period P of the fine protrusions 81 is 100 nm. However, the height of the fine protrusion 81 and the period P of the fine protrusions 81 are not limited to the above instances.

Figure 13:
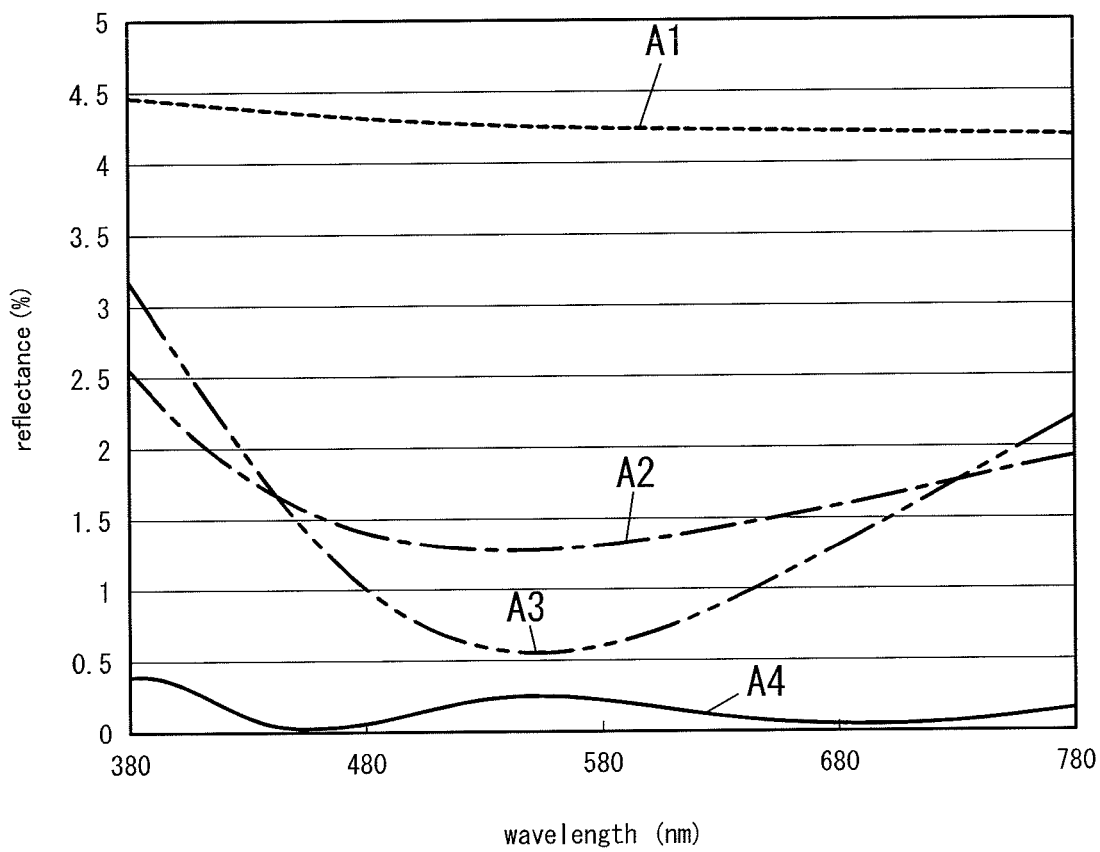
FIG. 13 is an explanatory view illustrating reflectance of light in a visible range.

FIG. 13 shows simulation results A1, A2, A3, and A4 of the reflectance in the visible range. Al relates to an example in which neither the AR film nor the moth-eye structure 81 is provided to the surface of the second light transmitting substrate 21. A2 relates to an example in which the AR constituted by a magnesium fluoride film is provided to the surface of the second light transmitting substrate 21. A3 relates to an example in which the moth-eye structure 80 is provided to the surface of the second light transmitting substrate 21. A4 relates to an example in which the AR constituted by a laminated film of a magnesium fluoride film and an aluminum oxide film is provided to the surface of the second light transmitting substrate 21. Besides, the simulation of the reflectance of the AR film was performed by making use of analysis based on Fresnel coefficients. The simulation of the reflectance of the moth-eye structure 80 was performed by making use of Rigorous Coupled Wave Analysis (RCWA).

FIG. 13 shows that the example (A4 in FIG. 13) in which the moth-eye structure 80 is provided as the means for suppressing the Fresnel loss can suppress the Fresnel loss and then improve the light extraction efficiency and further can reduce the wavelength dependence and the incident angle dependence of the reflectance relative to the examples (A2 and A3 in FIG. 13) in which the AR film is provided as the means for suppressing the Fresnel loss.

For example, the aforementioned moth-eye structure 80 can be formed by use of nano-imprint lithography. The moth-eye structure 80 may be formed by use of one (e.g., laser processing) of methods other than the nano-imprint lithography. Alternatively, for example, the moth-eye structure 80 may be constituted by a moth-eye antireflection film manufactured by MITSUBISHI RAYON co., ltd.

EXAMPLE 1

The surface light emitting device of the present example has the configuration of the first embodiment shown in FIG. 1 (a) to (c). In the organic EL element 10 of the present example, the organic EL layer 13 between the anode 12 and the cathode 14 has a laminated structure of the hole transport layer, the light emitting layer, the electron transport layer, and the electron injection layer.

In the process of fabricating the organic EL element 10 of the surface light emitting device of the present example, first, an ITO film with a thickness of 100 nm was deposited on the first surface of the first light transmitting substrate 11 by use of a sputtering method. Next, a positive type resist (trade name "OFPR800LB", manufactured by TOKYO OHKA KOGYO co., ltd.) was applied to the entire first surface of the first light transmitting substrate 11 and then was baked. Subsequently, the resist was exposed to ultraviolet through a separately prepared glass mask, and exposed part of the resist was removed with a developer (trade name "NMD-W", manufactured by TOKYO OHKA KOGYO co., ltd.). Thereby, the resist was patterned. Thereafter, a portion of the ITO film which is not covered with the resist was etched with an etchant (trade name "ITO-06N", manufactured by KANTO CHEMICAL co., inc.) through the resist as a mask, and thereby the anode 12 constituted by the patterned ITO film was formed. After that, the patterned resist was removed with a resist remover solution (trade name "stripper 106", manufactured TOKYO OHKA KOGYO co., ltd.). Besides, in a deposition condition of the ITO film by use of the sputtering method, a target is an ITO target, and a deposition temperature is 100° C.

The first light transmitting substrate 11 on which the above anode 12 was formed was ultrasonically washed with a neutral detergent for ten minutes, and washed with pure water for ten minutes. Then, washed first light transmitting substrate 11 was dried at a predetermined drying temperature (80° C.) for a predetermined time period (2 hours) in vacuum. Subsequently, the dried first light transmitting substrate 11 was subjected to surface purification treatment using ultraviolet (UV) and ozone (O$_3$) for a predetermined time period (10 minutes).

Next, the first light transmitting substrate 11 was disposed within a chamber of a vacuum vapor deposition apparatus. Then, an alpha-NPD layer having a thickness of 40 nm was deposited on the first light transmitting substrate 11 as the hole transport layer. Next, deposition of aluminum tris(quinoline-8-olate) (referred to as "Alq$_3$") doped with 5% rubrene was performed to form the light emitting layer having a thickness of 40 nm. Subsequently, an Alga layer having a thickness of 40 nm was deposited on the light emitting layer as the electron transport layer. Thereafter, a lithium fluoride (LiF) layer having a thickness of 1 nm was deposited on the electron transport layer as the electron injection layer. Thereafter, an aluminum layer having a thickness of 80 nm was deposited on the electron injection layer as the cathode 14.

After fabrication of the above organic EL element 10, the organic EL element 10 was transferred to a glove box under dry nitrogen atmosphere at dew point equal to or less than −86° C. without exposure to air. Thereafter, the light extraction structure part 50 constituted by a prism sheet (the recessed and protruded structure has a period of about 3 μm) provided with adhesive was preliminarily dried and then was stuck to the second surface of the first light transmitting substrate 11. Subsequently, the first light transmitting substrate 11 was fixed to the second light transmitting substrate 21 by use of the bonding part 29. After that, the protection part 30 made of a glass substrate in which the water absorption member 40 made of getter material containing calcium oxide was fixed to the inner bottom surface of the storage recess 31 was prepared, and then the protection part 30 was fixed to the second light transmitting substrate 21 by use of the bonding part 39.

EXAMPLE 2

The surface light emitting device which has the same structure as that of the example 1 except the PEN substrate is adopted as the first light transmitting substrate 11 was prepared as the example 2.

EXAMPLE 3

The surface light emitting device which has the same structure as that of the example 1 except the PES substrate is adopted as the first light transmitting substrate 11 was prepared as the example 3.

COMPARATIVE EXAMPLE 1

The surface light emitting device which has the same structure as that of the example 1 except the non-alkali glass substrate with a refractive index of 1.5 for light with a wavelength of 550 nm is adopted as the first light transmitting substrate 11 was prepared as the comparative example 1.

TABLE 4 shows the front brightness and the external quantum efficiency with regard to each of the organic EL elements 10 of the examples 1 to 3 and the comparative example 1. These results were calculated based on the light emitting properties measured by use of the constant current power source supplying the constant current of 2 mA/cm$^2$ to the organic EL element 10 and the spectroscope (the multichannel analyzer, trade name of "PMA-11", manufactured by HAMAMATSU photonics corporation). Besides, each of calculated values of the front brightness and the external quantum efficiency shown in TABLE 4 is normalized such that the normalized value of the organic EL element (the organic EL element 10 of the comparative example 1) in which the substrate material of the first light transmitting substrate 11 is non-alkali glass is 1.

TABLE 4

| material of substrate | front brightness | external quantum efficiency |
|---|---|---|
| non-alkali glass | 1 | 1 |
| PET | 1.5 | 1.3 |
| PEN | 1.6 | 1.4 |
| PES | 1.5 | 1.3 |

TABLE 4 shows the organic EL elements 10 of the examples 1 to 3 have the improved front brightness and the enhanced external quantum efficiency relative to the organic EL element 10 of the comparative example 1. Thus, it was confirmed that using, as the material of the first transmitting substrate 1, one of PET, PEN, and PES each having a refractive index higher than that of non-alkali glass improves the light extraction efficiency.

(Second Embodiment)

Figure 14:
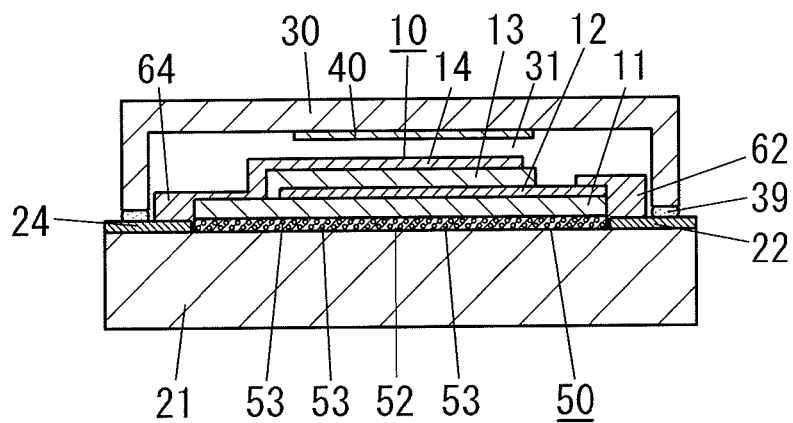
FIG. 14 is a schematic cross sectional view illustrating the surface light emitting device of the second embodiment.

As shown in FIG. 14, the surface light emitting device of the present embodiment has a basic configuration common to the first embodiment, but is mainly different from the first embodiment in the structure of the light extraction structure part 51. The components common to the present embodiment and the first embodiment are designated by the same reference numerals and explanations thereof are deemed unnecessary.

The light extraction structure part 50 includes a matrix 52 and multiple light-diffusing members 53. The matrix 52 is transparent material having a refractive index (in the instance shown in FIG. 14, a refractive index equal to or higher than that of the first light transmitting substrate 11) not less than a refractive index (in the instance shown in FIG. 14, the refractive index of the first light transmitting substrate 11) of a part of the organic EL element 10 being in contact with the light extraction structure part 50. The multiple light-diffusing members 53 are dispersed in the matrix 52, and have a refractive index different from that of the matrix 52. In other words, in the surface light emitting device of the present embodiment, the light extraction structure part 50 includes the matrix 52 placed in contact with the first face of the organic EL element 10, and the light-diffusing members 53 dispersed in the matrix 52. The matrix 52 has the refractive index not less than that of the part (in the instance shown in FIG. 14, the first light transmitting substrate 11) of the organic EL element 10 being in contact with the matrix 52. The light-diffusing members 53 have a refractive index different from that of the matrix 52. It is sufficient that the light-diffusing member 53 is made of a different material from the matrix 52. In consideration of improving the light diffusion properties, the light-diffusing member 53 may be designed to have a large difference between refractive indices of the light-diffusing member 53 and the matrix 52, and also may be designed not to absorb light. For example, the light-diffusing members 53 are fine particles. The light-diffusing members 53 may be fine particles or holes. In brief, the light extraction structure part 50 may include the matrix 52 placed in contact with the first face of the organic EL element 10, and holes (light-diffusing members 53) formed inside the matrix 52. With this arrangement, the matrix 52 preferably has the refractive index which is equal to or higher than the refractive index of the part (in the instance shown in FIG. 14, the first light transmitting substrate 11) of the organic EL element 10 being in contact with the matrix 52 and is different from the refractive index of a medium of the hole (light-diffusing member 53). For example, the light extraction structure part 50 satisfying such a condition may have a structure in which the light-diffusing members 53 selected from nano-metal particles and titanium oxide ($TiO_2$) particles are dispersed into the matrix 52 made of resin, or a structure in which the light-diffusing members 53 defined by holes are dispersed into the matrix 52 made of resin.

When the matrix 52 is made of thermal curing resin or ultraviolet curing resin, the matrix 52 can be used as adhesive for bonding the first light transmitting substrate 11 of the organic EL element 10 to the second light transmitting substrate 21. Of course, the matrix 52 is not necessarily designed as adhesive, and the first light transmitting substrate 11 may be bonded to the second light transmitting substrate 21 with adhesive different from the matrix 52.

Preferably, the light-diffusion member 53 has an average size in the range of 0.5 μm to 50 μm and more preferably in the range of 0.7 μm to 10 μm. When the average size of the light-diffusion member 53 is less than 0.5 μm, interaction (e.g., refraction and interference) between light and the light-diffusion member 53 does not occur, and then the direction of light is not changed. In contrast, when the average size of the light-diffusion member 53 is excessively large, total light transmittance of the light extraction structure part 50 may be decreased and thus the light extraction efficiency is likely to be lowered. Generally, a haze factor is used as an index indicative of a quantitative value of diffuseness. The haze factor is defined as a percentage of a diffusion light transmittance (diffuse transmittance) to a total light transmittance (total transmittance) of a sample. Normally, the haze factor is increased with a decrease in the total light transmittance. It is preferable that the haze factor and the total light transmittance are high. When the matrix 52 is made of resin (trade name "LPB-1101", refractive index n=1.71, manufactured by MITSUBISHI GAS CHEMICAL, inc.) which is one of ultraviolet curing resin with a relatively high refractive index and the light-diffusing members 53 constituted by $TiO_2$ particles with an average particle size of 2 μm are dispersed into the matrix 52 as fillers, the light extraction structure part 50 has a haze factor of about 90% and a total light transmittance in a range of about 80 to 90%.

In the present embodiment, the connection part 64 connecting the cathode 14 of the organic EL element 10 to the external connection electrode 24 is made of the same material as the cathode 14 and is formed at the same time as the cathode 14. In a similar fashion as the first embodiment, the connection part 64 may be formed independent from the cathode 14.

According to the above-explained surface light emitting device of the present embodiment, it is possible to reduce a loss due to total reflection of light which is emitted from the light emitting layer of the organic EL layer 13 and reaches the second light transmitting substrate 21, and therefore the light extraction efficiency can be improved. When the light-diffusing members 53 are constituted by holes, it is possible to easily increase the difference in refractive index between the matrix 52 and the light-diffusing member 53. Thus, the diffusion effect can be enhanced, and occurrence of light absorption can be suppressed. Consequently, the light extraction efficiency can be improved. When the light-diffusing members 53 are constituted by fine particles, the light extraction structure part 50 can be formed by means of interposing, between the organic EL element 10 and the second light transmitting substrate 21, the matrix 52 into which the fine particles defining the light-diffusing members 53 are dispersed. Consequently, it is possible to facilitate the fabrication of the light extraction structure part 50.

With regard to the surface light emitting device of the present embodiment, when the moth-eye structure 80 explained in the first embodiment is formed in/on the opposite surface of the second light transmitting substrate 21 from the organic EL element 10 by use of nano-imprint lithography, the front brightness and the external quantum efficiency are respectively increased by 4%. Alternatively, in the surface light emitting device of the present embodiment, the AR film explained in the first embodiment is formed in/on the opposite surface of the second light transmitting substrate 21 from the organic EL element 10.

(Third Embodiment)

Figure 15:
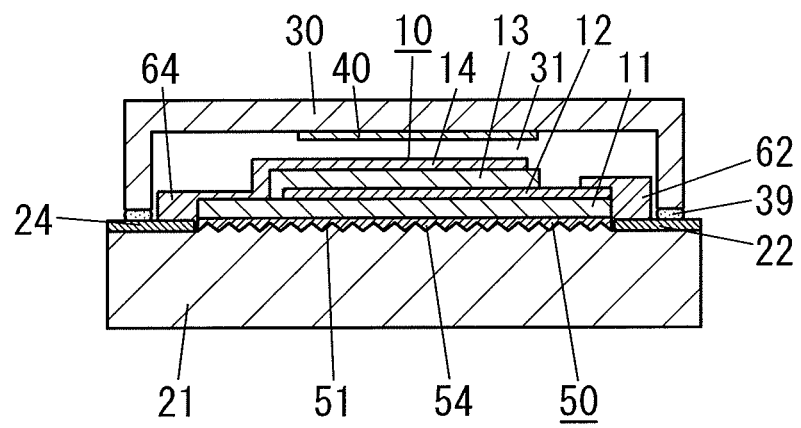
FIG. 15 is a schematic cross sectional view illustrating the surface light emitting device of the third embodiment.

As shown in FIG. 15, the surface light emitting device of the present embodiment has the basic configuration common to the first embodiment, but is mainly different from the first embodiment in that the recessed and protruded structure part 51 of the light extraction structure part 50 is provided to the side of the second light transmitting substrate 21 facing the organic EL element 10 and a unit 54 made of a light transmitting material having a refractive index not less than that of the first light transmitting substrate 11 is interposed between the recessed and protruded structure part 51 and the first light transmitting substrate 11. Besides, the components common to the present embodiment and the first embodiment are designated by the same reference numerals and explanations thereof are deemed unnecessary.

In the present embodiment, the second light transmitting substrate 21 is constituted by a glass substrate. The recessed and protruded structure part 51 is formed by means of subjecting the glass substrate constituting the second light transmitting substrate 21 to imprint lithography or a blasting treatment, for example. The use of the blasting treatment provides the frosted-glass-shaped recessed and protruded structure part 51.

It is assumed that the light emitting layer has a refractive index of 1.7 and the intermediates (e.g., the hole transport layer and the anode 12) between the light emitting layer and the first light transmitting substrate 11 has the same refractive index as the light emitting layer. When the first light transmitting substrate 11 is made of PET with a refractive index of 1.71, the light transmitting material of the transparent part 54 may be constituted by resin (trade name "LPB-1101", refractive index n=1.71, manufactured by MITSUBISHI GAS CHEMICAL, inc.) which is one of ultraviolet curing resin with a relatively high refractive index, or matching oil with a refractive index not less than 1.7, for example. When the first light transmitting substrate 11 is made of PEN with a refractive index of 1.75, matching oil with a refractive index not less than 1.75 may be used as the light transmitting material of the transparent part 54, for example.

As described in the above, the surface light emitting device of the present embodiment includes the organic EL element 10, the second light transmitting substrate (protection substrate) 21, the protection part 30, and the light extraction structure part 50. The organic EL element 10 has the first face (one face in its thickness direction; the lower surface in FIG. 15) and the second face (the other face in its thickness direction; the upper surface in FIG. 15) opposite to the first face. The organic EL element 10 is configured to emit light from the first face. The second light transmitting substrate 21 has transparency for light emitted from the organic EL element 10. The second light transmitting substrate 21 is placed facing the first face of the organic EL element 10. The second light transmitting substrate 21 has the primary surface (upper surface in FIG. 15) facing the first face of the organic EL element 10. The protection part 30 is placed facing the second face of the organic EL element 10. The protection part 30 is configured to constitute the housing in combination with the second light transmitting substrate 21, and the housing is configured to accommodate the organic EL element 10 so as to protect the organic EL element 10 from moisture. The light extraction structure part 50 is interposed between the first face of the organic EL element 10 and the second light transmitting substrate 21. The light extraction structure part 50 is configured to suppress reflection (total reflection) of light emitted from the organic EL element 10 on the primary surface of the second light transmitting substrate 21.

Further, in the surface light emitting device of the present embodiment, the organic EL element 10 includes the organic EL layer 13 containing the light-emitting layer configured to emit light, and the first light transmitting substrate (formation substrate) 11 having transparency for light emitted from the light-emitting layer. The light-emitting layer is formed over the first surface (upper surface in FIG. 15) of the first light transmitting substrate 11. The first face of the organic EL element 10 is defined by the second surface (lower surface in FIG. 15) of the first light transmitting substrate 11 opposite to the first surface thereof. The first light transmitting substrate 11 has the refractive index higher than that of the second light transmitting substrate 21.

Further, in the surface light emitting device of the present embodiment, the second light transmitting substrate 21 has a weatherproof property and a waterproof property higher than those of the first light transmitting substrate 11.

For example, the first light transmitting substrate 11 is a plastic substrate (e.g., PET, PEN, PES, and PC) and the second light transmitting substrate 21 is a glass substrate (e.g., a non-alkali glass substrate and a soda lime glass substrate).

Further, the surface light emitting device of the present embodiment includes the transparent part 54 having transparency for light emitted from the organic EL element 10 and a refractive index not less than that of the first light transmitting substrate 11. The light extraction structure part 50 is the recessed and protruded structure part 51 provided to the primary surface of the second light transmitting substrate 21. The transparent part 54 is interposed between the recessed and protruded structure part 51 and the first light transmitting substrate 11.

Further, in the surface light emitting device of the present embodiment, the recessed and protruded structure part 51 has the refractive index equal to or less than that of the second light transmitting substrate 21.

Further, in the surface light emitting device of the present embodiment, the recessed and protruded structure part 51 includes the periodic recessed and protruded structure. The recessed and protruded structure has the period P in the range of one fourth to ten times of the wavelength of light emitted from the organic EL element 10.

Accordingly, also in the surface light emitting device of the present embodiment, the reflection of light emitted from the light emitting layer can be suppressed by the existence of the light extraction structure part 50. The light extraction efficiency therefore can be improved. Further, the surface light emitting device of the present embodiment can suppress the Fresnel loss occurring in the side of the second light transmitting substrate 21 close to the organic EL element 10, in contrast to the instance where the space 70 exists between the second light transmitting substrate 21 and the organic EL element 10.

Further, in the surface light emitting device of the present embodiment, with providing the AR film or the moth-eye structure 80 (see FIG. 12) explained in the first embodiment to the opposite surface of the second light transmitting substrate 21 from the organic EL element 10, it is possible to improve the front brightness and the external quantum efficiency.

(Fourth Embodiment)

Figure 16:
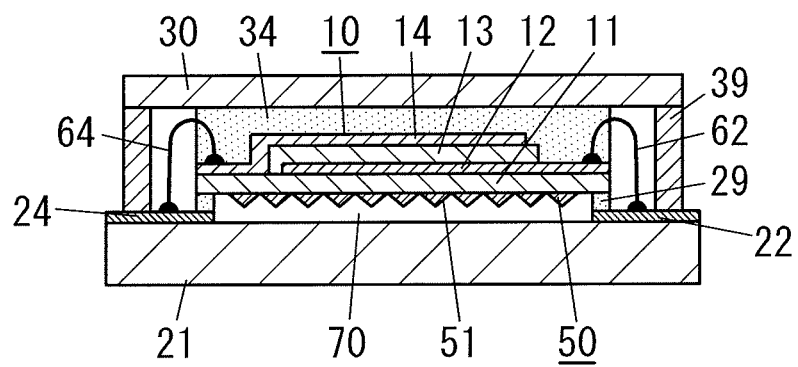
FIG. 16 is a schematic cross sectional view illustrating the surface light emitting device of the fourth embodiment.

As shown in FIG. 16, the surface light emitting device of the present embodiment has the basic configuration common to the first embodiment, but is mainly different from the first embodiment in that the protection part 30 is a glass substrate in the form of a flat plate and the bonding part 39 for bonding the protection part 30 to the second light transmitting substrate 21 is made of a fritted glass. Besides, the components common to the present embodiment and the first embodiment are designated by the same reference numerals and explanations thereof are deemed unnecessary.

Moreover, the surface light emitting device of the present embodiment includes a heat transfer part 34 provided to the second face of the organic EL element 10. The heat transfer part 34 is configured to transfer heat generated in the organic EL element 10 to the protection part 30. In brief, the surface light emitting device of the present embodiment includes the heat transfer part (heat dissipation part) 34. The heat transfer part 34 is interposed between the second face of the organic EL element 10 and the protection part 30 and is configured to transmit heat generated at the organic EL element 10 to the protection part 30. The heat transfer part 34 is formed over the first surface of the first light transmitting substrate 11 so as to cover exposed regions of the anode 12, the organic EL layer 13, and the cathode 14. For example, the heat transfer part 34 may be made of one selected from gelled silicone resin and heat-transfer grease which have thermal conductivity higher than that of inert gas. Alternatively, the heat transfer part 34 may be made of a liquid (e.g., silicone oil and paraffin oil) with thermal conductivity higher than that of inert gas.

The organic EL element 10 of the present embodiment has a planar layout as illustrated in FIG. 17 (a), and has a light emitting surface defined by an region of the second surface of the first light transmitting substrate 11 (see FIG. 16) overlapped with three of the anode 12, the organic EL layer 13 (see FIG. 16), and the cathode 14. As shown in FIG. 17 (a), in the organic EL element 10, the anode 12 and the cathode 14 are crossed each other with regard to a planar view of the organic EL element 10. The anode 12 is formed to extend over the entire length of the light transmitting substrate 11 in a direction (x axial direction of an x-y plane shown in the right side in FIG. 17 (a)) across the cathode 14. The cathode 14 is formed to extend over the entire length of the light transmitting substrate 11 in a direction (y axial direction of the x-y plane shown in the right side in FIG. 17 (a)) across the anode 12.

Further, as shown in FIG. 17 (b), the organic EL element 10 is obtained by being separated from a plastic substrate (plastic film) 110 providing the multiple first light transmitting substrates 11 on which the multiple organic EL elements 10 are formed. In the instance shown in FIG. 17 (b), the multiple organic EL elements 10 are arranged on the plastic substrate 110 providing the multiple first light transmitting substrate 11 in a matrix manner such that the anodes 12 of the adjacent organic EL elements 10 in the x axial direction are formed integrally and the cathodes 14 of the adjacent organic EL elements 10 in the y axial direction are formed integrally. With cutting, along a border (illustrated in FIG. 17 (b) as a dashed-dotted line) between the adjacent organic EL elements 10, the plastic substrate 10 on which the multiple organic EL elements 10 are formed, it is possible to increase in the number of materials obtained from the plastic substrate 110 having a enough size for forming the multiple organic EL elements 10 and the yield ration of the materials can be improved. Further, it is possible to increase in an area of the light emitting surface yet it is possible to ensure a region for forming electric connections to each of the anode 12 and the cathode 14 of the organic EL element 10. In addition, the area of an exposed region of the first surface of the first light transmitting substrate 11 can be decreased. For example, a disk blade can be used as means for cutting the plastic substrate 110 on which the multiple organic EL elements 10.

In the present embodiment, the connecting parts 62 and 64 connecting the anode 12 and the cathode 14 to the external connection electrodes 22 and 24 are bonding wires, respectively. Accordingly, leakage of gas via the connecting parts 62 and 64 can be suppressed.

According to the surface light emitting device of the present embodiment, the heat transfer part 34 is interposed between the organic EL element 10 and the protection part 30. Consequently, it is possible to dissipate heat generated in the organic EL element 10 via the protection part 30 efficiently. The organic EL element 10 therefore can have the prolonged lifetime and the improved light intensity.

Further, in the surface light emitting device of the present embodiment, the bonding part 39 for bonding the protection part 30 to the second light transmitting substrate 21 is made of a fritted glass. Thus, the leakage of gas via the bonding part 39 can be suppressed and the surface light emitting device can have the improved moisture resistance. Consequently, it is possible to improve the long-time reliability of the surface light emitting device. When the bonding part 39 is made of resin such as thermoset resin, a margin for bonding preferably has a width not less than 3 mm for ensuring the air tightness. In contrast, the surface light emitting device of the present embodiment includes the bonding part 39 made of a fritted glass. Thus, it is possible to reduce the width of the margin for bonding down to about 1 mm yet the air tightness is ensured. Consequently, it is possible to decrease the area of non-light-emitting part of the front surface of the surface light emitting device of the present embodiment.

Figure 18:
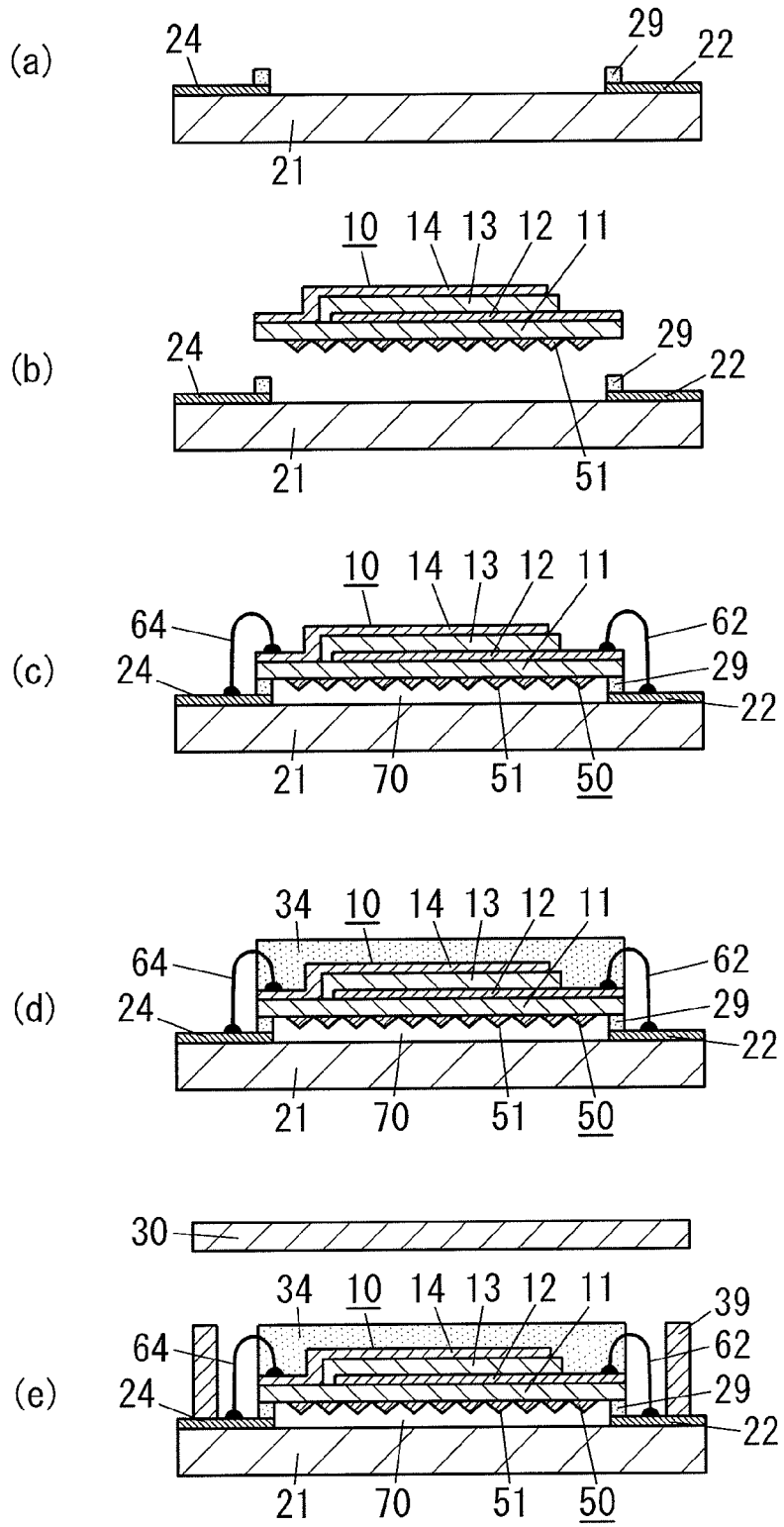
FIG. 18 is an explanatory view illustrating a process of fabricating the surface light emitting device of the fourth embodiment.

The following explanation referring to FIG. 18 (*a*) to (*e*) is made to a process of fabricating the surface light emitting device of the present embodiment.

First, the bonding part 29 is arranged on the primary surface of the second light transmitting substrate 21 having its primary surface on which the external connection electrodes 22 and 24 are formed. Thereby, the structure illustrated in FIG. 18 (*a*) is obtained. For example, the bonding part 29 is made of an adhesive film, thermoset resin, ultraviolet curable resin, or adhesive (e.g., epoxy resin, acrylic resin, and silicone resin).

Subsequently, as shown in FIG. 18 (*b*), the organic EL element 10 is arranged facing the primary surface of the second light transmitting substrate 21 and position adjustment of the organic EL element 10 and the second light transmitting substrate 21 is performed. The first light transmitting substrate 11 of the organic EL element 10 is bonded to the primary surface of the second light transmitting substrate 21 via the bonding part 29, and then the anode 12 and the cathode 14 are electrically connected to the external connection electrodes 22 and 24 via the connecting parts 62 and 64 constituted by bonding wires, respectively.

Thereafter, the heat transfer part 34 is provided to the second face of the organic EL element 10. Thereby, the structure illustrated in FIG. 18 (*d*) is obtained. For example, the heat transfer part 34 is made of gelled silicone resin.

After the heat transfer part 34 is formed, the bonding part 39 constituted by a fritted glass is arranged on the primary surface of the second light transmitting substrate 21. Subsequently, protection part 30 is arranged facing the primary surface of the second light transmitting substrate 21 and position adjustment of the protection part 30 and the second light transmitting substrate 21 is conducted (see FIG. 18 (*e*)). After that, the protection part 30 is moved to be in contact with the bonding part 39, and then the bonding part 39 is heated by use of laser, thereby being connected to the second light transmitting substrate 21 and the protection part 30. In order to facilitate heating of the fritted glass by laser, the fritted glass may contain appropriate impurities. Besides, the heating may be conducted by infrared rather than laser, for example. When the heat transfer part 34 is constituted by liquid, a liquid inlet and an air outlet may be preliminarily formed in the protection part 30. After the bonding part 39 is bonded to the second light transmitting substrate 21 and the protection part 30, the heat transfer part 34 is formed by means of supplying liquid via the liquid inlet and then the liquid inlet and the air outlet are closed up by use of adhesive.

The aforementioned bonding part 39 is used as a spacer between the second light transmitting substrate 21 and the protection part 30. It is not limited that bonding part 39 is made of only a fritted glass. For example, the bonding part 39 may be constituted by frame member made of alloy and fritted glass parts formed on opposite sides of the frame member respectively facing the second light transmitting substrate 21 and the protection part 30. In this arrangement, the alloy as a material of the frame member is preferably kovar having a thermal expansion coefficient similar to thermal expansion coefficients of the respective second light transmitting substrate 21 and the protection part 30. The alloy is not limited to kovar but may be 42 alloy, for example. Kovar is an alloy of iron, nickel and cobalt, and is one of metal having a relatively low thermal expansion coefficient at ordinary temperature. Kovar has a thermal expansion coefficient similar to that of non-alkali glass, blue soda glass, and borosilicate glass, for example. According to an example of component ratio of kovar, koval contains 29% by weight nickel, 17% by weight cobalt, 0.2% by weight silicon, 0.3% by weight manganese, 53.5% by weight iron. The component ratio of kovar is not limited to a particular instance. It is sufficient that kovar is designed to have a thermal expansion coefficient substantially identical to thermal expansion coefficients of the respective second light transmitting substrate 21 and the protection part 30. Preferably, a fritted glass is selected to have a thermal expansion coefficient substantially identical to a thermal expansion coefficient of the alloy. When the alloy is kovar, kovar glass is preferably adopted as the fritted glass. In the process of the fabrication of the bonding part 39, for example, fritted glass is applied to opposite surfaces of a plate member made of alloy (e.g., kovar) in a thickness direction in a predetermined pattern (rectangular frame pattern, in this embodiment). After the applied fritted glass is dried and baked, the fritted glass is subjected to punching so as to form the bonding part 39.

(Fifth Embodiment)

Figure 19:
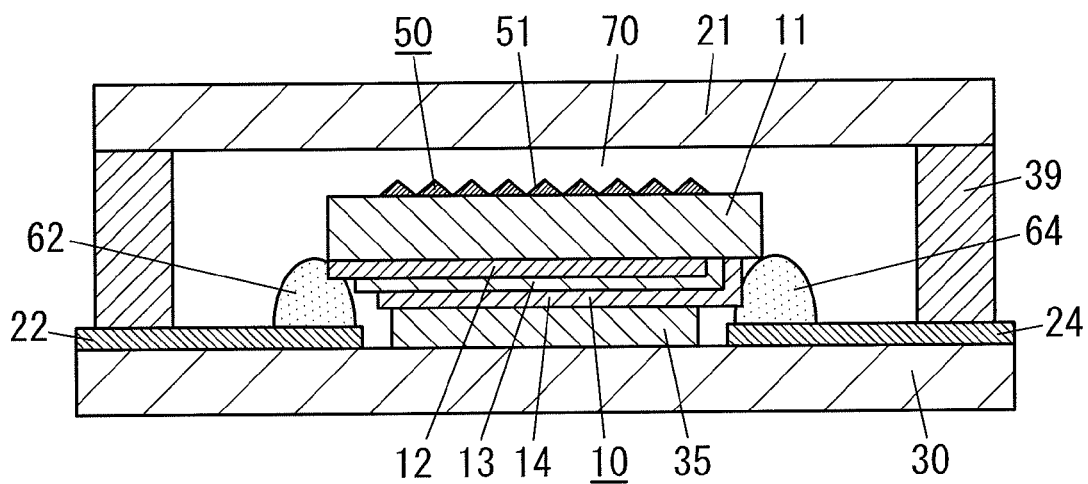
FIG. 19 is a schematic cross sectional view illustrating the surface light emitting device of the fifth embodiment.

As shown in FIG. 19, the surface light emitting device of the present embodiment has the basic configuration common to the first embodiment, but is mainly different from the first embodiment in that the protection part 30 is a glass substrate in the form of a flat plate and a heat dissipation member 35 is interposed between the organic EL element 10 and the protection part 30 (between the second face of the organic EL element 10 and the protection part 30). The heat dissipation member 35 is configured to transmit heat generated at the organic EL element 10 to the protection part 30. Besides, the components common to the present embodiment and the first embodiment are designated by the same reference numerals and explanations thereof are deemed unnecessary.

The heat dissipation member 35 may be made of a heat dissipation sheet or thermal conductive grease. For example, the heat dissipation sheet is a silicone film for heat dissipation (e.g., gelled sarcon (registered trademark) sheet) and a carbon film The surface light emitting device of the present embodiment has the external connection electrodes 22 and 24 formed on a first surface of the protection part 30 facing the second light transmitting substrate 21. The external connection electrodes 22 and 24 are electrically connected to the anode 12 and the cathode 14 of the organic EL element 10, respectively. The organic EL element 10 is fixed to only the protection part 30. In brief, the organic EL element 10 is fixed to the protection part 30 via the heat dissipation member 35 so as not to be in contact with the second light transmitting substrate 21. In the organic EL element 10, the cathode 14 is fixed to the protection part 30 via the heat dissipation member 35. The anode 12 and the cathode 14 are fixed to the external connection electrodes 22 and 24 of the protection part 30 via the connecting parts 62 and 64 made of electrically conductive paste (e.g., silver paste), respectively. The anode 12 and the cathode 14 are electrically connected to the respective external connection electrodes 22 and 24.

That is, the surface light emitting device of the present embodiment includes the heat dissipation member 35 interposed between the second face of the organic EL element 10 and the protection part 30 and configured to transmit heat generated at the organic EL element 10 to the protection part 30. The organic EL element 10 is fixed to the protection part 30 so as not to be in contact with the second light transmitting substrate 21.

Figure 20:
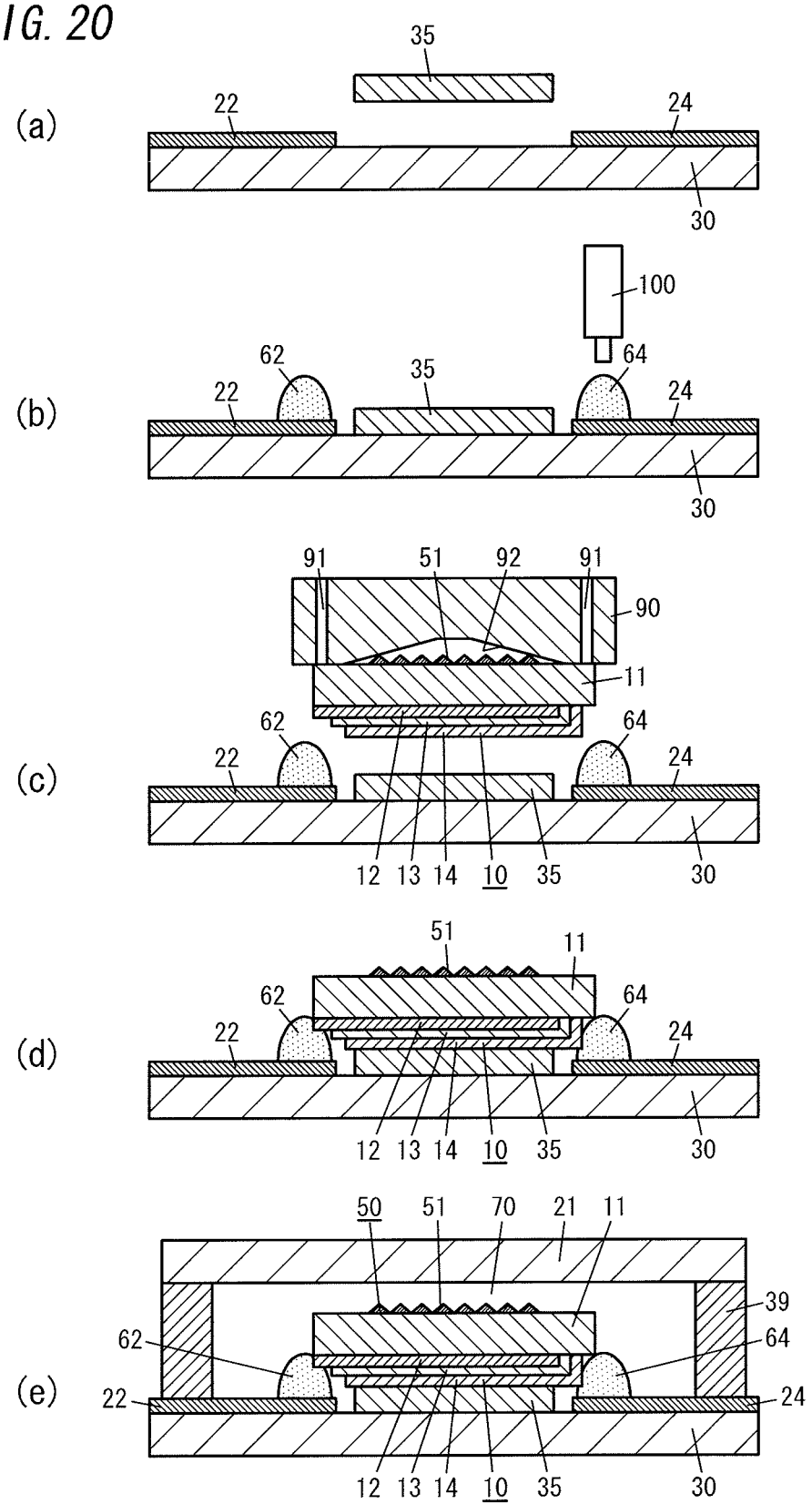
FIG. 20 is an explanatory view illustrating a process of fabricating the surface light emitting device of the fifth embodiment.

The following explanation referring to FIG. 20 (*a*) to (*e*) is made to a process of fabricating the surface light emitting device of the present embodiment.

First, as shown in FIG. 20 (*a*), the heat dissipation member 35 is arranged facing the first surface of the protection part 30 having its first surface on which the external connection electrodes 22 and 24 are formed, and position adjustment of the heat dissipation member 35 and the protection part 30 is performed. The protection part 30 is made of a glass substrate. The heat dissipation member 35 is a gelled heat dissipation sheet (e.g., a sarcon (registered trademark) sheet) having electrical insulation and thermal conductivity. Besides, the external connection electrodes 22 and 24 may be formed by use of plating, sputtering, or printing, for example. When the external connection electrodes 22 and 24 are formed by means of plating, PdNiAu may be adopted as a material of the external connection electrodes 22 and 24, for example. When the external connection electrodes 22 and 24 are formed by means of sputtering, the material of the external connection electrodes 22 and 24 may be selected from MoAl, CrAg, and AgPdCu (: APC). When the external connection electrodes 22 and 24 are formed by means of printing, silver may be adopted as the material of the each of the external connection electrodes 22 and 24. Besides, when the external connection electrodes 22 and 24 are made of silver and are formed by means of printing, silver paste (e.g., silver paste, trade name "QMI516E", manufactured by Henkel) may be suitable for the material of the external connection electrodes 22 and 24.

Thereafter, as shown in FIG. 20 (*b*), the heat dissipation member 35 is fixed to the first surface of the protection part 35, and then conductive paste (e.g., silver paste) forming the connecting parts 62 and 64 are applied by use of a dispenser 100.

Subsequently, as shown in FIG. 20 (*c*), the first light transmitting substrate 11 of the organic EL element 10 is adsorbed and held at the second surface by an adsorption collet 90. Further, organic EL element 10 is arranged facing the first surface of the protection part 30 and position adjustment of the organic EL element 10 and the protection part 30 is conducted. In the present embodiment, in the process of fabricating the organic EL element 10 of the present embodiment, the cathode 14 made of such as aluminum is deposited by use of a mask. In this deposition process, two alignment marks (not shown) are formed on opposite ends of a diagonal line of the first surface of the first light transmitting substrate 11 at the same time as the cathode 14. Accordingly, a mounting device is available. The mounting device includes an imaging device, an image processing device, and a control device. The imaging device is configured to image the organic EL element 10 from the second surface side of the first light transmitting substrate 11. The imaging device is, for example, a CCD camera. The image processing device is configured to process the image obtained from the imaging device so as to recognize the alignment mark. The control device is configured to control, based on the recognition result, a robot arm provided at its end with the adsorption collet 90. The control device is a computer, for example. An appropriate program for controlling the robot arm may be installed in such a computer to constitute the control device. Besides, the adsorption collet 90 is provided with an adsorption hole (vacuum suction hole) 91 for adsorbing the organic EL element 10. In order to suppress first light transmitting substrate 11 and/or the recessed and protruded structure part 51 from being scratched by the adsorption collet 90, the adsorption collet 90 is preferably made of resin (e.g., wholly aromatic polyimide resin, polyamide resin, imide resin). Further, the adsorption collet 80 is provided in an adsorption surface (lower surface in FIG. 20 (*c*)) with a recess 92 for accommodating the recessed and protruded structure part 51. Since a difference in height between the protruded part and the recessed part of the recessed and protruded structure part 51 is relatively small, the recess 92 is not always necessary. The adsorption collet 90 may be configured to adsorb the entire second surface of the first light transmitting substrate 11.

Subsequently, the cathode 14 of the organic EL element 10 is arranged in contact with the heat dissipation member 35. Further, the anode 12 and the cathode 14 are arranged in contact with the connecting parts 62 and 64, respectively. After that, the conductive paste is cured, and then baked in vacuum atmosphere. Thereby, the structure illustrated in FIG. 20 (*d*) is obtained.

Thereafter, the bonding part 39 constituted by fritted glass is arranged on the first surface of the protection part 30. Subsequently the second light transmitting substrate 21 is arranged facing the first surface of the protection part 30 and position adjustment of the second light transmitting substrate 21 and the protection part 30 is conducted. After that, the second light transmitting substrate 21 is contacted with the bonding part 39, and then the bonding part 39 is heated by use of laser, thereby being bonded to the protection part 30 and the second light transmitting substrate 21. As a result, the structure illustrated in FIG. 20 (*e*) is obtained. Besides, in order to facilitate heating of the fritted glass by laser, the fritted glass may contain appropriate impurities. Alternatively, the heating may be conducted by infrared rather than laser, for example.

According to the aforementioned surface light emitting device of the present embodiment, it is possible to successfully form the space 70 even if the surface light emitting device is devoid of the bonding part 29 and the recessed part 21*a* of the second light transmitting substrate 21 explained in the first embodiment.

In the surface light emitting device of the present embodiment, the bonding part 29 (see FIG. 1 (*a*)) is likely to be visible from the front surface. Therefore, the surface light emitting device of the present embodiment may have a poor visual appearance with regard to its front view. Further, voids may exist in the interface between the bonding part 29 and the first light transmitting substrate 11 and/or the interface between the bonding part 29 and the second light transmitting substrate 21.

In contrast, according to the surface light emitting device of the present embodiment, it is unnecessary to interpose the bonding part 29 (see FIGS. 1 (*a*) and (*c*)) explained in the first embodiment between the first light transmitting substrate 11 and the second light transmitting substrate 21. Thus, the surface light emitting device of the present embodiment has an improved appearance with regard to its front view. Further, it is possible to facilitate appearance inspection in the fabrication process because there is no need to worry about existence of voids. Moreover, according to the surface light emitting substrate of the present embodiment, with adsorbing the entire second surface of the first light transmitting substrate 11 by the adsorption collet 90 in the fabrication process as mentioned in the above, it is possible to suppress warping of the first light transmitting substrate 11.

Further, according to the surface light emitting device of the present embodiment, the organic EL element can be handled with the adsorption collet 90 by means of adsorbing the second surface of the first light transmitting substrate 11 in the fabrication process. It is therefore possible to decrease the probability that the cathode 14 is removed or scratched, and consequently the fabrication yield can be improved.

Moreover, with regard to the surface light emitting device of the present embodiment, the AR film explained in the first embodiment may be formed on at least one of the opposite surfaces of the second light transmitting 21 in the thickness direction, and alternatively the moth-eye structure 80 (see FIG. 12) may be formed in/on to at least one of the opposite surfaces of the second light transmitting 21 in the thickness direction. In each instance, it is possible to improve the front brightness and the external quantum efficiency.

(Sixth Embodiment)

Figure 21:
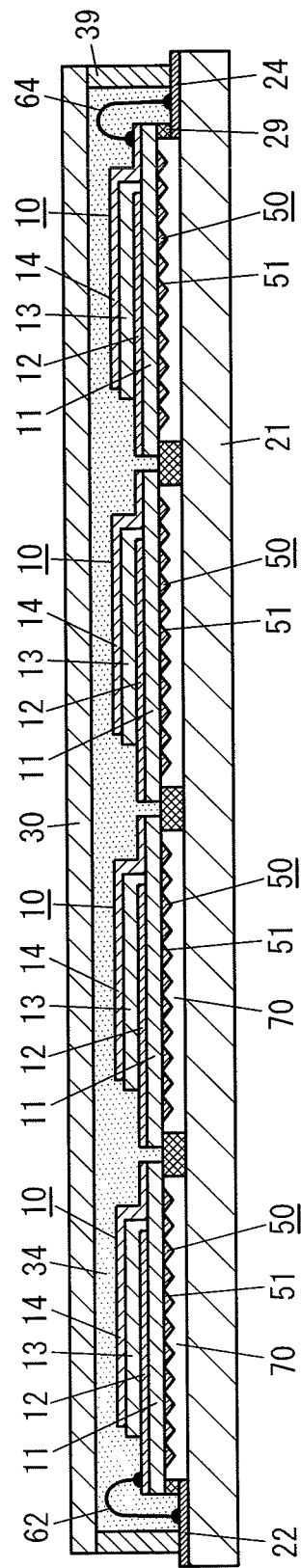
FIG. 21 is a schematic cross sectional view illustrating the surface light emitting device of the sixth embodiment.

As shown in FIG. 21, the surface light emitting device of the present embodiment has the basic configuration similar to the fourth embodiment, but is mainly different from the fourth embodiment in that a plurality of the organic EL elements 10 are housed in a space surrounded by the second light transmitting substrate 21 and the protection part 30 and are arranged in a plane parallel to the second light transmitting substrate 21. Besides, the components common to the present embodiment and the fourth embodiment are designated by the same reference numerals and explanations thereof are deemed unnecessary.

In brief, the surface light emitting device of the present embodiment includes the plurality of the organic EL elements 10, and the plurality of the organic EL elements 10 are arranged in the plane parallel to the primary surface of the second light transmitting substrate 21.

With regard to the organic EL element 10 including the anode 12 constituted by a transparent conducting film, an increase in the area of the light emitting surface may cause an increase in a voltage given to the organic EL element 13 between the anode 12 and the cathode 14 due to an increase in a potential gradient of the anode 12 because the anode 12 has a sheet resistance greater than that of the cathode 14 made of a metal film. In addition, the increase in the area of the light emitting surface may cause an increase in unevenness of brightness, a decrease in the efficiency, and a decrease in the lifetime. Further, such an organic EL element 10 may have high risk of short-circuiting between the anode 12 and the cathode 14. Moreover, in such an organic EL element 10, an increase of the area of the light emitting surface causes a decrease in uniformity of each of the anode 12, the organic EL layer 13, the cathode 14, and the like and also causes a decrease in usage efficiency.

In contrast, the surface light emitting device of the present embodiment has the plurality of the organic EL elements 10 arranged side by side. Even when the surface light emitting device including the multiple organic EL elements 10 has the area of the light emitting surface of the organic EL element 10 smaller than that of the surface light emitting device including the single organic EL element 10, the former surface light emitting device can have the area of the total light emitting surface not less than that of latter surface light emitting device. Consequently, unevenness of brightness can be suppressed, and it is possible to improve the efficiency and prolong the lifetime.

Figure 22:
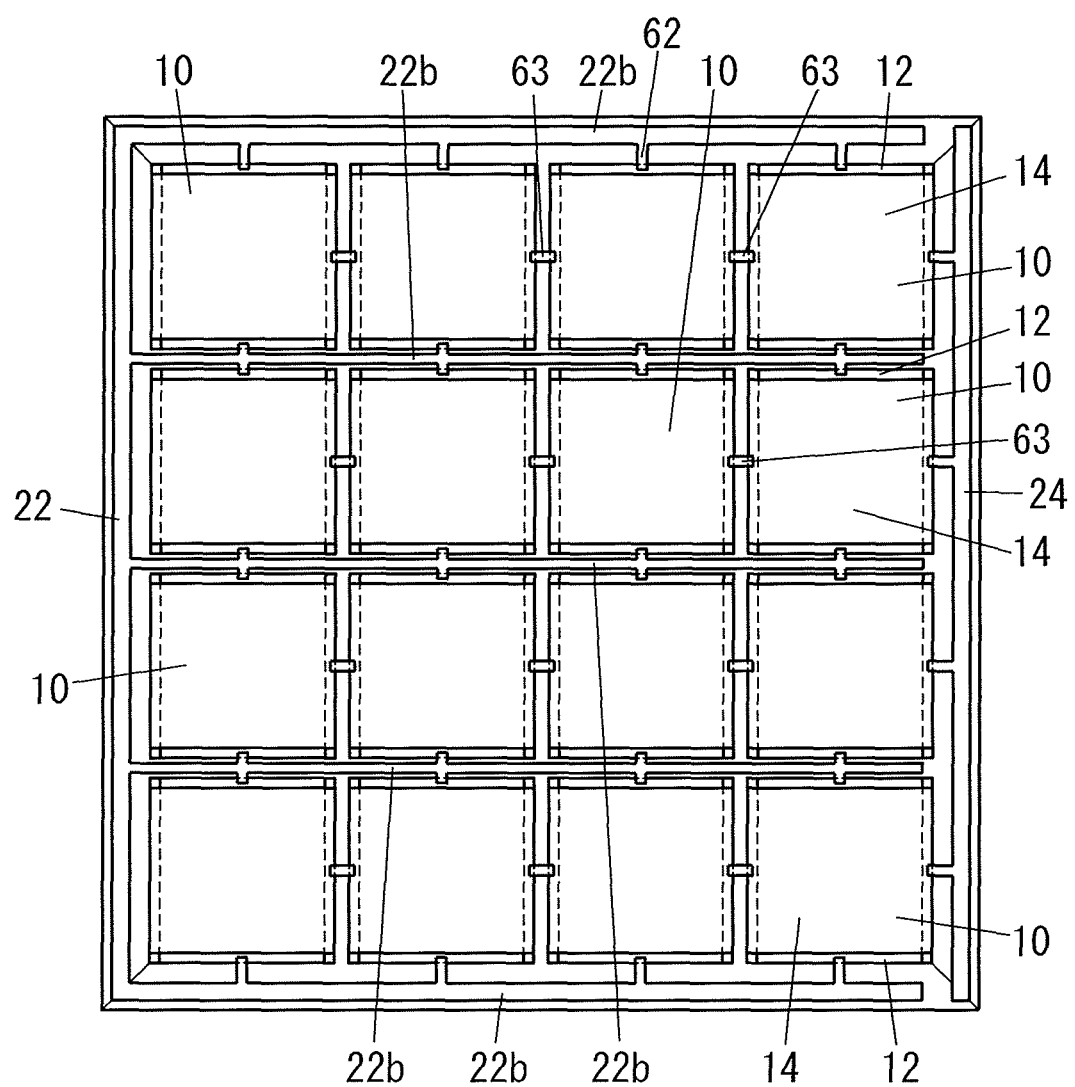
FIG. 22 is a schematic planar view illustrating a primary part of the surface light emitting device of the sixth embodiment.

For example, the surface light emitting device may include the sixteen organic EL elements 10 arranged in a 4 by 4 matrix manner as shown in FIG. 22. Further, in this surface light emitting device, the external connection electrode 22 is formed into a comb-like shape. The plurality (four, in the illustrated instance) of the organic EL elements 10 are interposed between adjacent blades 22b of the comb-shaped external connection electrode 22 and are arranged in line along a lengthwise direction of the blade 22b of the external connection electrode 22. The blades 22b are connected to the respective anodes 12 of the organic EL elements 10 via the respective connecting parts 62. Such a surface light emitting device can suppress current crowding in the organic EL element 10. Further, according to this surface light emitting device, after the fabrication of the multiple organic EL elements 10 with the decreased area of the light emitting surface, only the good organic EL can be selected from the resultant multiple organic EL elements 10. Thus, it is possible to decrease the production cost.

Figure 23:
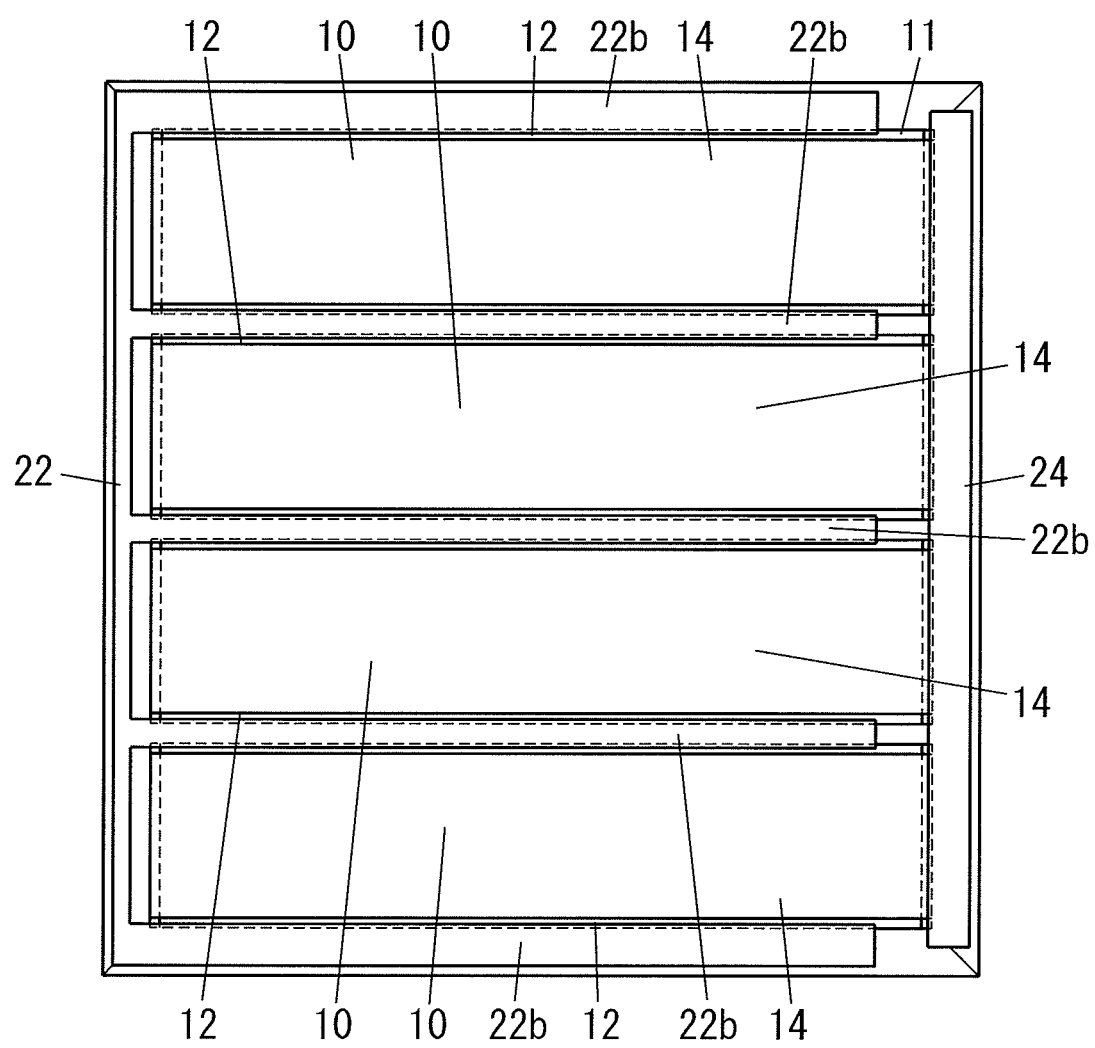
FIG. 23 is a schematic planar view illustrating a primary part of another configuration of the surface light emitting device of the sixth embodiment.

The configuration of the surface light emitting device is not limited to the configuration illustrated in FIG. 22, but may be the configuration illustrated in FIG. 23. With regard to the configuration shown in FIG. 23, the opposite ends of the anode 12 are exposed along the lengthwise direction of the strip-shaped light transmitting substrate 11, and the anode 12 is connected at its substantially entire opposite ends along the lengthwise direction of the anode 12 to the respective blades 22b.

Besides, the number of the organic EL elements 10 of the surface light emitting device is not limited to a particular instance. For example, the surface light emitting device may include the four organic EL elements 10 arranged in a 2 by 2 matrix manner.

The following explanation referring to FIG. 24 (a) to (e) is made to a process of fabricating this surface light emitting device.

First, as shown in FIG. 24 (a), the multiple organic EL elements 10 are formed on the plastic substrate 110 having a size enough to provide the multiple organic EL elements 10.

Thereafter, as shown in FIG. 24 (b), the plastic substrate 110 is cut by use of the disk blade 12. Consequently, the plurality of the separated organic EL elements 10 is obtained.

Subsequently, as shown in FIG. 24 (c), the second light transmitting substrate 21 having the primary surface on which the external connection electrodes 22 and 24 are formed is prepared.

Next, as shown in FIG. 24 (d), each organic EL element 10 is mounted on the primary surface of the second light transmitting substrate 21. Besides, in the process of mounting the organic EL element 10, the organic EL element 10 is bonded to the primary surface of the second light transmitting substrate 21 at the first light transmitting substrate 11 by use of the bonding parts (not shown).

After that, as shown in FIG. 24 (e), in order to enable power supply to the multiple organic EL elements 10 via the external connection electrodes 22 and 24, the electrical connection is made by use of the connecting parts 62, 63, and 64 constituted by bonding wires. Besides, the connecting parts 62, 63, and 64 are not limited to bonding wires, but may be electrically conductive paste and an electrically conductive tape, for example.

Subsequently, the heat transfer parts 34 made of gelled silicone resin are provided to the respective second faces of the organic EL elements 10. Thereby, the structure illustrated in FIG. 24 (f) is obtained.

After the provision of the heat transfer parts 34, as shown in FIG. 24 (g), the bonding part 39 made of fritted glass is positioned on the primary surface of the second light transmitting substrate 21. Next, the protection part 30 is arranged facing the primary surface of the second light transmitting substrate 21 and position adjustment of the protection part 30 and the second light transmitting substrate 21 is conducted.

Subsequently, the protection part 30 is contacted with the bonding part 39. After that the bonding part 39 is heated by use of laser, thereby being bonded to the second light transmitting substrate 21 and the protection part 30. In order to facilitate heating of the fritted glass by laser, the fritted glass may contain appropriate impurities. Besides, the heating may be conducted by infrared rather than laser, for example. When the heat transfer part 34 is constituted by liquid, a liquid inlet and an air outlet may be preliminarily formed in the protection part 30. After the bonding part 39 is bonded to the second light transmitting substrate 21 and the protection part 30, the heat transfer part 34 is formed by means of supplying liquid via the liquid inlet and then the liquid inlet and the air outlet are closed up by use of adhesive.

Moreover, with regard to the surface light emitting device of the present embodiment, the AR film explained in the first embodiment may be formed on at least one of the opposite surfaces of the second light transmitting 21 in the thickness direction, and alternatively the moth-eye structure 80 (see FIG. 12) may be formed in/on to at least one of the opposite surfaces of the second light transmitting 21 in the thickness direction. In each instance, it is possible to improve the front brightness and the external quantum efficiency.

(Seventh Embodiment)

Figure 25:
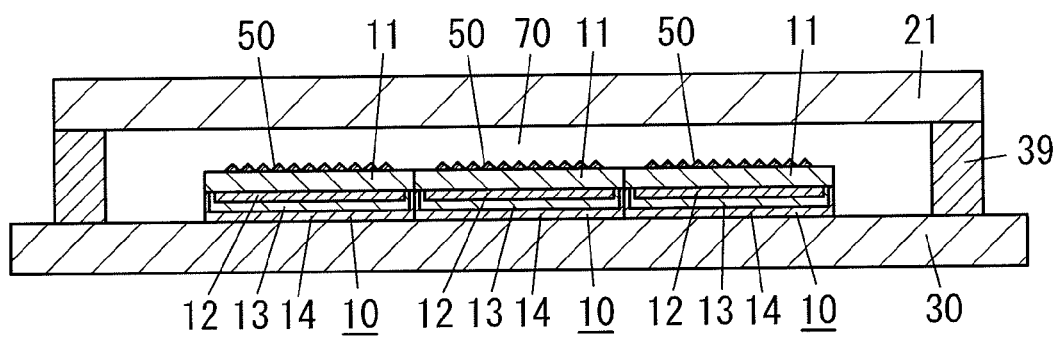
FIG. 25 is a schematic cross sectional view illustrating the surface light emitting device of the seventh embodiment.

As shown in FIG. 25, the surface light emitting device of the present embodiment has the basic configuration similar to the fifth embodiment, but is mainly different from the fifth embodiment in that a plurality of the organic EL elements 10 are fixed to the protection part 30. Besides, the components common to the present embodiment and the first embodiment are designated by the same reference numerals and explanations thereof are deemed unnecessary.

As apparent from the planar view illustrated in FIG. 26 (*c*1) and the cross sectional view illustrated in FIG. 26 (*c*2), the organic EL element 10 has the first light transmitting substrate 11 formed into a rectangular shape. The anode 12 has parts exposed at opposite ends of the first light transmitting substrate 11 in the width direction thereof at opposite ends of the first light transmitting substrate 11 in the lengthwise direction thereof. The cathode 14 has a part positioned at a center of the first light transmitting substrate 11 in the width direction thereof. Further, the first light transmitting substrate 11 has a part exposed between the anode 12 and the cathode 14 in the width direction of the first light transmitting substrate 11. FIG. 26 (*a*1) and FIG. 26 (*a*2) show the planar view and the cross sectional view of the structure in which the anode 12 is formed on the first surface of the first light transmitting substrate 11, respectively. FIG. 26 (*b*1) and FIG. 26 (*b*2) show the planar view and the cross sectional view of the structure in which the anode 12 and the organic EL layer 13 are formed on the first surface of the first light transmitting substrate 11, respectively.

Figure 27:
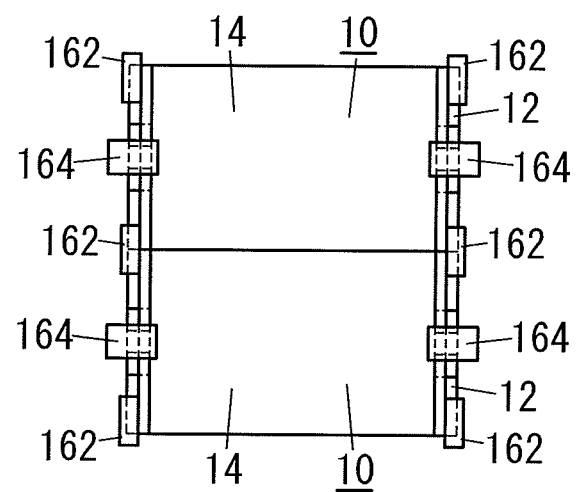
FIG. 27 is an explanatory view illustrating a primary part of the surface light emitting device of the seventh embodiment.

As shown in FIG. 27, in the present embodiment, double-faced electrically conductive tape strips 162 and 164 are bonded to the anode 12 and the cathode 14, respectively. The anode 12 and the cathode 14 are fixed to the protection part 30 by use of these double-faced electrically conductive tape strips 162 and 164. Besides, each of the double-faced electrically conductive tape strips 162 and 164 has electric conductivity in a thickness direction. For example, the double-faced electrically conductive tape strips 162 and 164 can be made of electrically conductive baseless double-faced tape 7025 (manufactured by TERAOKA SEISAKUSHO co., ltd.).

Accordingly, the present embodiment enables that the organic EL element 10 is fixed and electrically connected to the protection part 30 without using electrically conductive paste. Consequently, it is possible to perform a process of mounting the organic EL element 10 at a lowered temperature.

Moreover, with regard to the surface light emitting device of the present embodiment, the AR film explained in the first embodiment may be formed on at least one of the opposite surfaces of the second light transmitting 21 in the thickness direction, and alternatively the moth-eye structure 80 (see FIG. 12) may be formed in/on to at least one of the opposite surfaces of the second light transmitting 21 in the thickness direction. In each instance, it is possible to improve the front brightness and the external quantum efficiency.

(Eighth Embodiment)

As shown in FIGS. 28 (*a*) and (*b*), the surface light emitting device of the present embodiment has the basic configuration similar to the seventh embodiment, but is mainly different from the seventh embodiment in that the adjacent organic EL elements 10 are arranged so as to be partially overlapped with each other and the anodes 12 of the respective adjacent organic EL elements 10 are electrically connected to each other via the double-faced electrically conductive tape strip 162 and the cathodes 14 of the respective adjacent organic EL elements 10 are electrically connected to each other via the double-faced electrically conductive tape strip 164. Besides, the components common to the present embodiment and the seventh embodiment are designated by the same reference numerals and explanations thereof are deemed unnecessary.

Accordingly, the surface light emitting device of the present embodiment can have the reduced area of non-light emitting part existing between the adjacent organic EL elements 10, relative to the seventh embodiment.

Moreover, with regard to the surface light emitting device of the present embodiment, the AR film explained in the first embodiment may be formed on at least one of the opposite surfaces of the second light transmitting 21 in the thickness direction, and alternatively the moth-eye structure 80 (see FIG. 12) may be formed in/on to at least one of the opposite surfaces of the second light transmitting 21 in the thickness direction. In each instance, it is possible to improve the front brightness and the external quantum efficiency.

(Ninth Embodiment)

As shown in FIGS. 29 (*a*) and (*b*), the surface light emitting device of the present embodiment has the basic configuration similar to the first embodiment, but is mainly different from the first embodiment in that the surface light emitting device of the present embodiment includes a plurality (four in the illustrated instance) of the organic EL elements 10 and the plurality of the organic EL elements 10 shares the single first light transmitting substrate 11. Besides, the components common to the present embodiment and the first embodiment are designated by the same reference numerals and explanations thereof are deemed unnecessary.

According to the present embodiment, the four organic EL elements 10 are arranged in a 2 by 2 matrix manner, and are connected in series. For example, in the first surface of the first light transmitting substrate 11, the cathode 14 of one of the adjacent organic EL elements 10 is electrically connected to the anode 12 of the other of the adjacent organic EL elements 10 by use of an electrically conductive layer extending from the cathode 14 of one of the adjacent organic EL elements 10 to the anode 12 of the other of the adjacent organic EL elements 10. Consequently, according to the surface light emitting device of the present embodiment, it is possible to increase the area of the light emitting part and to decrease the area of the non-light emitting part existing between the adjacent organic EL elements 10. Further, unevenness of brightness can be suppressed, and it is possible to suppress decreases in the efficiency and the lifetime which are caused by heat generated due to current crowding.

Moreover, with regard to the surface light emitting device of the present embodiment, the AR film explained in the first embodiment may be formed on at least one of the opposite surfaces of the second light transmitting 21 in the thickness direction, and alternatively the moth-eye structure 80 (see FIG. 12) may be formed in/on to at least one of the opposite surfaces of the second light transmitting 21 in the thickness direction. In each instance, it is possible to improve the front brightness and the external quantum efficiency.

(Tenth Embodiment)

Figure 30:
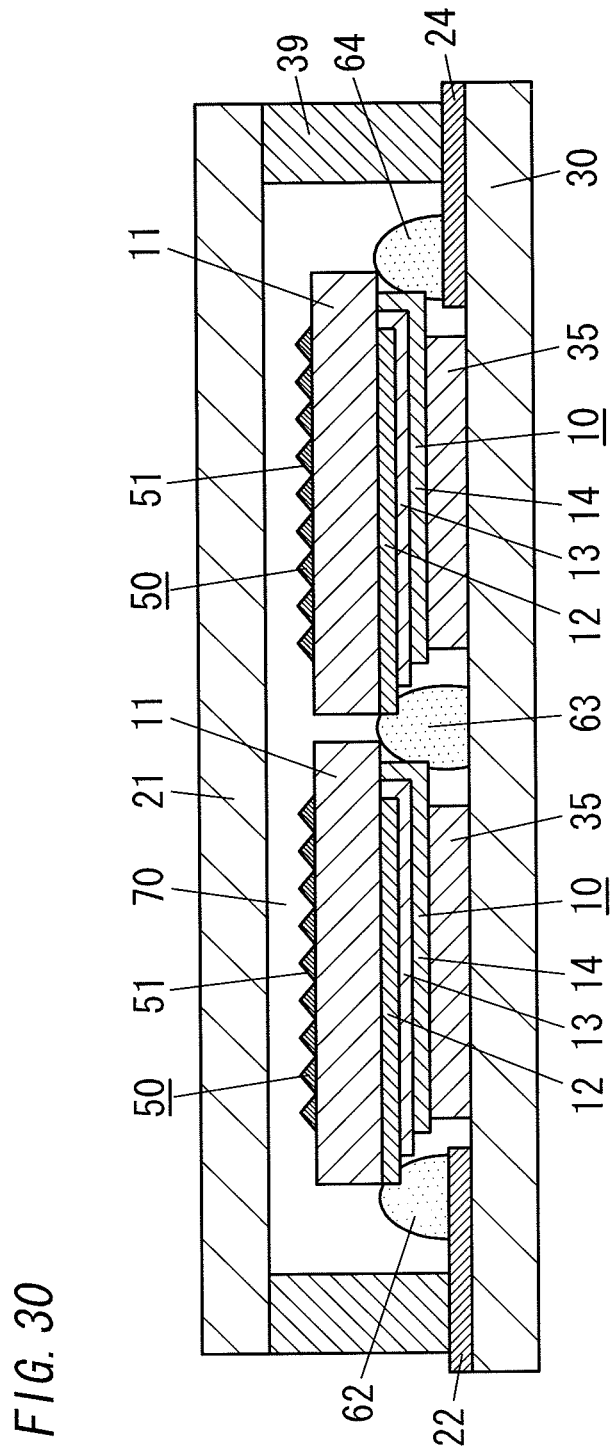
FIG. 30 is a schematic cross sectional view illustrating the surface light emitting device of the tenth embodiment.

As shown in FIG. 30, the surface light emitting device of the present embodiment has the basic configuration similar to the fifth embodiment, but is mainly different from the fifth embodiment in that the plurality of the organic EL elements 10 are arranged adjacent to each other on the first surface of the protection part 30 and the adjacent organic EL elements are connected in series via the connecting part 63 made of electrically conductive paste. Besides, the components common to the present embodiment and the fifth embodiment are designated by the same reference numerals and explanations thereof are deemed unnecessary.

In contrast, the surface light emitting device of the present embodiment has the plurality of the organic EL elements 10 arranged side by side. Even when the surface light emitting device including the multiple organic EL elements 10 has the area of the light emitting surface of the organic EL element 10 smaller than that of the surface light emitting device including the single organic EL element 10, the former surface light emitting device can have the area of the total light emitting surface not less than that of latter surface light emitting device. Consequently, unevenness of brightness can be suppressed, and it is possible to improve the efficiency and prolong the lifetime.

Moreover, with regard to the surface light emitting device of the present embodiment, the AR film explained in the first embodiment may be formed on at least one of the opposite surfaces of the second light transmitting 21 in the thickness direction, and alternatively the moth-eye structure 80 (see FIG. 12) may be formed in/on to at least one of the opposite surfaces of the second light transmitting 21 in the thickness direction. In each instance, it is possible to improve the front brightness and the external quantum efficiency.

(Eleventh Embodiment)

Figure 31:
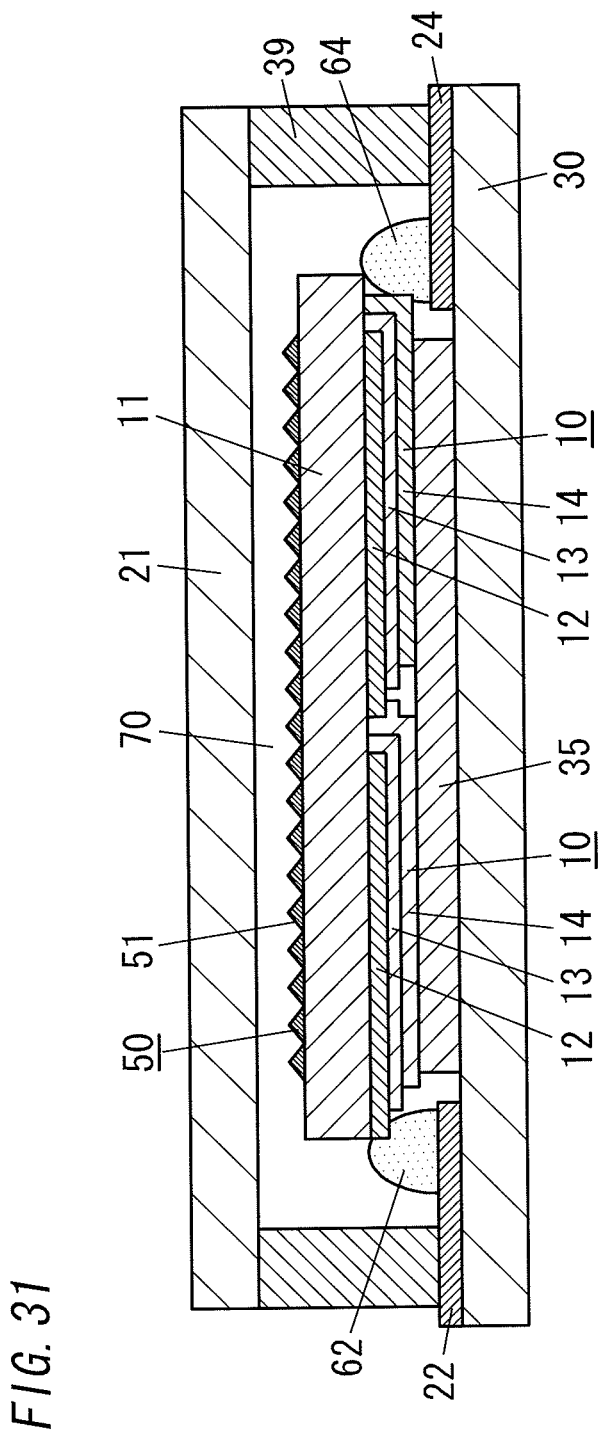
FIG. 31 is a schematic cross sectional view illustrating the surface light emitting device of the eleventh embodiment.

As shown in FIG. 31, the surface light emitting device of the present embodiment has the basic configuration similar to the fifth embodiment, but is mainly different from the fifth embodiment in that the surface light emitting device of the present embodiment includes a plurality of the organic EL elements 10 and the plurality of the organic EL elements 10 shares the single first light transmitting substrate 11. Besides, the components common to the present embodiment and the fifth embodiment are designated by the same reference numerals and explanations thereof are deemed unnecessary.

In contrast, the surface light emitting device of the present embodiment has the plurality of the organic EL elements 10 arranged side by side. Even when the surface light emitting device including the multiple organic EL elements 10 has the area of the light emitting surface of the organic EL element 10 smaller than that of the surface light emitting device including the single organic EL element 10, the former surface light emitting device can have the area of the total light emitting surface not less than that of latter surface light emitting device. Consequently, unevenness of brightness can be suppressed, and it is possible to improve the efficiency and prolong the lifetime.

In consideration of the instance where the cathodes 14 of the respective organic EL elements 10 are formed simultaneously, the layout of the present embodiment is designed such that a part of the cathode 14 of one of the adjacent organic EL elements 10 is overlapped in the thickness direction of the first light transmitting substrate 11 and electrically connected to a part of the anode 12 of the other of the adjacent organic EL elements 10. Consequently, it is possible to reduce the area of the non-light emitting part.

Moreover, with regard to the surface light emitting device of the present embodiment, the AR film explained in the first embodiment may be formed on at least one of the opposite surfaces of the second light transmitting 21 in the thickness direction, and alternatively the moth-eye structure 80 (see FIG. 12) may be formed in/on to at least one of the opposite surfaces of the second light transmitting 21 in the thickness direction. In each instance, it is possible to improve the front brightness and the external quantum efficiency.

(Twelfth Embodiment)

Figure 32:
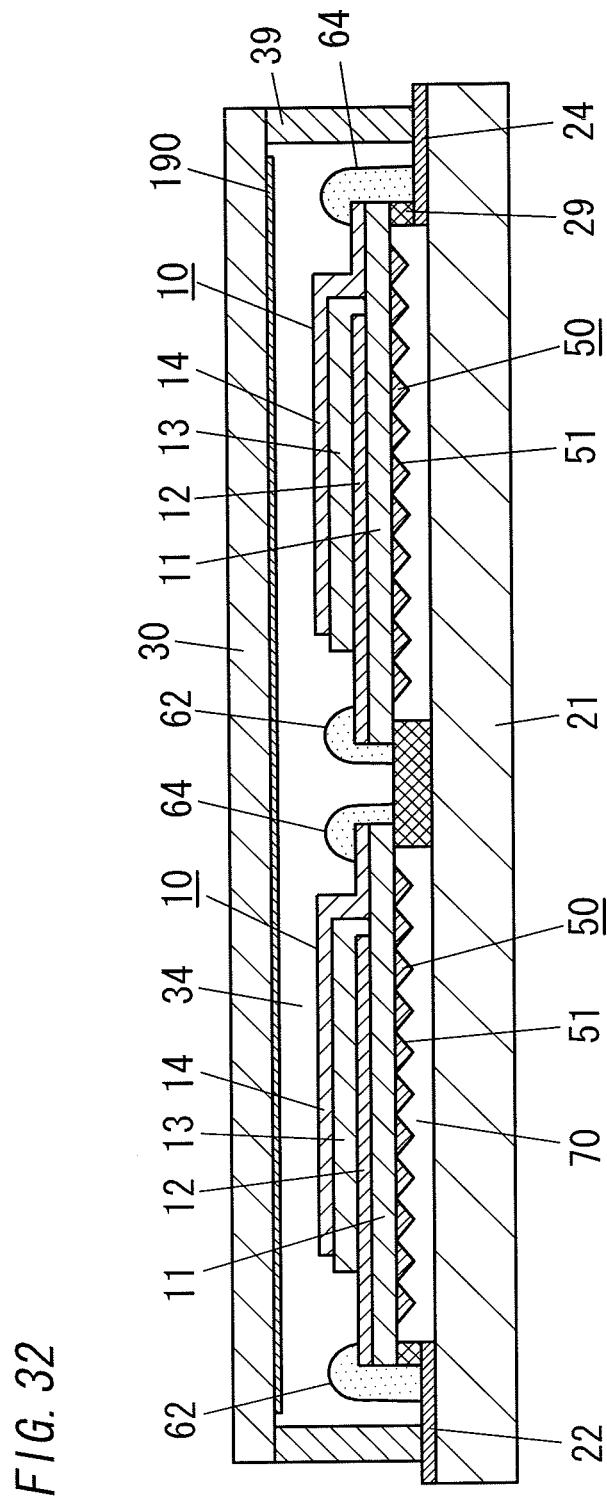
FIG. 32 is a schematic cross sectional view illustrating the surface light emitting device of the twelfth embodiment.

As shown in FIG. 32, the surface light emitting device of the present embodiment has the basic configuration similar to the sixth embodiment, but is mainly different from the sixth embodiment in that the surface light emitting device of the present embodiment includes a light reflection part 190 provided to the first surface of the protection part 30. Further, the surface light emitting device of the present embodiment is different from the sixth embodiment in the number of the organic EL elements 10. Besides, the components common to these embodiments are designated by the same reference numerals and explanations thereof are deemed unnecessary.

In brief, in the surface light emitting device of the present embodiment, the protection part 30 has the inner face (lower surface in FIG. 32) facing the second face (upper surface in FIG. 32) of the organic EL element 10. The protection part 30 is provided at the inner face with the light reflection part 190 configured to reflect light emitted from the organic EL element 10.

The material of the light reflection part 190 is selected from materials having relatively high refractive indices for light emitted from the organic EL element 10 but is not limited to particular one of them. The material of the light reflection part 190 may be selected from aluminum, silver, and silver alloy, for example.

With regard to light passing through the first light transmitting substrate 11 of the surface light emitting device, Fresnel reflection will occur on each of the interface between the second light transmitting substrate 21 and the space 70 and the interface between the second light transmitting substrate 21 and the external air. When the second light transmitting substrate 21 is made of a glass substrate, a 4% of light is Fresnel reflected at each interface. Thus, a calculated loss of light is totally about 8%. Actually, Fresnel-reflected light is reflected at the side of the cathode 14 of the organic EL element 13 again, and is therefore extracted. Accordingly, an actual loss may be lower than 8%.

However, light which is not reflected by the cathode 14 and passes through the protection part 30 and light which is absorbed in the protection part 30 causes an increase in a loss. In the surface light emitting device of the sixth embodiment, the light extraction structure part 50 has a function of changing the angle of light. Thus, light which is not extracted by the light extraction structure part 50 may include some components of diffusely reflected light. Some components of this diffusely reflected light may include light which does not strike the cathode 14 but reach the protection part 30, and such light causes a loss.

In contrast, the surface light emitting device of the present embodiment includes the light reflection part 190 provided to the protection part 30, and therefore can have the improved light extraction efficiency. As shown in FIG. 32, the instance having the light reflection part 190 formed on the substantially entire surface of the protection part 30 close to the organic EL element 10 has the light extraction efficiency higher by about 2% than that of the instance devoid of the light reflection part 190. Besides, the light reflection part 190 may be provided to the surface light emitting device of the other embodiment.

Moreover, with regard to the surface light emitting device of the present embodiment, the AR film explained in the first embodiment may be formed on at least one of the opposite surfaces of the second light transmitting 21 in the thickness direction, and alternatively the moth-eye structure 80 (see FIG. 12) may be formed in/on to at least one of the opposite surfaces of the second light transmitting 21 in the thickness direction. In each instance, it is possible to improve the front brightness and the external quantum efficiency.

(Thirteenth Embodiment)

The surface light emitting device of the present embodiment shown in FIG. 32 has the basic configuration similar to the tenth embodiment, but is different from the tenth embodiment in that the light reflection part 30 is provided to the first surface of the protection part 30. Besides, the components common to these embodiments are designated by the same reference numerals and explanations thereof are deemed unnecessary.

Figure 33:
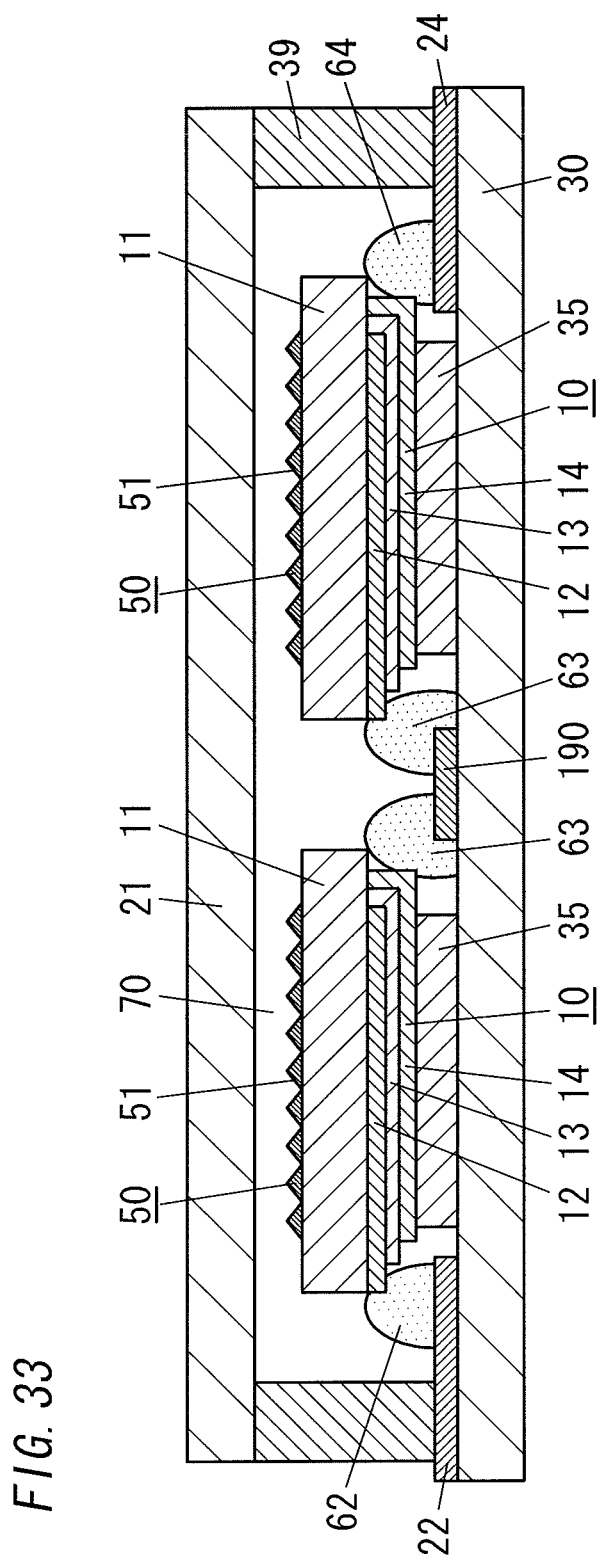
FIG. 33 is a schematic cross sectional view illustrating the surface light emitting device of the thirteenth embodiment.

In brief, in the surface light emitting device of the present embodiment, the protection part 30 has the inner face (upper surface in FIG. 33) facing the second face (lower surface in FIG. 33) of the organic EL element 10. The protection part 30 is provided at the inner face with the light reflection part 190 configured to reflect light emitted from the organic EL element 10.

The light reflection part 190 has the same basic function (i.e., function of reflecting light) as that of the twelfth embodiment. Further, the light reflection part 190 of the present embodiment is used as an auxiliary electrode connected to the anode 12 of one of the adjacent organic EL elements 10 and the cathode 14 of the other of the adjacent organic EL elements 10 via the respective connecting parts 63 and 63. Besides, the light reflection part 190 is not necessarily used as the auxiliary electrode.

The surface light emitting device of the present embodiment includes the light reflection part 190 provided to the protection part 30, and therefore can have the improved light extraction efficiency relative to the instance devoid of the light reflection part 190. Besides, the light reflection part 190 may be provided to the surface light emitting device of the other embodiment.

Moreover, with regard to the surface light emitting device of the present embodiment, the AR film explained in the first embodiment may be formed on at least one of the opposite surfaces of the second light transmitting 21 in the thickness direction, and alternatively the moth-eye structure 80 (see FIG. 12) may be formed in/on to at least one of the opposite surfaces of the second light transmitting 21 in the thickness direction. In each instance, it is possible to improve the front brightness and the external quantum efficiency.

(Fourteenth Embodiment)

Figure 34:
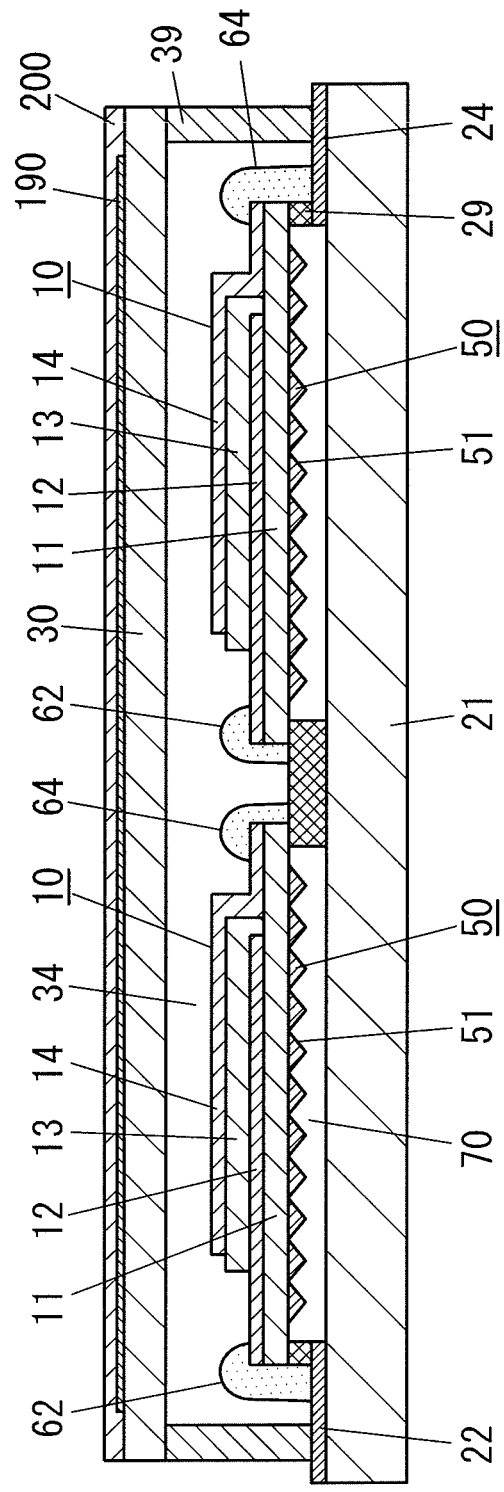
FIG. 34 is a schematic cross sectional view illustrating the surface light emitting device of the fourteenth embodiment.

The surface light emitting device of the present embodiment shown in FIG. 34 has the basic configuration similar to the twelfth embodiment, but is mainly different from the twelfth embodiment in that the protection part 30 is provided with a heat transfer part 200 at the opposite surface of the protection part 30 from the light extraction structure part 50. The heat transfer part 200 is made of material with thermal conductivity higher than that of the remaining part of the protection part 30. Besides, the components of the present embodiment common to the twelfth embodiment are designated by the same reference numerals and explanations thereof are deemed unnecessary.

In brief, in the surface light emitting device of the present embodiment, the protection part 30 has transparency for light emitted from the organic EL element 10. The protection part 30 has the inner face (lower surface in FIG. 34) facing the second face (upper surface in FIG. 34) of the organic EL element 10 and the outer face (upper surface in FIG. 34) opposite to the inner face. The protection part 30 is provided at the outer face with the light reflection part 190 configured to reflect light emitted from the organic EL element 10.

Further, the surface light emitting device of the present embodiment includes the heat transfer part 200 having thermal conductivity greater than that of the protection part 30. The heat transfer part 200 is provided to the outer face of the protection part 30. Besides, in the instance illustrated in FIG. 34, the heat transfer part 200 is formed over the outer face of the protection part 30 so as to cover the entire light reflection part 190.

The heat transfer part 200 is made of copper foil. The material of the heat transfer part 200 is not limited to this instance but may be aluminum foil.

The material of the heat transfer part 200 is not limited to copper and aluminum, but may be selected from gold, silver, and silicon, for example. Besides, copper, aluminum, gold, silver, and silicon have thermal conductivity of 398 W/(mK), 236 W/(mK), 320 W/(mK), 420 W/(mK), and 168 W/(mK), respectively.

By the way, enlarging the surface light emitting device or increasing the driving voltage for achieving high brightness may cause an increase in a difference in brightness between the center and the periphery of the surface light emitting device. Consequently, the surface light emitting device may have a large temperature distribution depending on energy consumption distribution. The surface light emitting device is likely to suffer from unevenness of brightness and unevenness of color caused by partial deterioration of element (deterioration of the organic EL element 10) of the surface light emitting device.

In contrast, according to the surface light emitting device of the present embodiment, the protection part 30 is provided with the heat transfer part 200 at the first surface of the protection part 30 opposite from the light extraction structure part 50. Thus, it is possible to improve the uniformity of the thermal distribution, and then the deterioration of the organic EL element 10 can be suppressed. When the surface light emitting device of the present embodiment is used in the condition where the surface light emitting device of the present embodiment is attached to a fixture body, with thermally coupling the heat transfer part 200 with the fixture body or a heat dissipation member of the fixture body by means of bonding the heat transfer part 200 to the fixture body or a heat dissipation member of the fixture body, it is possible to improve the heat radiation performance and prolong the lifetime.

Further, since the surface light emitting device of the other embodiment includes the light reflection part 190, as explained in the twelfth embodiment, the light extraction efficiency of the surface light emitting device of the present embodiment is increased by about 2%.

Besides, the heat transfer part 200 may be provided to the surface light emitting device of the other embodiment. In the surface light emitting device of the present embodiment, the protection part 30 includes the light reflection part 190. However, the light reflection part 190 is not necessarily provided.

(Fifteenth Embodiment)

Figure 35:
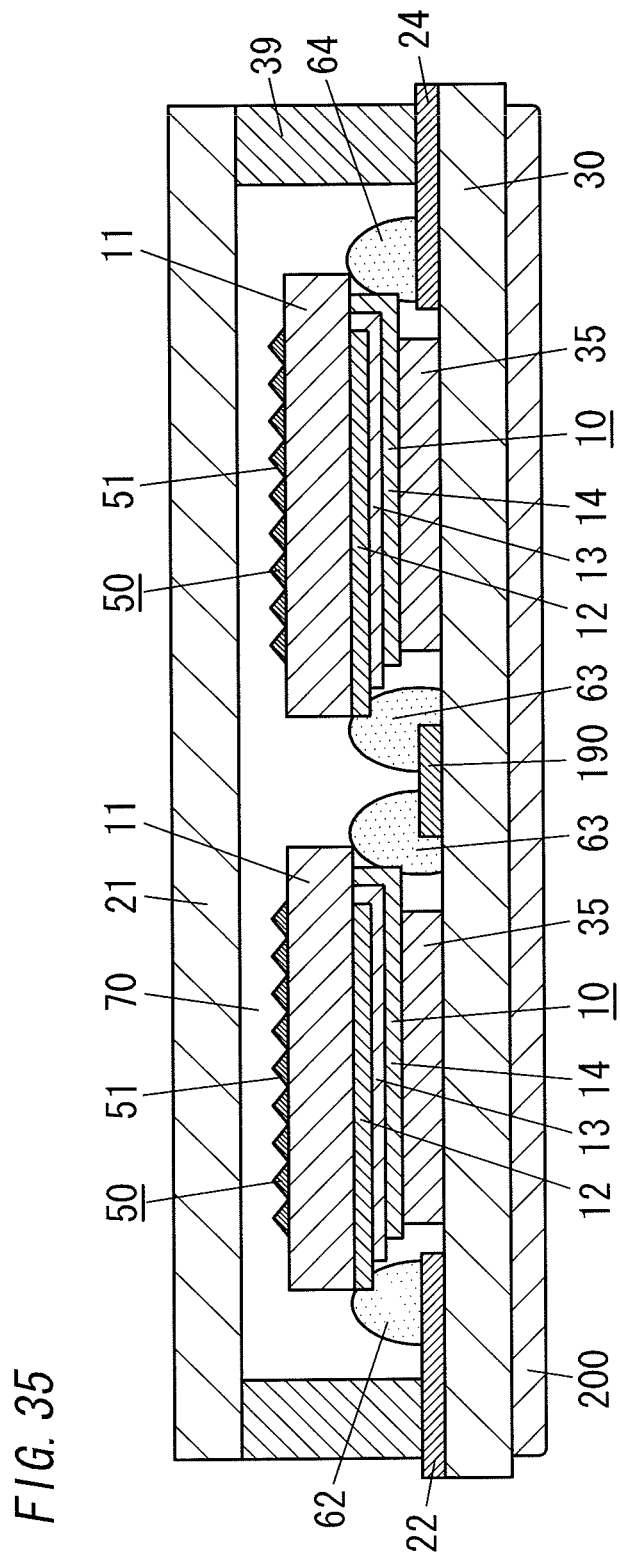
FIG. 35 is a schematic cross sectional view illustrating the surface light emitting device of the fifteenth embodiment.

The surface light emitting device of the present embodiment shown in FIG. 35 has the basic configuration similar to the thirteenth embodiment, but is mainly different from the thirteenth embodiment in that the protection part 30 is provided with a heat transfer part 200 at the opposite surface of the protection part 30 from the light extraction structure part 50. The heat transfer part 200 is made of material with thermal conductivity higher than that of the remaining part of the protection part 30. Besides, the components of the present embodiment common to the thirteenth embodiment are designated by the same reference numerals and explanations thereof are deemed unnecessary. Further, the heat transfer part 200 is already explained in the fourteenth embodiment, and therefore no detailed explanation is made thereto.

In brief, in the surface light emitting device of the present embodiment, the protection part 30 has the inner face (upper surface in FIG. 35) facing the second face (lower surface in FIG. 35) of the organic EL element 10 and the outer face (lower surface in FIG. 35) opposite to the inner face. The protection part 30 is provided at the inner face with the light reflection part 190 configured to reflect light emitted from the organic EL element 10.

Further, the surface light emitting device of the present embodiment includes the heat transfer part 200 having thermal conductivity greater than that of the protection part 30. The heat transfer part 200 is provided to the outer face of the protection part 30.

According to the surface light emitting device of the present embodiment, the protection part 30 is provided with the heat transfer part 200 at the first surface of the protection part 30 opposite from the light extraction structure part 50. Thus, it is possible to improve the uniformity of the thermal distribution, and then the deterioration of the organic EL element 10 can be suppressed. When the surface light emitting device of the present embodiment is used in the condition where the surface light emitting device of the present embodiment is attached to a fixture body, with thermally coupling the heat transfer part 200 with the fixture body or a heat dissipation member of the fixture body by means of bonding the heat transfer part 200 to the fixture body or a heat dissipation member of the fixture body, it is possible to improve the heat radiation performance and prolong the lifetime.

Further, the surface light emitting device of the present embodiment further includes the light reflection part 190, and therefore can have the improved light extraction efficiency.

The invention claimed is:

1. A surface light emitting device, comprising:
an organic EL element having a first face and a second face opposite to said first face, said organic EL element configured to emit light from said first face;
a protection substrate having transparency for light emitted from said organic EL element, said protection substrate facing said first face, and said protection substrate having a primary surface facing said first face of said organic EL element;
a protector facing said second face of said organic EL element, said protector configured to constitute a housing in combination with said protection substrate, and said housing configured to accommodate said organic EL element to protect said organic EL element from water; and
a light extractor interposed between said first face of said organic EL element and said protection substrate, said light extractor configured to suppress reflection of light emitted from said organic EL element on at least one of said first face of said organic EL element and said primary surface of said protection substrate.

2. A surface light emitting device as set forth in claim 1, wherein
said organic EL element comprises a light-emitting layer configured to emit light and a formation substrate having transparency for light emitted from said light-emitting layer, and
said light-emitting layer is provided over a first surface of said formation substrate, and
said first face of said organic EL element is defined by a second surface of said formation substrate opposite to said first surface, and
said formation substrate has a refractive index higher than a refractive index of said protection substrate.

3. A surface light emitting device as set forth in claim 2, wherein said protection substrate has a weatherproof property and a waterproof property higher than a weatherproof property and a waterproof property of said formation substrate.

4. A surface light emitting device as set forth in claim 3, wherein
said formation substrate is a plastic substrate, and
said protection substrate is a glass substrate.

5. A surface light emitting device as set forth in claim 2, wherein
said light extractor is a recessed and protruded structure provided to said first face of said organic EL element, and
said protection substrate forms a space between said recessed and protruded structure and said protection substrate, said protection substrate having a refractive index higher than a refractive index of a medium filling the space.

6. A surface light emitting device as set forth in claim 5, wherein said recessed and protruded structure has a refractive index equal to or higher than a refractive index of said formation substrate.

7. A surface light emitting device as set forth in claim 5, wherein
said recessed and protruded structure includes a periodic recessed and protruded structure, and
said recessed and protruded structure has a period in a range of one fourth to ten times a wavelength of light emitted from said organic EL element.

8. A surface light emitting device as set forth in claim 5, wherein
said recessed and protruded structure is in surface contact with said primary surface of said protection substrate.

9. A surface light emitting device as set forth in claim 5, wherein
said primary surface of said protection substrate has a recess configured to accommodate said recessed and protruded structure, and
said space is a gap between an inner surface of said recess and a surface of said recessed and protruded structure.

10. A surface light emitting device as set forth in claim 1, wherein
said surface light emitting device further comprises a light transmitter having transparency for light emitted from said organic EL element and a refractive index not greater than a refractive index of said protection substrate, and
said light extractor is a recessed and protruded structure provided to said first face of said organic EL element, and said light transmitter is interposed between said recessed and protruded structure and said protection substrate.

11. A surface light emitting device as set forth in claim 1, wherein said light extractor includes a matrix placed in contact with said first face of said organic EL element, and light-diffusing members dispersed in said matrix, and said matrix has a refractive index not less than a refractive index of part of said organic EL element in contact with said matrix, and said light-diffusing members have a refractive index different from a refractive index of said matrix.

12. A surface light emitting device as set forth in claim 11, wherein said light-diffusing members are fine particles.

13. A surface light emitting device as set forth in claim 1, wherein said light extractor includes a matrix in contact with said first face of said organic EL element, and holes provided inside said matrix, and said matrix has a refractive index which is not less than a refractive index of part of said organic EL element in contact with said matrix and is different from that of a medium filling said holes.

14. A surface light emitting device as set forth in claim 2, wherein said surface light emitting device further comprises a transparent portion having transparency for light emitted from said organic EL element and a refractive index not less than a refractive index of said formation substrate, and said light extractor is a recessed and protruded structure provided to said primary surface of said protection substrate, and said transparent portion is interposed between said recessed and protruded structure and said formation substrate.

15. A surface light emitting device as set forth in claim 14, wherein said recessed and protruded structure has a refractive index not greater than a refractive index of said protection substrate.

16. A surface light emitting device as set forth in claim 14, wherein said recessed and protruded structure includes a periodic recessed and protruded structure, and said recessed and protruded structure has a period in a range of one fourth to ten times a wavelength of light emitted from said organic EL element.

17. A surface light emitting device as set forth in claim 1, wherein said surface light emitting device further comprises a heat dissipater interposed between said second face of said organic EL element and said protector and configured to transmit heat generated at said organic EL element to said protector, and said organic EL element is fixed to said protector and not in contact with said protection substrate.

18. A surface light emitting device as set forth in claim 1, wherein said protection substrate has a secondary surface opposite to said primary surface of said protection substrate, and an antireflection coating is provided to at least one of said primary surface and said secondary surface of said protection substrate.

19. A surface light emitting device as set forth in claim 1, wherein said protection substrate has a secondary surface opposite to said primary surface of said protection substrate, and a moth-eye structure is provided to at least one of said primary surface and said secondary surface of said protection substrate.

20. A surface light emitting device as set forth in claim 1, wherein said surface light emitting device comprises a plurality of said organic EL elements, and the plurality of said organic EL elements is arranged in a plane parallel to said primary surface of said protection substrate.

21. A surface light emitting device as set forth in claim 1, wherein said protector has an inner face facing said second face of said organic EL element, and a light reflector is provided to said inner face of said protector part and is configured to reflect light emitted from said organic EL element.

22. A surface light emitting device as set forth in claim 1, wherein said protector has transparency for light emitted from said organic EL element, and said protector has an inner face facing said second face of said organic EL element and an outer face opposite to said inner face, and said protector is provided at said outer face with a light reflector configured to reflect light emitted from said organic EL element.

23. A surface light emitting device as set forth in claim 1, wherein said surface light emitting device further comprises a heat transferor having thermal conductivity greater than a thermal conductivity of said protector, and said protector has an inner face facing said second face of said organic EL element and an outer face opposite to said inner face, and said heat transferor is provided to said outer face of said protector.

* * * * *